United States Patent
Nagaya et al.

(10) Patent No.: US 7,443,085 B2
(45) Date of Patent: Oct. 28, 2008

(54) PIEZOELECTRIC ACTUATOR

(75) Inventors: Toshiatsu Nagaya, Kuwana (JP); Tatsuhiko Nonoyama, Chiryu (JP); Masaya Nakamura, Nagoya (JP); Yasuyoshi Saito, Aichi (JP); Hisaaki Takao, Aichi (JP); Takahiko Homma, Aichi (JP); Kazumasa Takatori, Aichi (JP)

(73) Assignee: Denso Corporation, Kariya (JP)

( * ) Notice: Subject to any disclaimer, the term of this patent is extended or adjusted under 35 U.S.C. 154(b) by 0 days.

(21) Appl. No.: 11/717,796

(22) Filed: Mar. 13, 2007

(65) Prior Publication Data

US 2007/0228874 A1    Oct. 4, 2007

Related U.S. Application Data

(63) Continuation of application No. PCT/JP2005/017231, filed on Sep. 13, 2005.

(30) Foreign Application Priority Data

Sep. 13, 2004  (JP) ............... 2004-266110
Aug. 5, 2005   (JP) ............... 2005-228396

(51) Int. Cl.
*H01L 41/18* (2006.01)
(52) U.S. Cl. .............. 310/358; 257/347; 257/62.9
(58) Field of Classification Search ............... 310/358
See application file for complete search history.

(56) References Cited

U.S. PATENT DOCUMENTS

| | | | |
|---|---|---|---|
| 4,570,098 | A | 2/1986 | Tomita et al. |
| 6,884,364 | B2 | 4/2005 | Sato et al. |
| 2002/0017832 | A1* | 2/2002 | Murai et al. ............ 310/328 |
| 2004/0127344 | A1 | 7/2004 | Sato et al. |

FOREIGN PATENT DOCUMENTS

| | | |
|---|---|---|
| EP | 1 283 553 | 2/2003 |
| EP | 1 283 553 A2 | 2/2003 |
| JP | 60-001877 | 1/1985 |
| JP | 5-284600 | 10/1993 |
| JP | 05-284600 | 10/1993 |
| JP | 06-232465 | 8/1994 |
| JP | 07-079022 | 3/1995 |
| JP | 07-079023 | 3/1995 |
| JP | 11-180766 | 7/1999 |
| JP | 2003-46154 | 2/2003 |
| JP | 2003-046154 | 2/2003 |
| JP | 2003-128460 | 5/2003 |
| JP | 2004-115293 | 4/2004 |

* cited by examiner

*Primary Examiner*—Darren Schuberg
*Assistant Examiner*—Bryan P Gordon
(74) *Attorney, Agent, or Firm*—Harness, Dickey & Pierce, PLC

(57) ABSTRACT

A piezoelectric actuator 1 includes a piezoelectric element 2, which has a pair of electrodes formed on the surface of a piezoelectric ceramic member, as a drive source. The piezoelectric actuator 1 satisfies at least one of the following requirements (a) to (c):

(a) the variation width $W_C$ in an apparent dynamic capacity C [F] due to a change in temperature should fall within ±11% over a specific temperature range from −30° C. to 80° C.;
(b) the variation width $W_L$ in a displacement L [μm] due to a change in temperature should fall within ±14% over the specific temperature range from −30° C. to 80° C.; and
(c) the variation width $W_{L/C}$ in a quotient L/C due to a change in temperature should fall within ±12% over the specific temperature range from −30° C. to 80° C., wherein C [F] denotes the apparent dynamic capacity and L [μm] denotes the displacement.

22 Claims, 21 Drawing Sheets

PIEZOELECTRIC ACTUATOR

CROSS-REFERENCE TO RELATED APPLICATIONS

This application is based upon and claims priority of Japanese Patent Applications No. 2004-266110, filed on Sep. 13, 2004, and No. 2005-228396, filed on Aug. 5, 2005, the contents being incorporated herein by reference, and a continuation of PCT/JP2005/017231 filed Sep. 13, 2005.

BACKGROUND OF THE INVENTION

1. Field of the Invention

The present invention relates to a piezoelectric actuator, utilizing a reverse piezoelectric effect and an electrostrictive effect under the influence of a large electric field, such as; a laminated actuator, a piezoelectric transformer, an ultrasonic motor, a bimorph piezoelectric element, an ultrasonic sonar, a piezoelectric ultrasonic vibration element, a piezoelectric buzzer, or a piezoelectric loudspeaker.

2. Description of the Related Art

Piezoelectric actuators employing piezoelectric ceramic materials are industrial products that convert electric energy into mechanical energy by utilizing displacement derived from a reverse piezoelectric effect, and are widely applied to the fields of electronics and mechatronics.

As the piezoelectric ceramics adapted to the piezoelectric actuators, for example, a lead zirconium titanate (Pb(Zr,Ti)$O_3$) system (hereinafter a PZT system) and barium titanate ($BaTiO_3$) are known. The PZT-system piezoelectric ceramics exhibit higher piezoelectric properties than the other piezoelectric ceramics, and are used for the majority of piezoelectric ceramics that are currently applied to practice use. However, as the PZT-system piezoelectric ceramics contain lead oxide exhibiting a high vapor pressure, a load they impose on an environment is large. On the other hand, the $BaTiO_3$ ceramic does not contain lead, but exhibits lower piezoelectric properties than PZT. Moreover, as the Curie temperature of the $BaTiO_3$ ceramic is as low as approximately 120° C., the $BaTiO_3$ ceramic cannot be used at high temperatures.

The piezoelectric actuator generally includes: a piezoelectric element, which has at least one pair of electrodes formed on a piezoelectric ceramic member; a holding part that holds the piezoelectric element; an adhesive member or a press-contacting member such as a spring that retains the piezoelectric element in the holding part; a lead terminal via which a voltage is applied to the piezoelectric element; an electrical insulation member such as a resin or silicone oil that is coated over the pair of electrodes. In the piezoelectric actuator, the piezoelectric element including the piezoelectric ceramic member is retained by means of adhesion, molding, or a spring. Therefore, a mechanical restraining force (pre-set load) is applied, while no voltage is applied. Moreover, in the piezoelectric actuator, when a voltage is applied to the piezoelectric actuator, the piezoelectric element is displaced along with a rise in the voltage. This intensifies the mechanically restraining force (increases the load).

Consequently, the displacement of the piezoelectric actuator is, unlike the displacement performance of the piezoelectric element itself, smaller due to a presetting load and an increase in the load.

The working conditions and driving conditions for the piezoelectric actuator include such parameters as the temperature, driving electric-field strength, driving waveform, driving frequency, and whether a driving mode is continuous driving or intermittent driving. As for a general working temperature range for the piezoelectric actuator, when the piezoelectric actuator is used in a general living environment, the largest working temperature range is from about −30° C. to about 80° C. When the piezoelectric actuator is adopted as an automotive part, the largest working temperature range is from about −40° C. to about 160° C. Moreover, the amplitude in electric field strength of a driving voltage varies depending on the usage of the piezoelectric actuator. For a piezoelectric buzzer, an ultrasonic sonar, a piezoelectric loudspeaker, or the like, the amplitude is equal to or smaller than 500 V/mm. For an ultrasonic motor, a piezoelectric transformer, a piezoelectric ultrasonic vibration element, or the like, the amplitude is equal to or smaller than 1000 V/mm. For a laminated actuator, the amplitude is equal to or smaller than 3000 V/mm. Moreover, when resonant driving is adopted as a driving form, the driving waveform is a sine wave. For the other driving forms, the driving waveform may be any of various waves, that is, the sine wave, a trapezoidal wave, a triangular wave, a rectangular wave, and a pulsating wave. Moreover, the driving frequency employed in the ultrasonic motor, ultrasonic sonar, piezoelectric ultrasonic vibration element, or the like is equal to or higher than 20 kHz, while the driving frequency employed in the other products falls below 20 kHz.

The driving methods for the piezoelectric actuator are classified into (1) a constant-voltage driving method for driving the piezoelectric actuator by controlling a displacement using a voltage as a parameter, (2) a constant-energy driving method for driving the piezoelectric actuator by controlling a displacement using injected energy as a parameter, and (3) a constant-charge driving method for driving the piezoelectric actuator by controlling a displacement using injected charge as a parameter.

Now, the relationship between each of the driving methods and a displacement made by the actuator will be described below.

A piezoelectric actuator driving method classified into the constant-voltage driving method is characterized in that a displacement occurring during the rising of an applied voltage and a displacement occurring during the falling thereof have a hysteresis. The constant-voltage driving method has a drawback that the variation width in a displacement over a working temperature range is relatively large.

Moreover, a piezoelectric actuator driving method classified into the constant-energy driving method is characterized in that a displacement occurring during an increase of injected energy and a displacement occurring during a decrease thereof have a hysteresis. In the constant-energy driving method, the variation width in a displacement over the working temperature range is smaller than that in the constant-voltage driving method.

On the other hand, an actuator driving method classified into the constant-charge driving method is superior in a point that a displacement can be most precisely controlled, because the difference between a displacement occurring during an increase of injected charge and a displacement occurring during a decrease thereof is nearly zero. However, the variation width in a displacement over the working temperature range is larger than those in the constant-voltage driving method and the constant-energy driving method respectively.

As a method for diminishing the variation width in a temperature characteristic of a piezoelectric actuator or a piezoelectric ceramic sensor, technologies described below have been developed.

Specifically, Japanese Unexamined Patent Publication No. 60-1877 has disclosed a piezoelectric body having a piezoelectric unit, of which displacement that is an output provided in response to application of a voltage changes as an increasing function of a change in temperature, and a piezoelectric unit, of which displacement changes as a decreasing function thereof, combined and stacked up.

Moreover, Japanese Unexamined Patent Publication No. 6-232465 has disclosed a laminated piezoelectric actuator having multiple piezoelectric ceramic layers, which are different from one another in terms of displacement performance, stacked up.

Japanese Unexamined Patent Publication No. 5-284600 has disclosed a piezoelectric element having a temperature compensation capacitor electrically connected in series or parallel with a piezoelectric ceramic member.

Japanese Unexamined Patent Publication No. 7-79022 has disclosed a piezoelectric element that generates charge according to a pressure. In the piezoelectric element, a piezoelectric substance layer and a dielectric layer are alternately stacked. The electrostatic capacity of the dielectric layer is larger than the electrostatic capacity of the piezoelectric layer. Moreover, the temperature coefficient of the dielectric layer is the reverse of the temperature coefficient of the piezoelectric layer.

Japanese Unexamined Patent Publication No. 7-79023 has disclosed a piezoelectric element that generates charge according to a pressure. Herein, a piezoelectric substance material and a dielectric body material, whose electrostatic capacity varies with temperature characteristic reverse to that of the piezoelectric substance material, are mixed in order to mold the piezoelectric element.

Moreover, Japanese Unexamined Patent Publication No. 11-180766 has disclosed a barium titanate-system piezoelectric porcelain that is a composition whose piezoelectric $d_{33}$ constant measured according to a resonance method is equal to or larger than 300 pC/N. The piezoelectric $d_{33}$ constant exhibits a small temperature-dependent change rate at the temperatures ranging from −30° C. to 85° C.

Japanese Unexamined Patent Publication No. 2003-128460 has disclosed a laminated piezoelectric element in which an internal electrode is made of nickel (Ni) that is a barium titanate-system. Herein, the temperature-dependent change rate of a piezoelectric $d_{31}$ constant calculated from a distortion factor of the element applied the electric field strength of 1 kV/mm is small.

However, the conventional technologies have failed to resolve a fluctuation in the displacement characteristic of a piezoelectric actuator derived from a change in temperature.

SUMMARY OF THE INVENTION

The present invention addresses the foregoing problems underlying the conventional technologies, and attempts to provide a piezoelectric actuator capable of diminishing the temperature dependency of a displacement irrespective of a driving method for the piezoelectric actuator.

The first aspect of the present invention is a piezoelectric actuator which comprises as a drive source a piezoelectric element in which a pair of electrodes have been formed on a surface of a piezoelectric ceramic member, characterized in that, when a voltage is applied to the piezoelectric actuator to drive the piezoelectric actuator under such a condition that the driving voltage have a constant amplitude at electric field strength of 100 V/mm or more, the piezoelectric actuator satisfies at least one of the following requirements (a) to (c) described below (Claim 1).

(a) The variation width $W_C$ [%] in an apparent dynamic capacity C [F] due to a change in temperature, which is represented by the following equation (1), should fall within ±11% over a specific temperature range from −30° C. to 80° C. (wherein C [F] denotes the apparent dynamic capacity of the piezoelectric actuator which is calculated by dividing an amount of charge Q [C], which is accumulated in a capacitor, by the voltage V [V] applied to the piezoelectric actuator, when the piezoelectric actuator and the capacitor are connected in series with each other and a voltage is applied to each of the piezoelectric actuator and the capacitor):

$$W_C(\%)=[\{2\times C_{max}/(C_{max}+C_{min})\}-1]\times 100 \quad (1)$$

wherein $C_{max}$ denotes the maximum value of the apparent dynamic capacity observed at the temperatures ranging from −30° C. to 80° C., and $C_{min}$ denotes the minimum value of the apparent dynamic capacity observed at the temperatures ranging from −30° C. to 80° C.

(b) The variation width $W_L$ [%] in a displacement L [μm] due to a change in temperature, which is represented by the following equation (2), should fall within ±14% over the specific temperature range from −30° C. to 80° C. (wherein L[μm] denotes the displacement of the piezoelectric actuator):

$$W_L(\%)=[\{2\times L_{max}/(L_{max}+L_{min})\}-1]\times 100 \quad (2)$$

wherein $L_{max}$ denotes the maximum value of the displacement observed at the temperatures ranging from −30° C. to 80° C., and $L_{min}$ denotes the minimum value of the displacement observed at the temperatures ranging from −30° C. to 80° C.

(c) The variation width $W_{L/C}$ [%] in a quotient L/C due to a change in temperature, which is represented by the following equation (3), should fall within ±12% over the specific temperature range from −30° C. to 80° C. (wherein C [F] denotes the apparent dynamic capacity of the piezoelectric actuator, L [μm] denotes the displacement of the piezoelectric actuator, and C [F] is calculated by dividing an amount of charge Q [C], which is accumulated in a capacitor, by the voltage V [V] applied to the piezoelectric actuator, when the piezoelectric actuator and the capacitor are connected in series with each other and a voltage is applied to each of the piezoelectric actuator and the capacitor):

$$W_{L/C}(\%)=[\{2\times(L/C)_{max}/((L/C)_{max}+(L/C)_{min})\}-1]\times 100 \quad (3)$$

wherein $(L/C)_{max}$ denotes the maximum value of the quotient L/C observed at the temperatures ranging from −30° C. to 80° C., and $(L/C)_{min}$ denotes the minimum value of the quotient L/C observed at the temperatures ranging from −30° C. to 80° C.

Moreover, the second aspect of the present invention is a piezoelectric actuator which comprises as a drive source a piezoelectric element in which a pair of electrodes have been formed on a surface of a piezoelectric ceramic member, characterized in that, when a voltage is applied to the piezoelectric actuator to drive the piezoelectric actuator under such a condition that the driving voltage have a constant amplitude at electric field strength of 100 V/mm or more, the piezoelectric actuator satisfies at least one of the following requirements (j) to (l) described below (Claim 10).

(j) The variation width $W_C$ [%] in an apparent dynamic capacity C [F] due to a change in temperature, which is represented by the following equation (5), should fall within ±30% over a specific temperature range from −30° C. to 160° C. (wherein C [F] denotes the apparent dynamic capacity of the piezoelectric actuator, and is calculated by dividing an amount of charge Q [C], which is accumulated in a capacitor, by the voltage V [V] applied to the piezoelectric actuator, when the piezoelectric actuator and the capacitor are connected in series with each other and a voltage is applied to each of the piezoelectric actuator and the capacitor):

$$W_C(\%)=[\{2\times C_{max}/(C_{max}+C_{min})\}-1]\times 100 \quad (5)$$

wherein $C_{max}$ denotes the maximum value of the apparent dynamic capacity observed at the temperatures ranging from −30° C. to 160° C., and $C_{min}$ denotes the minimum value of the apparent dynamic capacity observed at the temperatures ranging from −30° C. to 160° C.

(k) The variation width $W_L$ [%] in a displacement L [μm] due to a change in temperature, which is represented by the following equation (6), should fall within ±14% over the specific temperature range from −30° C. to 160° C. (wherein L [μm] the displacement of the piezoelectric actuator):

$$W_L(\%)=[\{2\times L_{max}/(L_{max}+L_{min})\}-1]\times 100 \quad (6)$$

wherein $L_{max}$ denotes the maximum value of the displacement observed at the temperatures ranging from −30° C. to 160° C., and $L_{min}$ denotes the minimum value of the displacement observed at the temperatures ranging from −30° C. to 160° C.

(l) The variation width $W_{L/C}$ [%] in a quotient L/C due to a change in temperature, which is represented by the following equation (7), should fall within ±35% over the specific temperature range from −30° C. to 160° C. (wherein C [F] denotes the apparent dynamic capacity of the piezoelectric actuator, L [μm] denotes the displacement of the piezoelectric actuator, and C [F] is calculated by dividing an amount of charge Q [C], which is accumulated in a capacitor, by the voltage V [V] applied to the piezoelectric actuator, when the piezoelectric actuator and the capacitor are connected in series with each other and a voltage is applied to each of the piezoelectric actuator and the capacitor):

$$W_{L/C}(\%)=[\{2\times(L/C)_{max}/((L/C)_{max}+(L/C)_{min})\}-1]\times 100 \quad (7)$$

wherein $L/C_{max}$ denotes the maximum value of the quotient L/C observed at the temperatures ranging from −30° C. to 160° C., and $L/C_{min}$ denotes the minimum value of the quotient L/C observed at the temperatures ranging from −30° C. to 160° C.

The piezoelectric actuator in accordance with the first aspect of the present invention satisfies at least one of the requirements (a) to (c). Namely, in the piezoelectric actuator in accordance with the first aspect, at least one of the variation width $W_C$ in the apparent dynamic capacity C due to a change in temperature, the variation width $W_L$ in the displacement L due to a change in temperature, and the variation width $W_{L/C}$ in the quotient of the displacement by the dynamic capacitor (L/C) due to a change in temperature corresponds to the foregoing specific range over the specific temperature range from −30° C. to 80° C.

Moreover, the piezoelectric actuator in accordance with the second aspect of the present invention satisfies at least one of the requirements (j) to (l). Namely, in the piezoelectric actuator in accordance with the second aspect, at least one of the variation width $W_C$ in the apparent dynamic capacitor C due to a change in temperature, the variation width $W_L$ in the displacement L due to a change in temperature, and the variation width $W_{L/C}$ in the quotient of the displacement by the dynamic capacitor (L/C) due to a change in temperature corresponds to the foregoing specific range over the specific temperature range from −30° C. to 160° C.

Consequently, the piezoelectric actuators in accordance with the first and second aspects of the present invention are characterized by a small variance of the displacement derived from a change in temperature. In other words, even when the piezoelectric actuators are used in an environment in which the temperature changes drastically, they make a substantially constant displacement. Therefore, the piezoelectric actuators can be preferably adapted to industrial products which are supposed to be used in an environment in which the temperature changes drastically, for example, to automotive parts.

In general, the driving methods for a piezoelectric actuator include, as mentioned above, (1) a constant-voltage driving method for driving the piezoelectric actuator by controlling a displacement using a voltage as a parameter, (2) a constant-energy driving method for driving the piezoelectric actuator by controlling a displacement using injected energy as a parameter, and (3) a constant-charge driving method for driving the piezoelectric actuator by controlling a displacement using injected charge as a parameter.

Now, the temperature dependency of a displacement of a piezoelectric actuator will be described in relation to each of the driving methods for the piezoelectric actuator.

To begin with, a displacement (ΔL1) of a piezoelectric actuator driven according to the constant-voltage driving method is represented by the following equation A1:

$$\Delta L1 = D33 \times EF \times L0 \quad A1$$

wherein D33 denotes a magnitude of dynamic strain [m/V], EF denotes a maximum electric field strength [V/m], and L0 denotes the length [m] of a piezoelectric ceramic member observed prior to application of a voltage. Moreover, the magnitude of dynamic strain indicates the displacement performance of a piezoelectric ceramic, which is exerted in a direction parallel to a voltage-applying direction, when a high voltage that has an amplitude in electric field strength from zero to 3000 V/mm on the order of causing no dielectric breakdown is applied with the amplitude held constant to drive the piezoelectric actuator. The magnitude of dynamic strain is represented by the following equation A2:

$$D33 = S/EF = (\Delta L1/L0)/(V/L0) \quad A2$$

wherein S denotes a maximum magnitude of strain. Incidentally, the magnitude of dynamic strain D33 has not only temperature dependency but also electric field strength dependency.

As seen from the equations (A1) and (A2), the piezoelectric actuator displacement (ΔL1) is proportional to the product of the magnitude of dynamic strain D33 dependent on applied electric field strength by the applied electric field strength.

Moreover, energy, charge, an apparent dynamic capacity, and an applied voltage have the relationships expressed by the following equations A3 and A4:

$$W = 1/2 \times C \times V^2 \quad A3$$

$$Q = C \times V \quad A4$$

wherein W denotes energy [J], C denotes an apparent dynamic capacity [F], V denotes an applied voltage [V], and Q denotes charge [C].

The apparent dynamic capacity C [F] is defined as a value calculated by dividing an amount of charge which is accumulated in a capacitor, due to the voltage applied to the actuator, when a piezoelectric actuator and the capacitor are connected in series with each other, and the piezoelectric actuator is driven with a voltage that has a constant amplitude in electric field strength of 3000 V/mm from zero on the order of causing no dielectric breakdown. The apparent dynamic capacity C encompasses electrical charge stemming from at least a dielectric component of a piezoelectric ceramic, a polarization-inversion component thereof and a polarization-rotation component thereof, and leakage current stemming from a DC resistance component of the piezoelectric ceramic. Moreover, the apparent dynamic capacity C is not only temperature-dependent but also electric field strength-dependent.

Consequently, a displacement ($\Delta L2$) made by a piezoelectric actuator driven according to the constant-energy driving method (W: constant) is proportional to the product of a quotient $D33/C^{0.5}$ dependent on driving electric field strength by the driving electric field strength (=a driving voltage/L0), according to the equation A5 below.

$$\Delta L2 = D33 \times (2 \times W/C)^{0.5} \quad \text{A5}$$

Herein, when the apparent dynamic capacity C changes along with a change in temperature, the driving electric field strength itself varies according to the equation A3.

Moreover, a displacement ($\Delta L3$) made by a piezoelectric actuator driven according to the constant-charge driving method (Q: constant) is proportional to the product of a quotient $D33/C$ dependent on driving electric field strength by the driving electric field strength (=a driving voltage/L0) according to the equation A6 below.

$$\Delta L3 = D33 \times (Q/C) \quad \text{A6}$$

Herein, when the apparent dynamic capacity C changes along with a change in temperature, the applied electric field strength itself varies according to the equation A4.

Consequently, in order to diminish the variation width in a displacement of an actuator over a working temperature range, the temperature dependencies of the values D33, D33/$C^{0.5}$ and D33/C that depend on driving electric field strength should preferably be small.

Moreover, needless to say, the absolute values of the values D33, D33/$C^{0.5}$ and D33/C that indicate displacement performance should preferably be large.

Next, the relationship between an apparent dynamic capacity and a driving voltage will be described in relation to constant-energy driving and constant-charge driving.

A voltage (terminal voltage) to be loaded on a piezoelectric actuator and a drive circuit according to the constant-energy driving method (W: constant) is proportional to a quotient $1/C^{0.5}$ according to the equation A7 below.

$$V = (2 \times W/C)^{0.5} \quad \text{A7}$$

The terminal voltage to be applied according to the constant-charge driving method is proportional to a quotient $1/C$ according to the equation A8 below.

$$V = Q/C \quad \text{A8}$$

Assuming that the terminal voltage varies, designing must be performed in consideration of the upper limit of the terminal voltage in order to ensure the reliabilities of the piezoelectric actuator and drive circuit in withstanding a voltage. Restrictions are imposed on designing of the actuator in efforts to prevent inter-electrode discharge, lateral leakage, or a dielectric breakdown. Namely, the distance between positive and negative electrodes should not be decreased. Therefore, the displacement characteristic is degraded when the terminal voltage reaches the lower limit thereof within the working temperature range. This poses a problem in circuit designing because a large size and a high cost result from an effort to improve the capability of a circuit element to withstand a voltage.

Consequently, for improvement in the displacement performance of an actuator and the compactness and low cost of the drive circuit, the temperature dependencies of the values $1/C^{0.5}$ and $1/C$ dependent on driving electric field strength should preferably be small.

Moreover, when the apparent dynamic capacity C converges on a certain value, the terminal voltage also converges on a certain value. Therefore, if the temperature dependency of the quotient $D33/C^{0.5}$ with driving electric field strength held constant is small, the temperature dependency of a displacement of an actuator to be controlled according to the constant-energy method can be reduced. Moreover, if the temperature dependency of the quotient $D33/C$ with the driving electric field strength held constant is small, the temperature dependency of the displacement of the actuator to be controlled according to the constant-charge method can be reduced.

As mentioned above, in order to reduce the temperature dependency of a piezoelectric actuator, the magnitude of dynamic strain D33 occurring under such a driving condition that the amplitude of a driving voltage shall remain constant, and the widths of variations in the apparent dynamic capacity C, the quotient $D33/C^{0.5}$, and the quotient $D33/C$ should preferably be small.

In the piezoelectric actuator in accordance with the first aspect of the present invention, as described previously, at least one of the variation width $W_C$ in an apparent dynamic capacity C derived from a change in temperature, the variation width $W_L$ in a displacement L derived from the temperature change, and the variation width $W_{L/C}$ in the quotient of the displacement by the apparent dynamic capacity (L/C) derived from the temperature change falls within such a small range of ±11%, ±14%, or ±12% over a specific temperature range from –30° C. to 80° C.

Moreover, in the piezoelectric actuator in accordance with the second aspect of the present invention, at least one of the variation width $W_C$ in the apparent dynamic capacity C derived from a change in temperature, the variation width $W_L$ in the displacement L derived from the temperature change, and the variation width $W_{L/C}$ in the quotient of the displacement by the apparent dynamic capacity (L/C) derived from the temperature change falls within a small range of ±30%, ±14%, or ±35% over the specific temperature range from –30° C. to 160° C.

Consequently, the temperature dependencies of the displacements of the piezoelectric actuators in accordance with the first and second aspects of the present invention are decreased irrespective of the driving method such as the constant-voltage driving, constant-energy driving, or constant-charge driving. In other words, the piezoelectric actuators exhibit nearly the same displacement characteristic despite a change in working temperature.

As described above, according to the present invention, there is provided a piezoelectric actuator whose displacement exhibits little temperature dependency irrespective of a driving method for the piezoelectric actuator.

DESCRIPTION OF THE PREFERRED EMBODIMENTS

Figure 1:
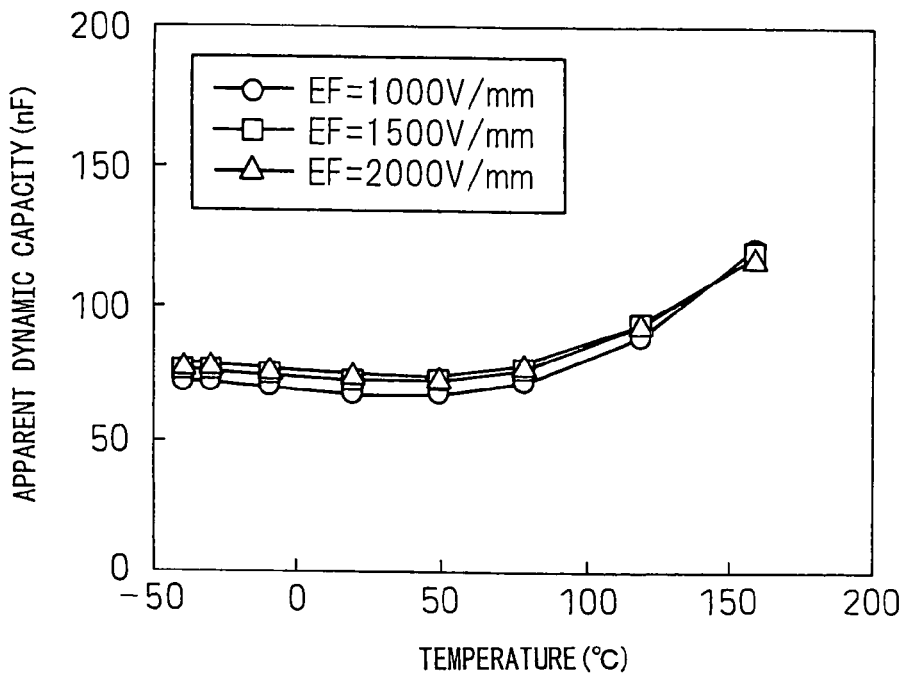
FIG. 1 is a graph showing the temperature dependency of an apparent dynamic capacity of a piezoelectric actuator in accordance with Example 1.

Examples of the present invention will be described below.

A piezoelectric actuator in accordance with the first aspect of the present invention satisfies the aforesaid requirements (a) to (c).

The requirement (a) is such that: assuming that C [F] denotes the apparent dynamic capacity of the piezoelectric actuator, the variation width $W_C$ [%] in the apparent dynamic capacity derived from a change in temperature, which is represented by the equation (1) below, falls within ±11% over a specific temperature range from −30° C. to 80° C.

$$W_C(\%)=[\{2\times C_{max}/(C_{max}+C_{min})\}-1]\times 100 \quad (1)$$

In the requirement (a), the apparent dynamic capacity is calculated by dividing an amount of charge Q [C], which is accumulated in a capacitor, by the voltage V [V] applied to the piezoelectric actuator, when the piezoelectric actuator and the capacitor set to the temperature of, for example, 25° C. are connected in series with each other and a voltage is applied to each of the piezoelectric actuator and capacitor.

The aforesaid requirement (b) is such that: assuming that L [μm] denotes a displacement made by the piezoelectric actuator, the variation width $W_L$ in the displacement L derived from a change in temperature, which is represented by the equation (2) below, falls within ±14% over the specific temperature range from −30° C. to 80° C.

$$W_L(\%)=[\{2\times L_{max}/(L_{max}+L_{min})\}-1]\times 100 \quad (2)$$

The aforesaid requirement (c) is such that: assuming that C [F] denotes the apparent dynamic capacity of the piezoelectric actuator and L [μm] denotes a displacement made by the piezoelectric actuator, the variation width $W_{L/C}$ in the quotient L/C which is represented by the equation (3) below falls within ±12% over the specific temperature range from −30° C. to 80° C.

$$W_{L/C}(\%)=[\{2\times (L/C)_{max}/((L/C)_{max}+(L/C)_{min})\}-1]\times 100 \quad (3)$$

In the requirement (c), the apparent dynamic capacity is calculated by dividing an amount of chart Q [C], which is accumulated in a capacitor, by the voltage V [V] applied to the piezoelectric actuator, when the piezoelectric actuator and the capacitor set to the temperature of, for example, 25° C. are connected in series with each other and a voltage is applied to each of the piezoelectric actuator and capacitor.

If the piezoelectric actuator does not satisfy any of the requirements (a) to (c), that is, if the variation width $W_C$ falls outside the range of ±11% at the temperatures ranging from −30° C. to 80° C., the variation width $W_L$ falls outside the range of ±14% at the temperatures ranging from −30° C. to 80° C., and the variation width $W_{L/C}$ falls outside the range of ±12% at the temperatures ranging from −30° C. to 80° C., the temperature dependency of the piezoelectric actuator at the temperatures ranging from −30° C. to 80° C. may increase.

The piezoelectric actuator should preferably satisfy both the requirements (a) and (b) (Claim 2).

In this case, the temperature dependency of the piezoelectric actuator can be further decreased.

Moreover, the piezoelectric actuator should preferably satisfy all of the requirements (a) to (c) (Claim 3).

In this case, the temperature dependency of the piezoelectric actuator can be further decreased.

In the piezoelectric actuator, the variation width $W_C$ [%] in a dynamic capacity derived from a change in temperature should preferably fall within ±12% over a specific temperature range from −40° C. to 80° C.

Moreover, the variation width $W_L$ in the displacement L derived from a change in temperature should preferably fall within ±14% over the specific temperature range from −40° C. to 80° C.

Moreover, the variation width $W_{L/C}$ in the quotient L/C derived from a change in temperature should preferably fall within ±13% over the specific temperature range from −40° C. to 80° C.

As mentioned above, when the variation width $W_C$, the variation width $W_L$, and the variation width $W_{L/C}$ fall within the specific ranges over the temperature range from −40° C. to 80° C., the temperature dependency of the displacement of the piezoelectric actuator can be decreased even over the temperature range from −40° C. to 80° C.

The piezoelectric actuator should preferably satisfy the requirement (d) described below (Claim 4).

(d) Assuming that C [F] denotes an apparent dynamic capacity and L [μm] denotes a displacement made by the piezoelectric actuator, the variation width $W_{L/C^{0.5}}$ in a quotient $L/C^{0.5}$ which is represented by the following equation (4) should fall within ±12% over the specific temperature range from −30° C. to 80° C. (where $L/C^{0.5}$ denotes the ratio of the displacement L [μm] made by the piezoelectric actuator to the square root of the apparent dynamic capacity C [F]):

$$W_{L/C^{0.5}}(\%)=[\{2\times (L/C^{0.5})_{max}/((L/C^{0.5})_{max}+(L/C^{0.5})_{min})\}-1]\times 100 \quad (4)$$

wherein $(L/C^{0.5})$ max denotes the maximum value of the quotient $L/C^{0.5}$ at the temperatures ranging from −30° C. to 80° C., and $(L/C^{0.5})_{min}$ denotes the minimum value of the quotient $L/C^{0.5}$ at the temperatures ranging from −30° C. to 80° C.

When the piezoelectric actuator does not satisfy the requirement (d), in other words, when the variation width $W_{L/C^{0.5}}$ in the quotient $L/C^{0.5}$ derived from a change in temperature exceeds ±12% over the specific temperature range from −30° C. to 80° C., the temperature dependency of the displacement of the piezoelectric actuator may increase.

Moreover, the variation width $W_{L/C^{0.5}}$ in the quotient $L/C^{0.5}$ derived from a change in temperature should preferably fall within ±12% over the specific temperature range from −40° C. to 80° C.

In this case, the temperature dependency of the displacement made by the piezoelectric actuator can be decreased even over the temperature range from −40° C. to 80° C.

The piezoelectric actuator should preferably satisfy the requirement (e) described below (Claim 5).

(e) A magnitude of dynamic strain calculated by dividing a strain, which the piezoelectric actuator makes in an electric-field applied direction, by electric field strength should be equal to or larger than 250 pm/V over the specific temperature range from −30° C. to 80° C.

If the piezoelectric actuator does not satisfy the requirement (e), that is, if the magnitude of dynamic strain falls below 250 pm/V over the specific temperature range from −30° C. to 80° C., a displacement made by the piezoelectric actuator may be decreased.

Moreover, the magnitude of dynamic strain should preferably be equal to or larger than 250 pm/V over a temperature range from −40° C. to 80° C.

In this case, a displacement made by the piezoelectric actuator can be increased even over the temperature range from −40° C. to 80° C.

The piezoelectric actuator should preferably satisfy the requirement (f) described below (Claim 6).

(f) The variation width $W_C$ [%] in the apparent dynamic capacity C derived from a change in temperature should fall within ±35% over a specific temperature range from −30° C. to 160° C.

Moreover, the piezoelectric actuator should preferably satisfy the requirement (g) described below (Claim 7).

(g) The variation width $W_L$ in a displacement L of the piezoelectric actuator derived from a change in temperature should fall within ±14% over the specific temperature range from −30° C. to 160° C.

Moreover, the piezoelectric actuator should preferably satisfy the requirement (h) described below (Claim 8).

(h) Assuming that C [F] denotes an apparent dynamic capacity and L [µm] denotes a displacement made by the piezoelectric actuator, the variation width $W_{L/C}$ in the quotient L/C derived from a change in temperature should fall within ±35% over the specific temperature range from −30° C. to 160° C.

Moreover, the piezoelectric actuator should preferably satisfy the requirement (i) described below (Claim 9).

(i) Assuming that C [F] denotes an apparent dynamic capacity and L [µm] denotes a displacement made by the piezoelectric actuator, the variation width $W_{L/C}^{0.5}$ in the quotient $L/C^{0.5}$ derived from a change in temperature should fall within ±20% over the specific temperature range from −30° C. to 160° C.

If the piezoelectric actuator satisfies any of the requirements (f) to (i), the temperature dependency of the piezoelectric actuator can be further improved. Namely, in this case, the temperature dependency of a displacement made by the piezoelectric actuator can be decreased over a wider temperature range from −30° C. to 160° C.

According to the second aspect of the present invention, the piezoelectric actuator satisfies the requirements (j) to (l).

The requirement (j) is such that: assuming that C [F] denotes the apparent dynamic capacity of the piezoelectric actuator, the variation width $W_C$ [%] in the apparent dynamic capacity derived from a change in temperature, which is represented by the following equation (5), should fall within ±30% over a specific temperature range from −30° C. to 160° C.:

$$W_C(\%) = [\{2 \times C_{max}/(C_{max}+C_{min})\} - 1] \times 100 \quad (5)$$

wherein $C_{max}$ denotes the maximum value of the apparent dynamic capacity at the temperatures ranging from −30° C. to 160° C., and $C_{min}$ denotes the minimum value of the apparent dynamic capacity at the temperatures ranging from −30° C. to 160° C.

In the requirement (j), the apparent dynamic capacity is calculated by dividing an amount of charge Q [C], which is accumulated in a capacitor, by the voltage V [V] applied to the piezoelectric actuator, when the piezoelectric actuator and the capacitor set to, for example, 25° C. are connected in series with each other and a voltage is applied to each of the piezoelectric actuator and capacitor.

The requirement (k) is such that: assuming that L [µm] denotes a displacement made by the piezoelectric actuator, the variation width $W_L$ in the displacement L derived from a change in temperature, which is represented by the following equation (6), should fall within ±14% over the specific temperature range from −30° C. to 160° C.:

$$W_L(\%) = [\{2 \times L_{max}/(L_{max}+L_{min})\} - 1] \times 100 \quad (6)$$

wherein $L_{max}$ denotes the maximum value of the displacement at the temperatures ranging from −30° C. to 160° C., and $L_{min}$ denotes the minimum value of the displacement at the temperatures ranging from −30° C. to 160° C.

The requirement (l) is such that: assuming that C [F] denotes the apparent dynamic capacity of the piezoelectric actuator, and L [µm] denotes a displacement l made by the piezoelectric actuator, the variation width $W_{L/C}$ in the quotient L/C derived from a change in temperature, which is represented by the following equation (7), should fall within ±35% over the specific temperature range from −30° C. to 160° C.:

$$W_{L/C}(\%) = [\{2 \times (L/C)_{max}/((L/C)_{max}+(L/C)_{min})\} - 1] \times 100 \quad (6)$$

where $(L/C)_{max}$ denotes the maximum value of the quotient L/C at the temperatures ranging from −30° C. to 160° C., and $(L/C)_{min}$ denotes the minimum value of the quotient L/C at the temperatures ranging from −30° C. to 160° C.

In the requirement (l), the apparent dynamic capacity is calculated by dividing an amount of charge Q [C], which is accumulated in a capacitor, by the voltage V [V] applied to the piezoelectric actuator, when the piezoelectric actuator and the capacitor set to, for example, 25° C. are connected in series with each other and a voltage is applied to each of the piezoelectric actuator and capacitor.

If the piezoelectric actuator does not satisfy any of the requirements (j) to (l), that is, if the variation width $W_C$ falls outside the range of ±30% at the temperatures ranging from −30° C. to 160° C., the variation width $W_L$ falls outside the range of ±14% at the temperatures ranging from −30° C. to 160° C., and the variation width $W_{L/C}$ falls outside the range of ±35% at the temperatures ranging from −30° C. to 160° C., the temperature dependency of the piezoelectric actuator at the temperatures ranging from −30° C. to 160° C. may be increased.

The piezoelectric actuator should preferably satisfy both the requirements (j) and (k) (Claim 11).

In this case, the temperature dependency of the piezoelectric actuator can be further decreased.

The piezoelectric actuator should preferably satisfy all of the requirements (j) to (i) (Claim 12).

In this case, the temperature dependency of the piezoelectric actuator can be further decreased.

In the piezoelectric actuator, the variation width $W_C$ in the apparent dynamic capacity derived from a change in temperature should preferably fall within ±35% over a specific temperature range from −40° C. to 160° C.

Moreover, the variation width $W_L$ in the displacement derived from a change in temperature should preferably fall within ±14% over the specific temperature range from −40° C. to 160° C.

Furthermore, the variation width $W_{L/C}$ in the quotient L/C derived from a change in temperature should preferably fall within ±35% over the specific temperature range from −40° C. to 160° C.

If the variation width $W_C$, the variation width $W_L$, and the variation width $W_{L/C}$ fall within the specific ranges over the temperature range from −40° C. to 160° C., the temperature dependency of the piezoelectric actuator can be decreased even over the temperature range from −40° C. to 160° C.

The piezoelectric actuator should preferably satisfy the requirement (m) described below (Claim 13).

(m) Assuming that C [F] denotes the apparent dynamic capacity of the piezoelectric actuator, and L [µm] denotes a displacement made by the piezoelectric actuator, the variation width $W_{L/C}^{0.5}$ in the quotient $L/C^{0.5}$ derived from a change in temperature, which is represented by the following equation (8), should fall within ±20% over a specific temperature range from −30° C. to 160° C.:

$$W_{L/C}^{0.5}(\%) = [\{2 \times (L/C^{0.5})_{max}/((L/C^{0.5})_{max}+(L/C^{0.5})_{min})\} - 1] \times 100 \quad (6)$$

wherein $(L/C^{0.5})_{max}$ denotes the maximum value of the quotient $L/C^{0.5}$ at the temperatures ranging from −30° C. to 160° C., and $(L/C^{0.5})_{min}$ denotes the minimum value of the quotient L/C at the temperatures ranging from −30° C. to 160° C.

If the piezoelectric actuator does not satisfy the requirement (m), that is, if the variation width $W_{L/C}^{0.5}$ in the quotient $L/C^{0.5}$ derived from a change in temperature exceeds ±20% over the specific temperature range from −30° C. to 160° C., the temperature dependency of the displacement of the piezoelectric actuator may be increased.

Moreover, the variation width $W_{L/C}{}^{0.5}$ in the quotient $L/C^{0.5}$ derived from a change in temperature should preferably fall within ±20% over a specific temperature range from −40° C. to 160° C.

In this case, the temperature dependency of the displacement of the piezoelectric actuator can be decreased over the temperature range from −40° C. to 160° C.

The piezoelectric actuator should preferably satisfy the requirement (n) described below (Claim 14).

(n) A magnitude of dynamic strain calculated by dividing a strain, which the piezoelectric actuator makes in an electric-field applied direction, by the electric field strength should be equal to or larger than 250 pm/V over a specific temperature range from −30° C. to 160° C.

If the piezoelectric actuator does not satisfy the requirement (n), that is, if the magnitude of dynamic strain falls below 250 pm/V over the specific temperature range from −30° C. to 160° C., the displacement of the piezoelectric actuator may be decreased.

The magnitude of dynamic strain should preferably be equal to or larger than 250 pm/V over a temperature range from −40° C. to 160° C.

In this case, the displacement of the piezoelectric actuator can be increased even over the temperature range from −40° C. to 160° C.

Moreover, according to the first and second aspects of the present invention, the piezoelectric actuator includes a piezoelectric element, which has a pair of electrodes formed on the surface of a piezoelectric ceramic member, as a drive source.

The piezoelectric ceramic member should be preferably formed with an alkali metal-containing piezoelectric ceramic that contains at least one of lithium (Li), potassium (K), and sodium (Na) (Claim 18).

In this case, a leakage current produced during driving under a high-temperature environment of 80° C. or higher increases, and the variation width in an apparent dynamic capacity at 80° C. or higher gets larger than the widths of variations in an electrostatic capacity and a dynamic capacity respectively at 80° C. or higher. Consequently, in this case, the aforesaid effect signifying that the temperature dependency of a displacement occurring during, for example, constant-energy driving or constant-charge driving can be decreased by satisfying the requirement (a) or/and (c) that defines a variation width using the apparent dynamic capacity as a parameter according to the first aspect, or by satisfying the requirement (j) or/and (l) that defines the variation width according to the second aspect, can be more markedly drawn out.

Moreover, the specific resistance of the piezoelectric ceramic member should preferably be equal to or larger than a product of 1 by $10^6$ Ω·m over an entire working temperature range (for example, a range from −30° C. to 160° C.) of the piezoelectric actuator. In this case, the piezoelectric ceramic member can be protected from being broken with resistive heat dissipation. More preferably, the specific resistance of the piezoelectric ceramic member should be equal to or larger than a product of 1 by $10^8$ Ω·m over the working temperature range. In this case, the service life of the piezoelectric actuator can be extended.

Moreover, the piezoelectric ceramic member should preferably not contain lead (Claim 19).

In this case, the piezoelectric actuator that does not contain lead which imposes a large environmental load can be produced. In other words, the safety of the piezoelectric actuator relative to an environment can be improved.

Moreover, preferably, the piezoelectric ceramic member should be formed with a polycrystalline substance whose main phase is an isotropic perovskite compound represented by a general formula $\{Li_x(K_{1-y}Na_y)_{1-x}\}\{Nb_{1-Z-w}Ta_zSb_w\}O_3$ (where $0 \leq x \leq 0.2, 0 \leq y \leq 1, 0 \leq z \leq 0.4, 0 \leq w \leq 0.2, x+z+w>0$), and should be a crystal-oriented piezoelectric ceramic having specific crystal faces of each crystal grain, which constitutes the polycrystalline substance, oriented (Claim 20).

In this case, a piezoelectric actuator satisfying the aforesaid requirements (a) to (i) or a piezoelectric actuator satisfying the aforesaid requirements (j) to (n) can be readily realized.

The crystal-oriented piezoelectric ceramic contains potassium sodium niobate ($K_{1-y}Na_yNbO_3$), which is a kind of isotropic perovskite compound, as a basic composition, has a predetermined amount of lithium (Li) substituted for part of an A-site element (K or Na) and/or has a predetermined amount of tantalum (Ta) and/or antimony (Sb) substituted for part of a B-site element (Nb). In the above general formula, x+z+w>0 signifies that at least one of lithium (Li), tantalum (Ta), and antimony (Sb) should be contained as a substitutional element.

In the above general formula, y denotes the ratio of potassium (K) to sodium (Na) contained in the crystal-oriented piezoelectric ceramic. The crystal-oriented piezoelectric ceramic employed in the present invention should contain at least one of K and Na as an A-site element. In other words, the ratio y of K to Na, is not limited to any specific value but may be set to any value equal to or larger than 0 and equal to or smaller than 1. For an excellent displacement characteristic, the y value should preferably be equal to or larger than 0.05 and equal to or smaller than 0.75, more preferably, be equal to or larger than 0.20 and equal to or smaller than 0.70, more preferably, be equal to or larger than 0.35 and equal to or smaller than 0.65, more preferably, be equal to or larger than 0.40 and equal to or smaller than 0.60, or more preferably, be equal to or larger than 0.42 and equal to or smaller than 0.60.

By the way, x denotes an amount of lithium (Li) that is substituted for potassium (K) and/or sodium (Na) that is an A-site element. When Li is substituted for part of K and/or Na, the piezoelectric properties are improved, the Curie temperature is raised, and/or denseness is facilitated. The x value should preferably be equal to or larger than 0 and equal to or smaller than 0.2 in practice. When the x value exceeds 0.2, the displacement characteristic is degraded. Preferably, the x value should be equal to or larger than 0 and equal to or smaller than 0.15. More preferably, the x value should be equal to or larger than 0 and equal to or smaller than 0.10.

Moreover, z denotes an amount of tantalum (Ta) that is substituted for niobium (Nb) which is a B-site element. When Ta is substituted for part of Nb, the displacement characteristic is improved. The z value should preferably be equal to or larger than 0 and equal to or smaller than 0.4 in practice. If the z value exceeds 0.4, the Curie temperature decreases. This makes it hard to use the piezoelectric ceramic as a piezoelectric material for home electric appliances or automobiles. The z value should preferably be equal to or larger than 0 and equal to or smaller than 0.35, or more preferably, be equal to or larger than 0 and equal to or smaller than 0.30.

Furthermore, w denotes an amount of antimony (Sb) that is substituted for niobium (Nb) which is a B-site element. If Sb is substituted for part of Nb, the displacement characteristic improves. Specifically, the w value should preferably be equal to or larger than 0 and equal to or smaller than 0.2. If the w value exceeds 0.2, the displacement characteristic degrades and/or Curie temperature decreases. The w value should preferably be equal to or larger than 0 and equal to or smaller than 0.15.

As temperatures change from high to low, the crystal phase of the crystal-oriented piezoelectric ceramic changes from the cubic crystal to the tetragonal crystal (first crystal phase transition temperature=Curie temperature), from the tetragonal crystal to the orthorhombic crystal (second crystal phase transition temperature), or from the orthorhombic crystal to the rhombohedral crystal (third crystal phase transition temperature). At temperatures higher than the first crystal phase transition temperature, as the crystal phase is the cubic crystal, the displacement characteristic vanishes. Moreover, at temperatures lower than the second crystal phase transition temperature, the crystal phase is the orthorhombic crystal. Therefore, the temperature dependencies of a displacement and an apparent dynamic electrostatic capacity respectively are increased. Consequently, the first crystal phase transition temperature is determined to be higher than a working temperature range, and the second crystal phase transition temperature is determined to be lower than the working temperature range. Thus, the piezoelectric ceramic should preferably exist as the tetragonal crystal over the entire of working temperature range.

Talking of potassium sodium niobate ($K_{1-y}Na_yNbO_3$) that is the basic composition of the crystal-oriented piezoelectric ceramic, the Journal of the American Ceramic Society (U.S.A., 1959, Vol. 42[9], pp. 438-442) and the specification of U.S. Pat. No. 2,976,246 have disclosed that, as temperatures change from high to low, the crystal phase of $K_{1-y}Na_yNbO_3$ changes from the cubic crystal to the tetragonal crystal (first crystal phase transition temperature=Curie temperature), from the tetragonal crystal to the orthorhombic crystal (second crystal phase transition temperature), and from the orthorhombic crystal to the rhombohedral crystal (third crystal phase transition temperature). Moreover, when the y value is set to 0.5, the first crystal phase transition temperature is approximately 420° C., the second crystal phase transition temperature is approximately 190° C., and the third crystal phase transition temperature is approximately −150° C. Consequently, the temperature domain permitting the tetragonal crystal to exist is a range from 190° C. to 420° C. and is inconsistent with the working temperature range from −40° C. to 160° C. defined for industrial products.

On the other hand, the first and second crystal phase transition temperatures of the crystal-oriented piezoelectric ceramic may be freely varied by changing an amount of lithium (Li), tantalum (Ta), or antimony (Sb) which is a substitutional element to be substituted for other element contained in potassium sodium niobate ($K_{1-y}Na_yNbO_3$) that is the basic composition of the crystal-oriented piezoelectric ceramic.

Multiple regression analysis was performed on the substitutional amounts of substitutional lithium (Li), tantalum (Ta), and antimony (Sb) and the measured values of crystal phase transition temperatures with the y value set to a range from 0.4 to 0.6 permitting the piezoelectric properties to improve most greatly. The results are expressed by equations B1 and B2 below.

The equations B1 and B2 demonstrate that the amount of substitutional lithium (Li) works to raise the first crystal phase transition temperature and lower the second crystal phase transition temperature. Moreover, tantalum (Ta) and antimony (Sb) work to lower both the first crystal phase transition temperature and the second crystal phase transition temperature.

First crystal phase transition temperature=(388+9x−5z−17w)±50[° C.] (B1)

Second crystal phase transition temperature=(190−18.9x−3.9z−5.8w)±50[° C.] (B2)

The first crystal phase transition temperature is the temperature causing the piezoelectric properties to completely vanish. Moreover, a dynamic capacity abruptly increases at temperatures close to the first crystal phase transition temperature. The first crystal phase transition temperature should therefore preferably be equal to or higher than the sum of an upper-limit working ambient temperature for industrial products and 60° C. The second crystal phase transition temperature is the temperature that brings about a crystal phase transition, but does not cause the piezoelectric properties to vanish. The second crystal phase transition temperature should therefore be set to a value that does not adversely affect the temperature dependency of a displacement or a dynamic capacity, and preferably be equal to or smaller than the sum of a lower-limit working ambient temperature for industrial products and 40° C.

By the way, the upper-limit working ambient temperature for industrial products varies depending on usage and may therefore be 60° C., 80° C., 100° C., 120° C., 140° C., or 160° C. The lower-limit working ambient temperature for industrial products may be −30° C., −40° C. or the like.

Consequently, the first crystal phase transition temperature in the equation B1 should preferably be equal to or higher than 120° C. Therefore, the x, z, and w values should preferably satisfy the condition (388+9x−5z−17w)+50≧120.

Moreover, the second crystal phase transition temperature in the equation B2 should preferably be equal to or lower than 10° C. Therefore, the x, z, and w values should preferably satisfy the condition (190−18.9x−3.9z−5.8w)−50≦10.

In the crystal-oriented piezoelectric ceramic, the x, y, and z values in the general formula $\{Li_x(k_{1-y}Na_y)_{1-x}\}\{Nb_{1-z-w}Ta_zSb_w\}O_3$ should satisfy the relationships represented by the equations (9) and (10) below (Claim 21).

$$9x-5z-17w \geq -318 \tag{9}$$

$$-18.9x-3.9z-5.8w \leq -130 \tag{10}$$

Incidentally, the crystal-oriented piezoelectric ceramic may include only the isotropic perovskite compound (first KNN-system compound) represented by the aforesaid general formula, or may have other element actively added or substituted for any element.

In the former case, the crystal-oriented piezoelectric ceramic should preferably include the first KNN-system compound alone, but may contain any other element or phase as far as the element or phase will retain the isotropic perovskite crystal structure but will not adversely affect the sintering characteristic, piezoelectric properties, or the like. In particular, an impurity is inevitably mixed, which is contained in a locally-procurable industrial raw material whose purity ranges from 99% to 99.9% and which is used to manufacture the crystal-oriented piezoelectric ceramic. For example, niobium pentaoxide ($Nb_2O_5$) that is one of raw materials of the crystal-oriented piezoelectric ceramic may contain at most less than 0.1 weight percent of tantalum (Ta) and less than 0.15 weight percent of fluorine (F) as impurities stemming from raw ores or a manufacturing method. Moreover, if bismuth (Bi) is used in the process of manufacture, mixing thereof in a raw material is inevitable, as described in Example 1 later.

In the latter case, addition of, for example, manganese (Mn) proves effective in decreasing the temperature dependency of an apparent dynamic capacity and in increasing a displacement. In addition, the addition of Mn proves effective in decreasing a dielectric loss tan δ and in increasing a mechanical quality coefficient Qm. Therefore, the addition of Mn provides a resonant drive type actuator with preferable characteristics.

Moreover, the crystal-oriented piezoelectric ceramic has specific crystal faces of crystal grains, which constitute a polycrystal whose main phase exists as an isotropic perovskite compound represented by the aforesaid general formula, oriented. Herein, the specific crystal faces of the crystal grains that are oriented are preferably pseudo-cubic {100} planes.

Incidentally, what is referred to as a pseudo-cubic {HKL} crystal is the tetragonal cubic, orthorhombic crystal, trigonal crystal, or the like that assumes, like the isotropic perovskite compound, a structure slightly strained compared with the structure of the cubic crystal. As the strain is negligible, the pseudo-cubic {HKL} crystal is generally regarded as the cubic crystal and is indicated with Miller indices.

In this case, a displacement made by the piezoelectric actuator can be increased, and the temperature dependency of an apparent dynamic capacity can be decreased.

When the pseudo-cubic {100} plane is plane-oriented, the extent of plane orientation can be indicated with an average orientation degree F (HKL) calculated according to the Lotgering's method represented by the equation (I) below.

$$F(HKL) = \frac{\frac{\Sigma' I(HKL)}{\Sigma I(hkl)} - \frac{\Sigma' I_0(HKL)}{\Sigma I_0(hkl)}}{1 - \frac{\Sigma' I_0(HKL)}{\Sigma I_0(hkl)}} \times 100(\%) \quad (I)$$

In the equation (I), $\Sigma I(hkl)$ denotes the sum total of X-ray diffraction intensities of all crystal faces (hkl) measured on a crystal-oriented piezoelectric ceramic, and $\Sigma I_0(hkl)$ denotes the sum total of X-ray diffraction intensities of all crystal faces (hkl) measured on a non-crystal-oriented ceramic having the same composition as the crystal-oriented piezoelectric ceramic. Moreover, $\Sigma I'(HKL)$ denotes the sum total of X-ray diffraction intensities of specific crystal faces (HKL) that are crystallographically equivalent to one another and measured on the crystal-oriented piezoelectric ceramic, and $\Sigma I_0(HKL)$ denotes the sum total of X-ray diffraction intensities of specific crystal faces (HKL) that are crystallographically equivalent to one another and measured on the non-crystal-oriented ceramic having the same composition as the crystal-oriented piezoelectric ceramic.

Consequently, when the crystal grains constituting a polycrystalline substance are not oriented at all, the average orientation degree F(HKL) is 0%. When the (HKL) planes of all crystal grains constituting the polycrystalline substance are oriented in parallel to measured planes, the average orientation degree F(HKL) is 100%.

In general, the larger the ratio of oriented crystal grains to all grains is, the more excellent properties the polycrystalline substance exhibits. For example, assuming that specific crystal faces are plane-oriented, the average orientation degree F(HKL) calculated according to the Lotgering's method represented by the equation (I) should preferably be equal to or larger than 30% for the excellent piezoelectric properties. More preferably, the average orientation degree F(HKL) should be equal to or larger than 50%. More preferably, the average orientation degree F(HKL) should be equal to or larger than 70%. Moreover, the specific crystal faces to be oriented should be planes perpendicular to a polarization axis. For example, if the crystal system of the perovskite compound is the tetragonal system, the specific crystal faces to be oriented should preferably be pseudo-cubic {100} planes.

The orientation degree of pseudo-cubic {100} planes contained in a crystal-oriented piezoelectric ceramic, which is calculated according to the Lotgering's method, should preferably be 30% or more. Moreover, the crystal system of the crystal-oriented piezoelectric ceramic should preferably be the tetragonal system over a temperature range from 10° C. to 160° C. (Claim 22).

Incidentally, when specific crystal faces are axially oriented, the extent of orientation cannot be defined by the same orientation degree (equation (I)) as the one applied to the plane orientation. However, when X-ray diffractions by planes perpendicular to an axis of orientation are measured, an average orientation degree (axial orientation degree) calculated according to the Lotgering's method and obtained based on the results of the diffractions by the (HKL) planes may be used to indicate an extent of axial orientation. Moreover, the axial orientation degree of a compact having specific crystal faces thereof nearly perfectly axially oriented exhibits almost the same axial orientation degree as the one measured on a compact having specific crystal faces thereof nearly perfectly plane-oriented.

Next, the characteristics of a piezoelectric actuator adopting the crystal-oriented piezoelectric ceramic will be described below.

In the piezoelectric actuator adopting the crystal-oriented piezoelectric ceramic as a drive source, a magnitude of dynamic strain D33 that occurs under such a driving condition that the amplitude of a driving voltage shall remain constant at the electric field strength that is equal to or larger than 100 V/mm over a temperature range from −30° C. to 160° C. and is equal to or smaller than a value which does not bring about a dielectric breakdown and may be 250 pm/V or more. Once the composition and manufacturing process are optimized, the magnitude of dynamic strain D33 may be further increased to be 300 pm/V or more, 350 pm/V or more, 400 pm/V or more, 450 pm/V or more, or 500 pm/V or more.

Moreover, the variation width in a displacement (=the variation width in a magnitude of dynamic strain) may be ±14% or less with the quotient of (a maximum value−a minimum value) by 2 as a reference value. Once the composition and manufacturing process are optimized, the variation width may be further decreased to be ±12% or less, ±10% or less, or ±8% or less.

Moreover, over a temperature range from −30° C. to 80° C., the variation width in a displacement (=the variation width in a magnitude of dynamic strain) occurring under such a driving condition that the amplitude of a driving voltage shall remain constant at the electric field strength of 100 V/mm or more may be ±14% or less with the quotient of (a maximum value−a minimum value) by 2 as a reference value. Furthermore, once the composition and manufacturing process are optimized, the variation width may be ±12% or less, ±9% or less, ±7% or less, ±5% or less, or ±4% or less. This results in an actuator whose displacement hardly depends on temperature when the displacement is derived from constant-voltage driving.

Moreover, in the piezoelectric actuator adopting the crystal-oriented piezoelectric ceramic as a drive source, the variation width in an apparent dynamic capacity observed under such a driving condition that the amplitude of a driving voltage shall remain constant at the electric field strength of 100 V/mm or more over a temperature range from −30° C. to 160° C. may be ±35% or less with the quotient of (a maximum value−a minimum value) by 2 as a reference value. Once the composition and manufacturing process are optimized, the variation width may be further decreased to be ±32% or less, ±30% or less, or ±28% or less.

Moreover, over a temperature range from −30° C. to 80° C., the variation width in an apparent dynamic capacity observed under such a driving condition that the amplitude of a driving voltage shall remain constant at the electric field strength of 100 V/mm or more may be ±11% or less with the quotient of (a maximum value–a minimum value) by 2 as a reference value. Once the composition and manufacturing process are optimized, the variation width may be further decreased to be ±9% or less, ±7% or less, ±5% or less, or ±4% or less. Consequently, when constant-charge driving or constant-energy driving is adopted, an actuator whose terminal voltage is little temperature-dependent ensues.

Moreover, in the piezoelectric actuator adopting the crystal-oriented piezoelectric ceramic as a drive source, over a temperature range from −30° C. to 160° C., the variation width in the quotient of a displacement by an apparent dynamic capacity observed under such a driving condition that the amplitude of a driving voltage remains constant at the electric field strength of 100 V/mm or more may be ±35% or less with the quotient of (a maximum value–a minimum value) by 2 as a reference value. Once the composition and manufacturing process are optimized, the variation width may be further decreased to be ±30% or less or ±25% or less.

Moreover, over a temperature range from −30° C. to 80° C., the variation width in the quotient of a displacement by an apparent dynamic capacity observed under such a driving condition that the amplitude of a driving voltage remains constant at the electric field strength of 100 V/mm or more may be ±12% or less with the quotient of (a maximum value–a minimum value) by 2 as a reference value. Once the composition and manufacturing process are optimized, the variation width may be further decreased to be ±9% or less or ±7% or less. This results in an actuator whose displacement hardly depends on temperature when the displacement is derived from constant-charge driving.

Moreover, in the piezoelectric actuator adopting the crystal-oriented piezoelectric ceramic as a drive source, over a temperature range from −30° C. to 160° C., the variation width in the quotient of a displacement by (an apparent dynamic capacity)$^{0.5}$ observed under such a driving condition that the amplitude of a driving voltage shall remain constant at the electric field strength of 100 V/mm or more may be ±20% or less with the quotient of (a maximum value–a minimum value) by 2 as a reference value. Once the composition and manufacturing process are optimized, the variation width may be further decreased to be ±15% or less.

Moreover, over a temperature range from −30° C. to 80° C., the variation width in the quotient of a displacement by (an apparent dynamic capacity)$^{0.5}$ observed under such a driving condition that the amplitude of a driving voltage shall remain constant at the electric field strength of 100 V/mm or more may be ±12% or less with the quotient of (a maximum value–a minimum value) by 2 as a reference value. Once the composition and manufacturing process are optimized, the variation width may be further decreased to be ±9% or less or ±7% or less. This results in an actuator whose displacement little depends on temperature when the displacement stems from constant-energy driving.

The piezoelectric actuator may have any displacement sources made of the crystal-oriented piezoelectric ceramic. As long as the displacement characteristic of a piezoelectric actuator is left unaffected, the piezoelectric ceramic represented by the general formula (I) and any other piezoelectric ceramic may be used in combination in order to construct a piezoelectric actuator. For example, assuming that a laminated actuator is manufactured, the crystal-oriented piezoelectric ceramic represented by the general formula (I) may be adopted to occupy 50% or more of a piezoelectric ceramic employed, and a barium titanate-system piezoelectric ceramic or the like may be adopted to occupy the remaining 50% or less thereof.

Next, an actuator having a piezoelectric ceramic member and a semiconductor element, which exhibits a positive temperature characteristic, connected in parallel with each other will be described below.

A piezoelectric actuator constructed using the piezoelectric ceramic exhibits an excellent temperature characteristic, because the variation widths in a displacement, an apparent dynamic capacity, the quotient of the displacement by the apparent dynamic capacity, and the quotient of the displacement by (the apparent dynamic capacity)$^{0.5}$, which are observed under such a driving condition that the amplitude of a driving voltage shall remain constant at the electric field strength of 100 V/mm or more, are small over a temperature range from −30° C. to 80° C. However, over a temperature range from −30° C. to 160° C., although the variation width in the displacement is small, the apparent dynamic capacity may increase slightly.

In efforts to investigate the cause, a leakage current component of the piezoelectric actuator was removed, and a dynamic capacity was measured. The dynamic capacity did not increase over a temperature domain of 80° C. and higher temperatures. In other words, in the piezoelectric ceramic, the leakage current drastically increases in the temperature domain of 80° C. and higher temperatures. This is because the specific resistance decreases on the order of two digits relative to the value attained at the temperature of 25° C. The specific resistance at the temperature of 25° C. is $10^{10}$ Ω·m or more.

In order to decrease the variation width in an apparent dynamic capacity observed over a temperature range from −30° C. to 160° C., a semiconductor element that exhibits a positive resistance temperature coefficient signifying that the resistance is small over a temperature domain of 80° C. and lower temperatures and is large over a temperature domain exceeding 80° C. is electrically connected in parallel with an actuator. Moreover, a positive temperature coefficient (PTC) resistor and a piezoelectric element are disposed so that the temperatures thereof will be substantially equal to each other. In this case, a large amount of current flows into the PTC resistor at temperatures equal to or lower than 80° C., but a current hardly flows into the PTC resistor at temperatures equal to or higher than 80° C. This leads to a decrease in the variation width in the apparent dynamic capacity of the actuator. Consequently, over the wide temperature range from −30° C. to 160° C., a terminal voltage of the piezoelectric actuator which stems from constant-charge driving or constant-energy driving little depends on temperature, and a displacement thereof little depends on temperature.

Preferably, the piezoelectric actuator includes a PTC resistor that exhibits a positive resistance temperature coefficient, has the PTC resistor and a piezoelectric ceramic member, which exhibits a negative resistance temperature coefficient, electrically connected in parallel with each other, and has the PTC resistor and piezoelectric ceramic member disposed to have a positional relationship causing the temperatures thereof to be substantially equal to each other (Claim 15).

Herein, the temperatures that are substantially equal to each other are the temperatures of the piezoelectric ceramic member (piezoelectric element) and PTC resistor respectively having a difference of 40° C. or less, preferably 30° C. or less, more preferably 20° C. or less, or more preferably 10° C. or less at the time of driving the piezoelectric actuator.

Moreover, the positional relationship is established in a case where the PTC resistor and piezoelectric ceramic member are disposed to be in contact with each other, a case where the PTC resistor is interposed between the lead terminals of the piezoelectric actuator, or a case where the PTC resistor is disposed in a connector that is a part independent of the piezoelectric actuator.

Moreover, the resistance temperature characteristic of the PTC resistor should preferably be identical to that of a barium titanate-system semiconductor element whose resistance abruptly increases at high temperature exceeding approximately 80° C. Namely, the PTC resistor should preferably be realized with the barium titanate-system semiconductor, and exhibit a positive resistance temperature coefficient over a temperature domain of 80° C. and higher temperatures (Claim 16).

In this case, the insulation of a PTC semiconductor at temperatures equal to or higher than 80° C. gets higher. Therefore, the leakage current flowing into a parallel circuit composed of an actuator and a PTC element may be reduced. A barium titanate-system semiconductor whose resistance abruptly increases at temperature equal to or higher than 80° C. does not contain lead that is an additive intended to shift the Curie temperature to higher temperature. Consequently, the actuator also does not contain lead. This is preferable.

Furthermore, when an actuator is of an airtight package type and a semiconductor element is encased in an airtight package, there is a concern about the fact that an insulating resin employed in the actuator may be thermally decomposed due to long-term use and oxygen in the airtight package may be consumed. Therefore, a reduction-resistant barium titanate-system semiconductor element whose resistance does not decrease even in a low-oxygen concentration atmosphere is preferred.

Moreover, when the resistance of a PTC resistor is low, a voltage to be applied to an actuator drops. Therefore, the resistance of the PTC resistor should preferably be much larger than the impedance which the piezoelectric actuator offers when being driven.

Moreover, a PTC resistor may or may not generate heat itself along with driving of a piezoelectric actuator. If the PTC resistor generates heat itself, it is disposed at a position where heat is readily conducted to a piezoelectric element. Thus, the PTC resistor is used as a temperature heater in order to raise the lower-limit working temperature of the actuator. In other words, the variation width in an apparent dynamic capacity of the actuator is substantially decreased by narrowing an operating temperature range. In particular, since a barium titanate-system semiconductor element works as a constant temperature heater whose resistance abruptly increases at the Curie temperature, it is suitable for the PTC resistor.

On the other hand, if the PTC resistor does not generate heat itself, an amount of current flowing into a parallel circuit composed of the actuator and the semiconductor element adopted as the PTC resistor gets smaller. An increase in the cost of the circuit can be suppressed.

Moreover, the piezoelectric actuator should preferably adopt, as the piezoelectric ceramic member, a laminated piezoelectric ceramic element having a plurality of sheets of piezoelectric ceramic stacked, and be used as a fuel injection valve (Claim 17).

In this case, the characteristics of the piezoelectric actuator can be exerted maximally.

Next, an example of the structure of a piezoelectric actuator in accordance with the present invention will be described in conjunction with FIG. 36.

Figure 36:
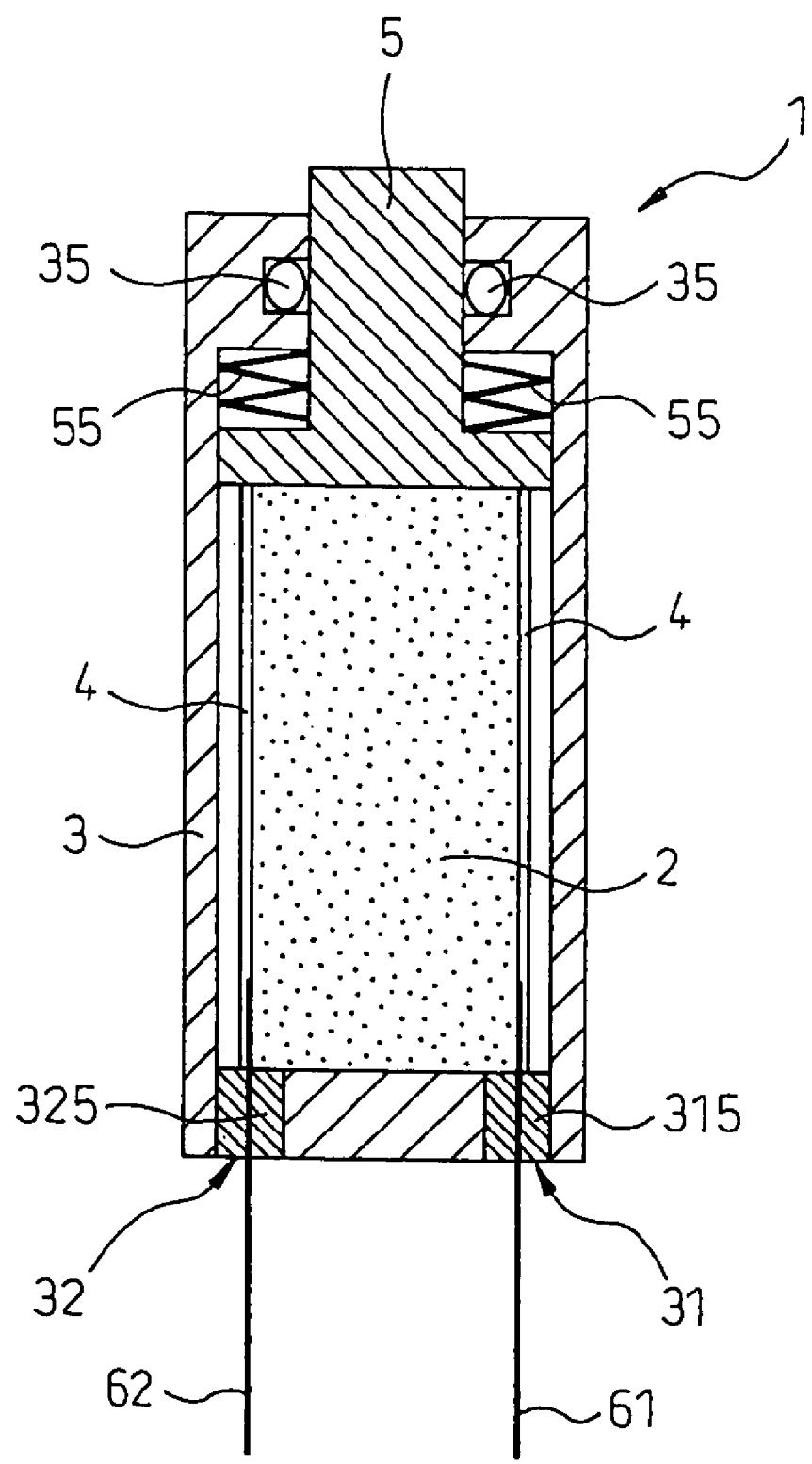
FIG. 36 is an explanatory diagram showing an example of the structure of a piezoelectric actuator in accordance with the present invention.

As shown in FIG. 36, a piezoelectric actuator 1 may be composed of, for example, a piezoelectric element 2 including a piezoelectric ceramic member, a holding member 4 that holds the piezoelectric element, a housing member 3 that accommodates the piezoelectric element and the like, and a conveying member 5 that conveys a displacement made by the piezoelectric element.

Figure 38:
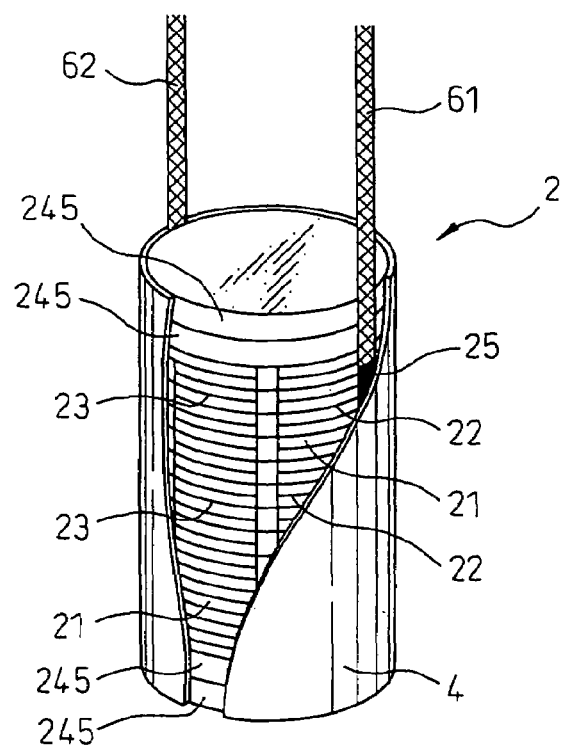
FIG. 38 is an explanatory diagram showing the structure of the piezoelectric actuator in accordance with Example 1.

As the piezoelectric element 2, a laminated piezoelectric element having, as shown in FIG. 38, multiple sheets of piezoelectric ceramic 21 and multiple internal electrodes 22 and 23 alternately stacked may be adopted.

As the piezoelectric element, a single piezoelectric element having one sheet of piezoelectric ceramic sandwiched between two internal electrodes may be adopted (not shown).

Moreover, a pair of external electrodes 25 and 26 is formed on the flanks of the piezoelectric element 2. Two adjoining internal electrodes 22 and 23 included in the piezoelectric element 2 are electrically connected to the different external electrodes 25 and 26 respectively.

As shown in FIG. 36, the conveying member 5 such as a piston is disposed at one end in a stacking direction of the piezoelectric element 2. A disk spring 55 is put in a space between the housing 3 and the conveying member 5, whereby a presetting load is imposed on the piezoelectric element 2. The conveying member 5 is movable along with a displacement of the piezoelectric element 2, and can thus convey the displacement to outside. Moreover, the housing 3 has through holes 31 and 32. Terminals (lead wires) 61 and 62 via which charge is supplied externally are inserted into the through holes 31 and 32 respectively. Grommets 31 and 32 are used to keep the inside of the housing 3 airtight. The terminals 61 and 62 are electrically connected to the external terminals 25 and 26 respectively formed on the piezoelectric element 2.

As shown in FIG. 36, an O ring 35 is put in a space between the piston member 5 and the housing 3 in order to keep the inside of the housing 3 airtight. Moreover, the ring 35 permits the piston member 5 to stretch or contract.

The piezoelectric actuator may be adapted to, for example, a fuel injection valve. Moreover, as the piezoelectric actuator, a laminated actuator, a piezoelectric transformer, an ultrasonic motor, a bimorph piezoelectric element, an ultrasonic sonar, a piezoelectric ultrasonic vibration element, a piezoelectric buzzer and a piezoelectric loudspeaker are available.

EXAMPLE 1

Next, examples of the present invention will be described below.

In the present example, a piezoelectric element including a piezoelectric ceramic member is produced, and used to produce a piezoelectric actuator.

Figure 37:
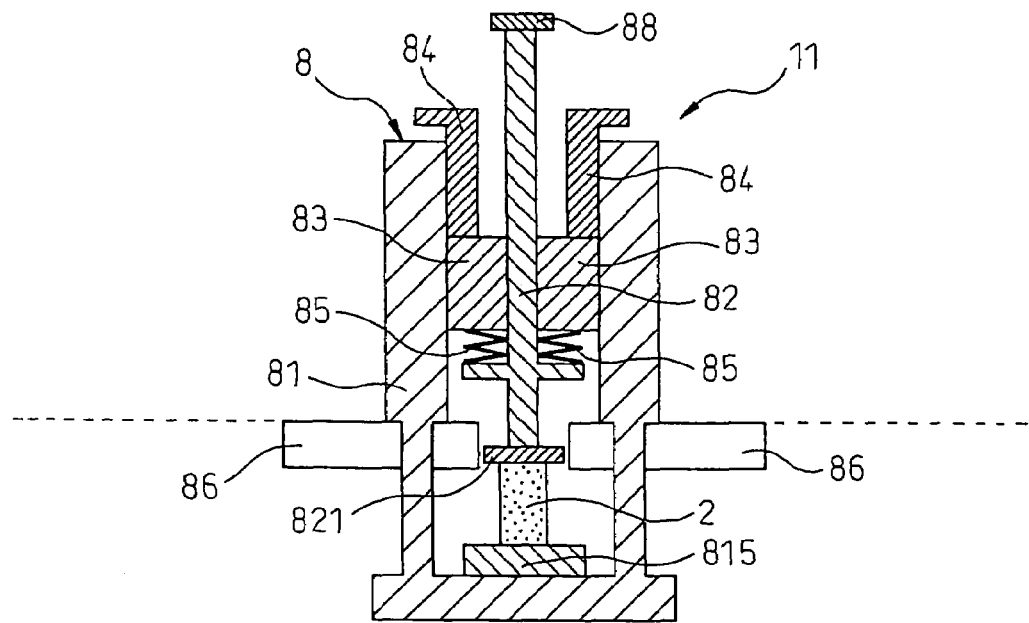
FIG. 37 is an explanatory diagram schematically showing the structure of the piezoelectric actuator in accordance with Example 1.

In the present example, a piezoelectric actuator 11 including a jig 8 is, as shown in FIG. 37, produced as a model of a piezoelectric actuator.

Specifically, the piezoelectric actuator 11 of the present example includes a laminated piezoelectric element 2 using a sheet of piezoelectric ceramic as a drive source, and has the piezoelectric element 2 locked in the jig 8.

The jig 8 includes a housing 81 that accommodates the piezoelectric element 2 and a piston (coupling member) 82 that is coupled to the piezoelectric element 2 and conveys a displacement made by the piezoelectric element 2. The piston 82 is coupled to a guide 83 via a disk spring 85. A pedestal portion 815 is formed in the housing 31, and the piezoelectric element 2 is placed on the pedestal portion 815. The piezoelectric element 2 placed on the pedestal portion 815 is secured by a head 821 of the piston 82. At this time, a presetting load may be imposed on the piezoelectric element 2 by the disk spring 85. Moreover, an end (measuring member 88)

of the piston 82 opposite to the head 821 thereof can be moved along with the displacement of the piezoelectric element 2.

Now, a method of applying a presetting load will be described below. The presetting load is imposed by inserting a cylindrical push rod (not shown) into a gap between the piston 82 and a push screw 84 and applying an accurate load to the guide 83 using an Amsler type testing machine. Thereafter, for sustainment of the presetting load, the push screw 84 and housing 81 are secured with the load applied. Thereafter, the push rod is removed.

In the present example, the reason why the model of a piezoelectric actuator is produced is to evaluate the temperature characteristic of a displacement made by the piezoelectric actuator. As the piezoelectric actuator is elongated, the piezoelectric element 2 can be put in a thermostatic chamber and the measuring member 88 can be disposed outside the thermostatic chamber (at the temperature of approximately 25° C.). For evaluation of the temperature characteristic that will be described later, the portion of the piezoelectric actuator 11 shown below a dashed line in FIG. 37 is put in the thermostatic chamber. A heat insulator 86 is attached to the piezoelectric actuator in order to prevent thermal transfer to the portion of the piezoelectric actuator 11, which is shown above the dashed line in the drawing, from occurring at the time of putting the lower portion thereof in the thermostatic chamber.

The foregoing piezoelectric actuator model is functionally equivalent to the piezoelectric actuator shown in FIG. 36.

Moreover, as shown in FIG. 38, in the present example, the piezoelectric element 2 is a laminated piezoelectric element having the sheets of piezoelectric ceramic 21 and the internal electrodes 22 and 23 alternately stacked. Moreover, an alumina plate 245 is disposed at both ends in a stacking direction of the piezoelectric element 2.

The two external electrodes 25 and 26 are formed on the flanks of the piezoelectric element 2 to sandwich the piezoelectric element. The external electrodes 25 and 26 are connected to the lead wires 61 and 62 respectively.

The internal electrodes 22 and 23 and the external electrodes 25 and 26 are electrically connected to one another so that each pair of adjoining internal electrodes 22 and 23 in the piezoelectric element 2 will be connected to the external electrodes 25 and 26 respective of mutually different potentials.

The piezoelectric element 2 of the present example has forty sheets of piezoelectric ceramic 21 stacked in total. For convenience, some sheets are not shown in FIG. 38.

Next, a method of manufacturing the piezoelectric actuator of the present example will be described below.

To begin with, a piezoelectric element is produced as described below.

(1) Preparing a Sodium Niobate ($NaNbO_3$) Plate-Like Powder

A dibismuth trioxide ($Bi_2O_3$) powder, a sodium carbonate ($Na_2CO_3$) powder, and a diniobium pentaoxide ($Nb_2O_5$) powder were weighed according to a composition expressed as $Bi_{2.5}Na_{3.5}Nb_5O_{18}$ using a stoichiometric ratio. The powders were then wet-blended. Thereafter, 50 weight percent of sodium chloride (NaCl) was added as a flux to the raw material, and the mixture was dry-blended for one hour.

Thereafter, the mixture was poured into a platinum crucible, and heated at 850° C. for one hour. After the flux was completely dissolved, the mixture was heated at 110° C. for two hours. Thus, a reactant expressed as $Bi_{2.5}Na_{3.5}Nb_5O_{18}$ was prepared. Incidentally, a rate of temperature rise was 200° C. per hour, and furnace cooling was adopted as a cooling method. After the completion of the cooling, the flux was removed by bathing the reactant in hot water. This results in a $Bi_{2.5}Na_{3.5}Nb_5O_{18}$ powder. The resultant $Bi_{2.5}Na_{3.5}Nb_5O_{18}$ powder is a plate-like powder having {001} planes as developed planes.

Thereafter, an amount of a sodium carbonate ($Na_2CO_3$) powder needed to prepare sodium niobate ($NaNbO_3$) was mixed in the $Bi_{2.5}Na_{3.5}Nb_5O_{18}$ plate-like powder. Sodium chloride (NaCl) was used as a flux, and the mixture was thermally treated in the platinum crucible at 950° C. for eight hours.

The resultant reactant contained dibismuth trioxide ($Bi_2O_3$) as well as the NaNbO3 powder. After the flux was removed from the reactant, the reactant was put in 1N nitric acid ($HNO_3$) in order to dissolve the $Bi_2O_3$ produced as a surplus component. Furthermore, the solution was filtered in order to dissociate the sodium niobate ($NaNbO_3$) powder, and the $NaNbO_3$ powder was cleansed with ion-exchanged water at 80° C. The resultant $NaNbO_3$ powder was a plate-like powder having pseudo-cubic {100} planes as developed planes, having a diameter that ranged from 10 μm to 30 μm, and having an aspect ratio that ranged from about 10 to about 20.

A crystal-oriented ceramic having the composition expressed as $\{Li_{0.07}(K_{0.43}Na_{0.57})_{0.93}\}\{Nb_{0.84}Ta_{0.09}Sb_{0.07}\}O_3$ was produced as described below.

A sodium carbonate ($Na_2CO_3$) powder, a potassium carbonate ($K_2CO_3$) powder, a lithium carbonate ($Li_2CO_3$) powder, a diniobium pentaoxide ($Nb_2O_5$) powder, a ditantalum pentaoxide ($Ta_2O_5$) powder, and a diantimony pentaoxide ($Sb_2O_5$) powder that have the purity of 99.99% or more were weighed according to the stoichiometric composition expressed as $\{Li_{0.07}(K_{0.43}Na_{0.57})_{0.93}\}\{Nb_{0.84}Ta_{0.09}Sb_{0.07}\}O_3$ in order to prepare one mol of the mixture devoid of 0.05 mol of sodium niobate ($NaNbO_3$). Using an organic solvent as a medium, the mixture was wet-blended in a zirconium (Zr) bowl for twenty hours. Thereafter, the mixture was calcined at 750° C. for five hours. Using an organic solvent as a medium, the mixture was wet-pulverized in the Zr bowl for twenty hours. This resulted in a calcined powder whose mean diameter was approximately 0.5 μm.

In order to realize the composition $\{Li_{0.07}(K_{0.43}Na_{0.57})_{0.93}\}\{Nb_{0.84}Ta_{0.09}Sb_{0.07}\}O_3$, the calcined powder and the plate-like sodium niobate ($NaNbO_3$) were weighed so that the ratio of the calcined power to $NaNbO_3$ would be 0.95 mol to 0.05 mol. Using an organic solvent as a medium, the mixture was wet-blended in the zirconium (Zr) bowl for twenty hours. This resulted in pulverized slurry. Thereafter, a binder (polyvinyl butyral) and a plasticizer (dibutyl phthalate) were added to the slurry, and the slurry was blended for two hours.

Thereafter, a tape molding equipment was used to mold the blended slurry into a tape approximately 100 μm thick. Furthermore, the tape was stacked, contact-bonded, and rolled. This resulted in a plate-like compact 1.5 mm thick. Thereafter, the plate-like compact was degreased in air under such conditions that the heating temperature should be 600° C., the heating time should be five hours, the rate of temperature rise should be 50° C. per hour, and the cooling rate should be a furnace cooling rate. Furthermore, the degreased plate-like compact was molded according to the cold isostatic press (CIP) method under the pressure of 300 MPa, and then sintered in oxygen at 1110° C. for five hours. Thus, a piezoelectric ceramic (crystal-oriented piezoelectric ceramic) was produced.

The sintered-compact density of the produced piezoelectric ceramic was calculated, and the average orientation degree F. (100) of pseudo-cubic {100} planes parallel to the tape surface was calculated according to the Lotgering's method expressed by the aforesaid equation (I).

Figure 39:
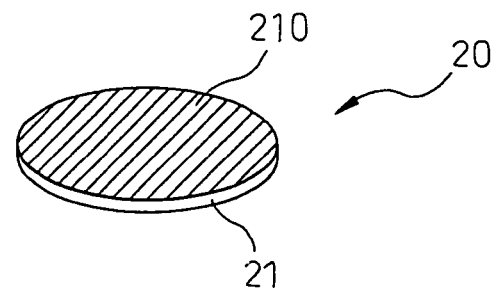
FIG. 39 is an explanatory diagram showing a piezoelectric element (a single sheet) made of a sheet of piezoelectric ceramic.

Furthermore, the produced piezoelectric ceramic was ground, polished, and machined in order to produce a sheet of piezoelectric ceramic 21 that was, as shown in FIG. 39, a disk-like sample of 0.485 mm thick and 11 mm in diameter whose upper and lower surfaces are parallel to the tape surface. A gold (Au) baking electrode paste (ALP 3057 by Sumitomo Metal Mining Co., Ltd.) was printed on the upper and lower surfaces of the sample, and then dried up. Thereafter, a meshed belt sintering furnace was used to bake the sample at 850° C. for ten min. Thus, an electrode 210 of 0.01 mm thick was formed on the sheet of piezoelectric ceramic 21. Furthermore, the disk-like sample was machined to have a diameter 8.5 mm by performing cylindrical grinding. This was intended to remove a boss of several micrometers in size which was inevitably formed on the perimeter of the electrode through printing. Thereafter, the sample was polarized vertically. This resulted in a piezoelectric element (a single sheet) 20 having a whole-surface electrode 210 formed on the sheet of piezoelectric ceramic 21.

The piezoelectric properties of the piezoelectric element 20, that is, a piezoelectric strain constant ($d_{31}$), an electromechanical coupling coefficient (kp), a mechanical quality coefficient (Qm), a relative dielectric constant ($\epsilon_{33}{}^t/\epsilon_0$) that was a dielectric property, and a dielectric loss (tan δ) were measured at the temperature of 25° C. according to a resonance anti-resonance method.

Moreover, the first crystal phase transition temperature (Curie temperature) and second crystal phase transition temperature were obtained by measuring the temperature characteristic of the relative dielectric constant. Incidentally, when the second crystal phase transition temperature was equal to or lower than 0° C., the variation width in the relative dielectric constant observed at the temperatures higher than the second crystal phase transition temperature was very small. Therefore, if the peak position of the relative dielectric constant could not be identified, the temperature causing the relative dielectric constant to abruptly change was regarded as the second crystal phase transition temperature.

Thereafter, the produced piezoelectric element was used to produce a laminated piezoelectric element, and the laminated piezoelectric element was used to construct a piezoelectric actuator. The piezoelectric actuator was then evaluated.

Figure 40:
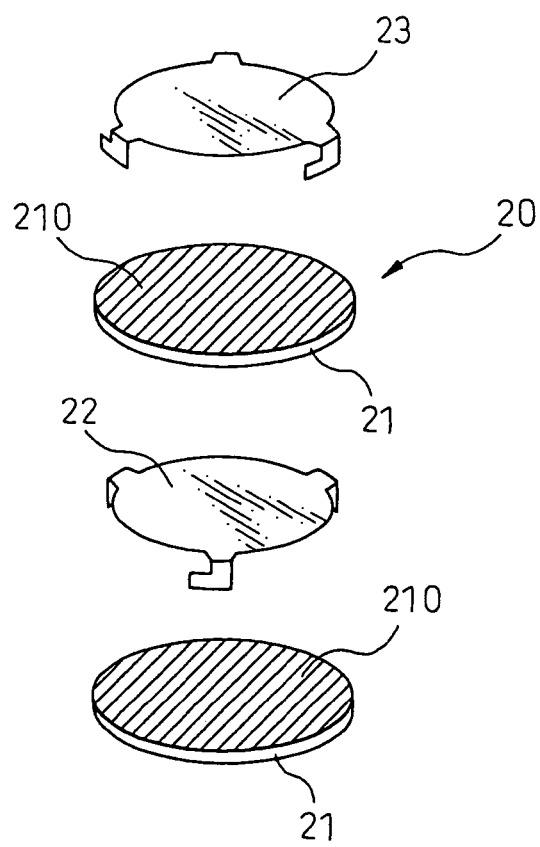
FIG. 40 is an explanatory diagram showing how to stack the piezoelectric elements (single sheets) and internal electrode plates according to Example 1.

As shown in FIG. 40, the aforesaid piezoelectric element 20 and an internal electrode plate 22 (23) that is made of stainless steel (SUS), has a thickness of 0.02 mm and a diameter of 8.4 mm, and includes projections via which the internal electrode plate is connected to an external electrode, which will be described later, were alternately stacked. At this time, the internal electrode plate 22 (23) was disposed so that the projections thereof would be extended in a stacking direction from alternately different positions and would be aligned with those of every other layer. Thus, forty sheets of piezoelectric ceramic 21 and forty-one internal electrode plates 22 (23) were alternately stacked one another. An alumina plate (insulating plate) of 2 mm thick and 8.5 mm in diameter was stacked on the upper and lower surfaces of the laminated body, whereby the laminated piezoelectric element 2 was produced as shown in FIG. 38.

Thereafter, strip-shaped external electrodes 25 and 26 made of stainless steel (SUS) were welded to the projections of the internal electrode plates 22 and 23 so that the piezoelectric element would be electrically connected in parallel to the external electrodes. Furthermore, lead terminals 61 and 62 were procured and electrically connected to the external electrodes 25 and 26 respectively.

Moreover, a comb-like insulating resin member (not shown) was inserted to gaps, which are created by the identical electrode plates and opened on the flanks of the stacked body, in order to ensure the isolation among the projections of the internal electrode plates 22 and 23, the internal electrode plates 22 and 23 of opposite polarities, and the gold (Au) electrodes of opposite polarities on the respective piezoelectric element. A silicone grease was applied to the laminated body, and the laminated body was then sheathed with a holding member 4 realized with an insulating tube. This resulted in the laminated piezoelectric element 2.

Thereafter, a compressive stress of 150 MPa was applied to the laminated piezoelectric element 2 in the stacking direction at the temperature of 25° C. for thirty seconds for the purpose of improving the adhesion among the gold (Au) electrodes included in the laminated piezoelectric element 2 and the electrode plates included therein (pressurized aging). Furthermore, while a compressive stress of 30 Mpa was applied in the stacking direction at the temperature of 25° C., a sine wave having an amplitude in electric field strength of 1500 V/mm from zero was applied at a frequency of 40 Hz for thirty minutes (voltage aging). Thereafter, as shown in FIG. 37, the laminated piezoelectric element 2 was locked in a jig 8. A disk spring 85 whose spring constant was 2.9 N/μm was pressure-welded in the stacking direction of the piezoelectric element 2 with a presetting load of 16.4 MPa imposed. Thus, a piezoelectric actuator 11 was completed as shown in FIG. 37.

Thereafter, the piezoelectric actuator was driven with an applied voltage that changes from 485 V through 728 V to 970 V because it is a trapezoidal wave of a constant amplitude (in electric field strength of 1000 V/mm from zero, 1500 V/mm from zero, or 2000 V/mm from zero). The temperature dependencies of a displacement and an apparent dynamic capacity were measured over a temperature range from −40° C. to 160° C.

For the measurement of the displacement, an electrostatic capacity type displacement sensor was used to measure a displacement under such driving conditions that a driving voltage of a trapezoidal wave should have frequencies of 0.5 Hz and 10 Hz, require a voltage rise time of 150 μs, require a voltage fall time of 150 μs, and exhibit a duty ratio of 50 to 50.

For the measurement of the apparent dynamic capacity, a capacitor whose capacitance was 878 μF was connected in series with the piezoelectric actuator so that the temperature would be held at 25° C. all the time. A terminal voltage of the capacitor was measured under such driving conditions that an applied voltage of a trapezoidal wave should vary from 485 V through 728 V to 970 V, have a frequency of 0.05 Hz, require a voltage rise time of 1 ms, require a voltage fall time of 1 ms, require a voltage on time of 10 sec, and require a voltage off time of 10 sec. The apparent dynamic capacity was then calculated according to the following equation (11):

Apparent dynamic capacity={(V(on)−V(off))× 878 μF}/{applied voltage−(V(on)−V(off))}  (11)

where the unit of the apparent dynamic electrostatic capacity is farad (F), the unit of the applied voltage is volt (V), V(on) denotes a terminal voltage (V) of a capacitor observed in 10 sec after application of a voltage is initiated (voltage on), and V(off) denotes the terminal voltage (V) of the capacitor observed in 10 sec after the application of the voltage is ceased (voltage off).

Specifically, the charge (=the sum of charge accumulated in the actuator and leakage charge) accumulated in the capacitor was calculated based on the terminal voltage of the capacitor, and then divided by the applied voltage of the actuator. The quotient was regarded as the apparent dynamic capacity of the actuator. When the actuator was connected in series with the capacitor, the voltage applied to the actuator decreased. However, as a maximum decrease was as small as 0.3 V, the applied voltage and the voltage actually applied to the actuator were considered to be identical to each other.

The measured value was used to calculate the variation width occurring over a temperature range from −30° C. to 80° C. and the variation width occurring over a temperature range from −30° C. to 160° C. Herein, what is referred to as the variation width was defined as a value calculated using the quotient of (a maximum value−a minimum value) by 2 as a reference value.

The relative density of the crystal-oriented ceramic produced in the present example was 95% or more. Moreover, the pseudo-cubic {100} planes were oriented in parallel to the tape surface, and the average orientation degree of the pseudo-cubic {100} planes calculated according to the Lotgering's method reached 88.5%. Furthermore, the results of evaluation of the piezoelectric properties at the temperature of 25° C. signified that the piezoelectric constant $d_{31}$ was 86.5 pm/V, the electromechanical coupling coefficient kp was 48.8%, the mechanical quality coefficient Qm was 18.2, the relative dielectric constant $\in_{33}^t/\in_0$ was 1042, and the dielectric loss tan δ was 6.4%. Moreover, the first crystal phase transition temperature (Curie temperature) calculated based on the temperature characteristic of the relative dielectric constant was 282° C., and the second crystal phase transition temperature was −30° C.

Next, the characteristics of the piezoelectric actuator of the present example will be described below.

Figure 2:
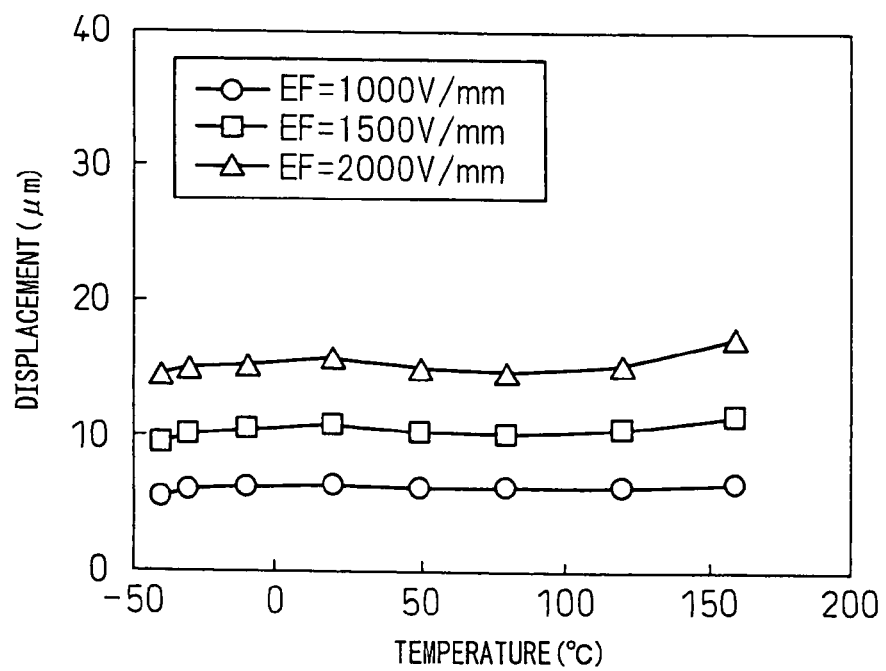
FIG. 2 is a graph showing the temperature dependency of a displacement made by the piezoelectric actuator in accordance with Example 1.
Figure 3:
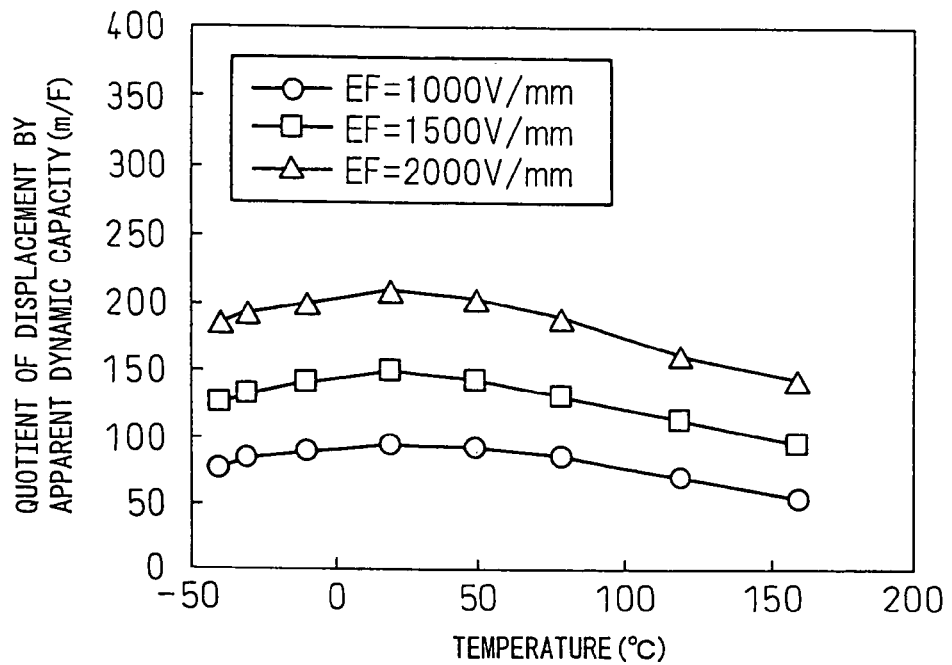
FIG. 3 is a graph showing the temperature dependency of the quotient of the displacement by the apparent dynamic capacity of the piezoelectric actuator in accordance with Example 1.

FIG. 1, FIG. 2, and FIG. 3 show the measured apparent dynamic capacity, the measured displacement at the frequency of 0.5 Hz, the calculated quotient of the displacement by the apparent dynamic capacity, the calculated quotient of the displacement by (the apparent dynamic capacity)$^{0.5}$, and the calculated magnitude of dynamic strain D33.

Moreover, Table 12, Table 13, Table 14, and Table 15 list the widths of variations in the apparent dynamic capacity, the displacement at the frequency of 0.5 Hz, the quotient of the displacement by the apparent dynamic capacity, and the quotient of the displacement by (the apparent dynamic capacity)$^{0.5}$ respectively over a temperature range from −30° C. to 80° C., and the widths of variations therein over a temperature range from −30° C. to 160° C.

As seen from Table 1, FIG. 1, FIG. 2, FIG. 3, Table 11, Table 12, Table 13, and Table 14, the minimum value of the magnitude of dynamic strain D33 and the widths of variations in the foregoing properties which are observed in the piezoelectric actuator of the present example over the temperature range from −30° C. to 80° C. are understood as summarized below.

When the amplitude in electric field strength of a driving voltage is 1000 V/mm and the temperature is −30° C., the magnitude of dynamic strain D33 marks the minimum value or is 303 pm/V.

When the amplitude in electric field strength of a driving voltage is 1500 V/mm, the variation width in a displacement marks the maximum value or is ±3.8%.

When the amplitude in electric field strength of a driving voltage is 1000 V/mm, the variation width in an apparent dynamic capacity marks the maximum value or is ±3.2%.

When the amplitude in electric field strength of a driving voltage is 1500 V/mm, the variation width in the quotient of the displacement by the apparent dynamic capacity marks the maximum value or is ±6.9%.

When the amplitude in electric field strength of a driving voltage is 1500 V/mm, the variation width in the quotient of the displacement by (the apparent dynamic capacity)$^{0.5}$ marks the maximum value or is ±5.3%.

Moreover, the minimum value of the magnitude of dynamic strain D33 and the widths of variations in the foregoing properties which are observed over the temperature range from −30° C. to 160° C. are understood as summarized below.

When the amplitude in electric field strength of a driving voltage is 1000 V/mm and the temperature is −30° C., the magnitude of dynamic strain D33 marks the minimum value or is 303 pm/V.

When the amplitude in electric field strength of a driving voltage is 2000 V/mm, the variation width in a displacement marks the maximum value or is ±7.7%.

When the amplitude in electric field strength of a driving voltage is 1000 V/mm, the variation width in an dynamic capacity marks the maximum value or is ±28.9%.

When the amplitude in electric field strength of a driving voltage is 1000 V/mm, the variation width in the quotient of the displacement by the apparent dynamic capacity marks the maximum value or is ±27.8%.

When the amplitude in electric field strength of a driving voltage is 1000 V/mm, the variation width in the quotient of the displacement by (the apparent dynamic capacity)$^{0.5}$ marks the maximum value or is ±13.8%.

EXAMPLE 2

A crystal-oriented ceramic having the composition of $\{Li_{0.07}(K_{0.45}Na_{0.55})_{0.93}\}\{Nb_{0.82}Ta_{0.10}Sb_{0.08}\}O_3$ was produced according to the same procedure as the one employed in Example 1 except that the firing temperature for a degreased plate-like compact was set to 1105° C. The produced crystal-oriented ceramic was evaluated in terms of the density of a sintered compact, an average orientation degree, and piezoelectric properties under the same conditions as those defined in Example 1. Moreover, a laminated actuator including forty sheets of piezoelectric ceramic was produced according to the same procedure as that employed in Example 1, and the characteristics of the actuator were evaluated.

The relative density of the crystal-oriented ceramic produced in the present example was 95% or more. Moreover, the pseudo-cubic {100} planes were oriented in parallel to the tape surface. The average orientation degree of the pseudo-cubic {100} planes calculated according to the Lotgering's method reached 94.6%. Furthermore, the results of the evaluation of the piezoelectric properties at the temperature of 25° C. were such that the piezoelectric $d_{31}$ constant was 88.1 pm/V, the electromechanical coupling coefficient kp was 48.9%, the mechanical quality coefficient Qm was 16.6, the relative dielectric constant $\in_{33}^t/\in_0$ was 1071, and the dielectric loss tan δ was 4.7%. Moreover, the first crystal phase transition temperature (Curie temperature) obtained based on the temperature characteristic of the relative dielectric constant was 256° C., and the second crystal phase transition temperature was −35° C.

Figure 4:
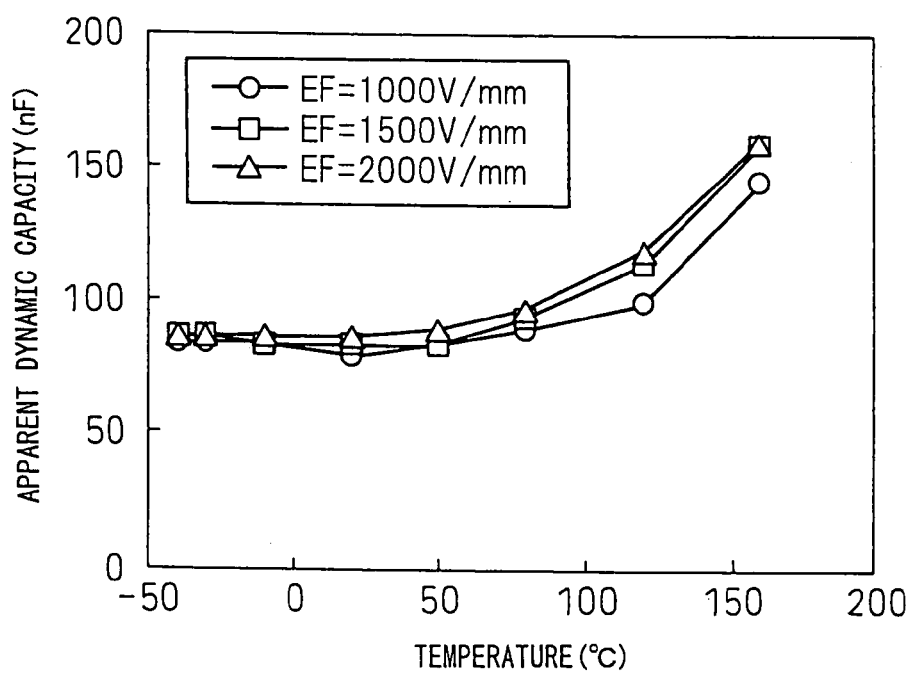
FIG. 4 is a graph showing the temperature dependency of an apparent dynamic capacity of a piezoelectric actuator in accordance with Example 2.
Figure 5:
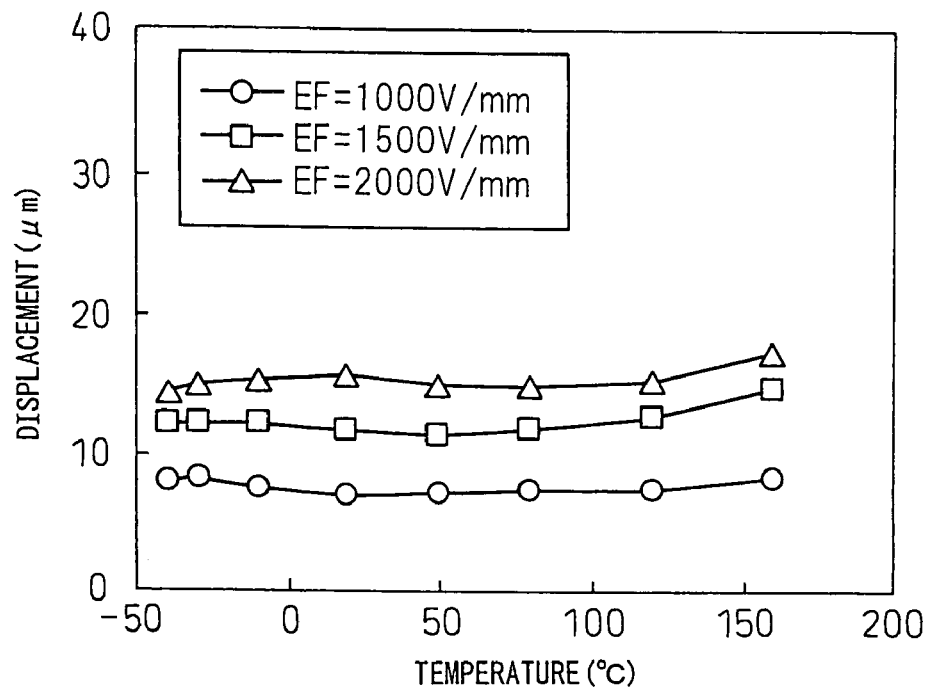
FIG. 5 is a graph showing the temperature dependency of a displacement made by the piezoelectric actuator in accordance with Example 2.
Figure 6:
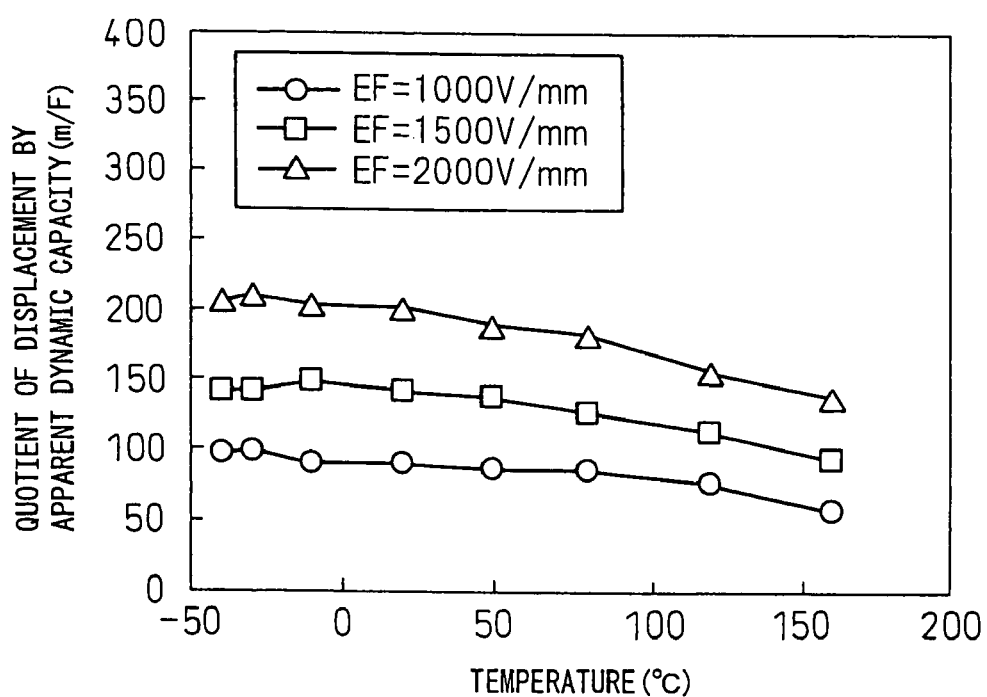
FIG. 6 is a graph showing the temperature dependency of the quotient of the displacement by the apparent dynamic capacity of the piezoelectric actuator in accordance with Example 2.

Table 2, FIG. 4, FIG. 5, FIG. 6, Table 11, Table 12, Table 13, and Table 14 present the characteristics of the piezoelectric actuator of the present example.

As seen from the tables and drawings, the minimum value of the magnitude of dynamic strain D33 and the widths of variations in the above properties which are observed in the piezoelectric actuator of the present example over a temperature range from −30° C. to 80° C. are understood as summarized below.

When the amplitude in electric field strength of a driving voltage is 1000 V/mm and the temperature is 20° C., the magnitude of dynamic strain D33 marks the minimum value or is 355 pm/V.

When the amplitude in electric field strength of a driving voltage is 1000 V/mm, the variation width in a displacement marks the maximum value or is ±8.0%.

When the amplitude in electric field strength of a driving voltage is 1000 V/mm, the variation width in an apparent dynamic capacity marks the maximum value or was ±6.3%.

When the amplitude in electric field strength of a driving voltage is 500 V/mm or 1000 V/mm, the variation width in the quotient of the displacement by the apparent dynamic capacity marks the maximum value or is ±7.8%.

When the amplitude in electric field strength of a driving voltage is 1000 V/mm, the variation width in the quotient of the displacement by (the apparent dynamic capacity)$^{0.5}$ marks the maximum value or is ±6.7%.

Moreover, the minimum value of the magnitude of dynamic strain D33 and the widths of variations in the aforesaid properties which are observed over a temperature range from −30° C. to 160° C. are as summarized below.

When the amplitude in electric field strength of a driving voltage is 1000 V/mm and the temperature is 20° C., the magnitude of dynamic strain D33 marks the minimum value or is 355 pm/V.

When the amplitude in electric field strength of a driving voltage is 2000 V/mm, the variation width in a displacement marks the maximum value or is ±13.8%.

When the amplitude in electric field strength of a driving voltage is 1500 V/mm, the variation width in an apparent dynamic capacity marks the maximum value or is ±31.4%.

When the amplitude in electric field strength of a driving voltage is 1000 V/mm, the variation width in the quotient of the displacement by the apparent dynamic capacity marks the maximum value or is ±26.8%.

When the amplitude in electric field strength of a driving voltage is 1000 V/mm, the variation width in the quotient of the displacement by (the apparent dynamic capacity)$^{0.5}$ marks the maximum value or is ±13.3%.

EXAMPLE 3

A crystal-oriented ceramic having the composition of {Li$_{0.065}$(K$_{0.45}$Na$_{0.55}$)$_{0.935}$}{Nb$_{0.83}$Ta$_{0.09}$Sb$_{0.08}$}O$_3$ was produced according to the same procedure as the one employed in Example 1 except that the firing temperature for a degreased plate-like compact was set to 1105° C. The produced crystal-oriented ceramic was evaluated in terms of the density of a sintered body, an average orientation degree, and piezoelectric properties under the same conditions as those specified in Example 1. Moreover, a laminated actuator including forty sheets of piezoelectric ceramic was produced according to the same procedure as that employed in Example 1, and the characteristics of the actuator were evaluated.

The relative density of the crystal-oriented ceramic of the present example was 95% or more. Moreover, the pseudo-cubic {100} planes were oriented in parallel with the tape surface, and the average orientation degree of the pseudo-cubic {100} planes calculated according to the Lotgering's method reached 93.9%. Furthermore, the results of evaluation of the piezoelectric properties at the temperature of 25° C. were such that the piezoelectric d$_{31}$ constant was 95.2 pm/V, the electromechanical coupling coefficient kp was 50.4%, the mechanical quality coefficient Qm was 15.9, the relative dielectric constant ∈$_{33}^t$/∈$_0$ was 1155, and the dielectric loss tan δ was 5.2%. Moreover, the first crystal phase transition temperature (Curie temperature) obtained based on the temperature characteristic of the relative dielectric constant was 261° C., and the second crystal phase transition temperature was −12° C.

Figure 7:
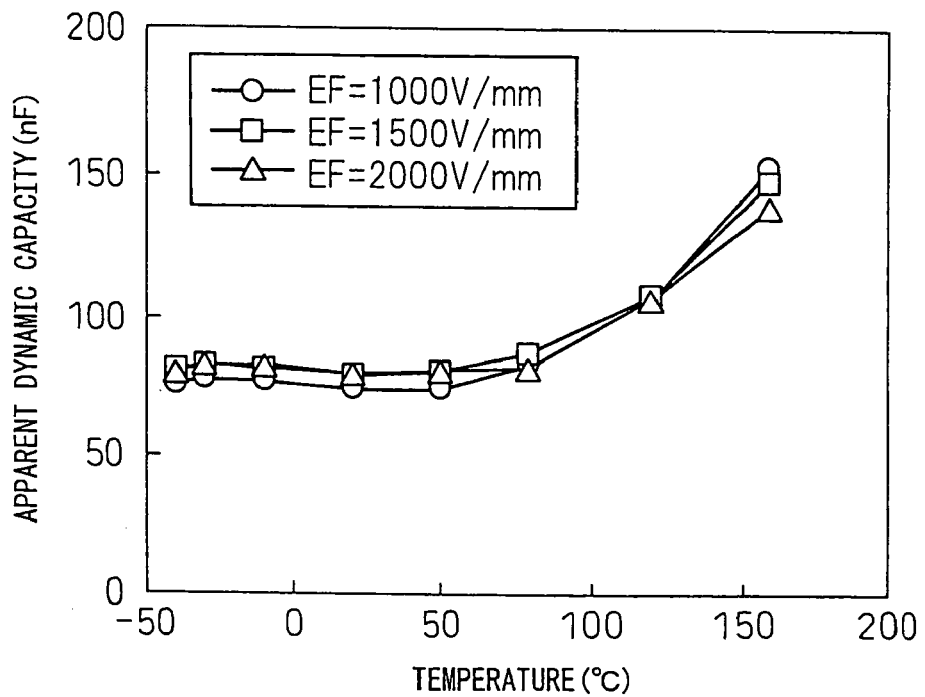
FIG. 7 is a graph showing the temperature dependency of an apparent dynamic capacity of a piezoelectric actuator in accordance with Example 3.
Figure 8:
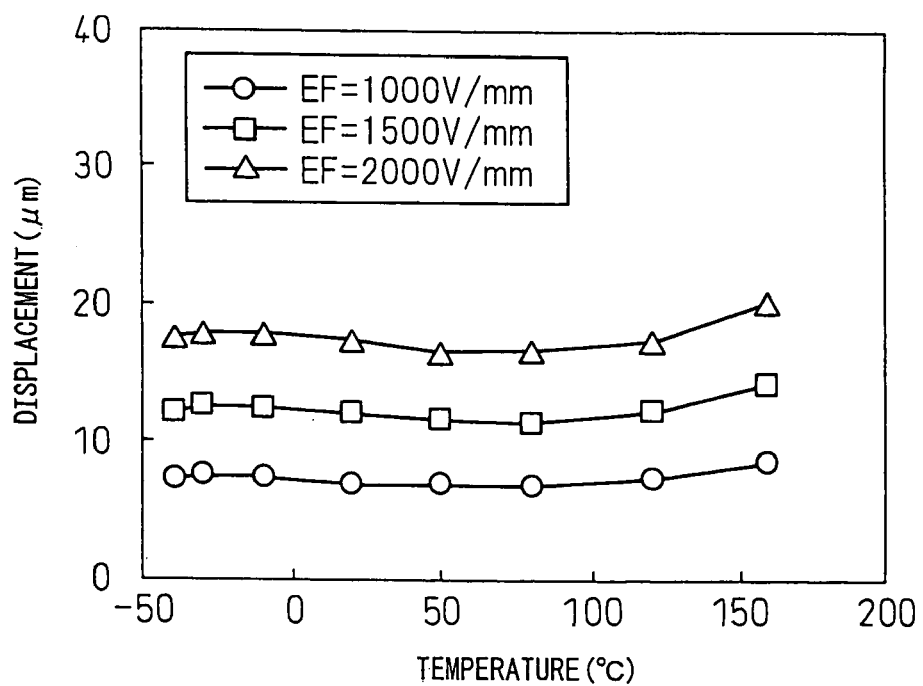
FIG. 8 is a graph showing the temperature dependency of a displacement made by the piezoelectric actuator in accordance with Example 3.
Figure 9:
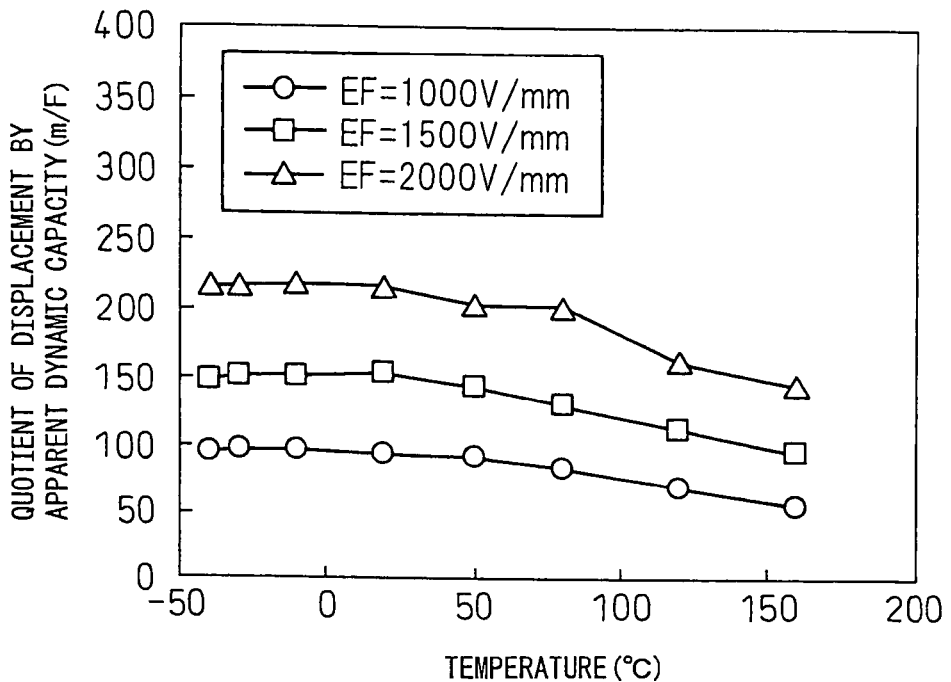
FIG. 9 is a graph showing the temperature dependency of the quotient of the displacement by the apparent dynamic capacity of the piezoelectric actuator in accordance with Example 3.

Table 3, FIG. 7, FIG. 8, FIG. 9, Table 11, Table 12, Table 13, and Table 14 present the characteristics of the piezoelectric actuator of the present example.

As seen from these tables and drawings, the minimum value of the magnitude of dynamic strain D33 and the widths of variations in the properties which are observed in the piezoelectric actuator of the present example over a temperature range from −30° C. to 80° C. are understood as summarized below.

When the amplitude in electric field strength of a driving voltage is 1000 V/mm and the temperature is 80° C., the magnitude of dynamic strain D33 marks the minimum value or is 347 pm/V.

When the amplitude in electric field strength of a driving voltage is 1500 V/mm, the variation width in the displacement marks the maximum value or is ±5.6%.

When the amplitude in electric field strength of a driving voltage is 1000 V/mm, the variation width in an apparent dynamic capacity marks the maximum value or is ±5.2%.

When the amplitude in electric field strength of a driving voltage is 1500 V/mm, the variation width in the quotient of the displacement by the apparent dynamic capacity marks the maximum value or is ±8.6%.

When the amplitude in electric field strength of a driving voltage is 1500 V/mm, the variation width in the quotient of the displacement by (the apparent dynamic capacity)$^{0.5}$ marks the maximum value or is ±6.9%.

Moreover, the minimum value of the magnitude of dynamic strain D33 and the widths of variations in the aforesaid properties which are observed over a temperature range from −30° C. to 160° C. are as summarized below.

When the amplitude in electric field strength of a driving voltage is 1000 V/mm and the temperature is 80° C., the magnitude of dynamic strain D33 marks the minimum value or is 347 pm/V.

When the amplitude in electric field strength of a driving voltage is 1500 V/mm, the variation width in a displacement marks the maximum value or is ±11.5%.

When the amplitude in electric field strength of a driving voltage is 1000 V/mm, the variation width in an apparent dynamic capacity marks the maximum value or is ±34.6%.

When the amplitude in electric field strength of a driving voltage is 1000 V/mm, the variation width in the quotient of the displacement by the apparent dynamic capacity marks the maximum value or is ±27.1%.

When the amplitude in electric field strength of a driving voltage is 1000 V/mm, the variation width in the quotient of the displacement by (the apparent dynamic capacity)$^{0.5}$ marks the maximum value or is ±10.9%.

EXAMPLE 4

In the present example, a crystal-oriented piezoelectric ceramic having the same composition as Example 1 was produced according to a procedure different from the one for Example 1. The crystal-oriented piezoelectric ceramic was used to produce a piezoelectric actuator.

Specifically, the plate-like sodium niobate (NaNbO$_3$) powder prepared in Example 1, a non-plate-like NaNbO$_3$ powder, a potassium niobate (KNbO$_3$) powder, a potassium tantalite (KTaO$_3$) powder, a lithium antimonite (LiSbO$_3$) powder, and a sodium antimonite (NaSbO$_3$) powder were weighed according to the composition of $\{Li_{0.07}(K_{0.43}Na_{0.57})_{0.93}\}\{Nb_{0.84}Ta_{0.09}Sb_{0.07}\}O_3$. Using an organic solvent as a medium, the powders were wet-blended for twenty hours.

After a binder (polyvinyl butyral) and a plasticizer (dibutyl phthalate) were added to the slurry, the resultant slurry was blended for two more hours.

Incidentally, the proportion of the sodium niobate (NaNbO$_3$) plate-like powder was determined so that 5 weight percent of an A-site element that was the first KNN-system solid solution (ABO$_3$) to be prepared from starting materials could be supplied from the NaNbO$_3$ plate-like powder. Moreover, the non-plate-like NaNaO$_3$ powder, KNbO$_3$ powder, KTaO$_3$ powder, LiSbO$_3$ powder and NaSbO$_3$ powder were produced according to a solid phase method. Namely, a mixture that contains predetermined amounts of a potassium carbonate (K$_2$CO$_3$) powder, a sodium carbonate (Na$_2$CO$_3$) powder, a diniobium pentaoxide (Nb$_2$O$_5$) powder, a ditantalum pentaoxide (Ta$_2$O$_5$) powder, and/or a diantimony pentaoxide (Sb$_2$O$_5$) powder, which have a purity of 99.9%, was heated at 750° C. for five hours. The reactant was then pulverized using a ball mill.

Thereafter, a tape molding equipment was used to mold the blended slurry into a tape having a thickness of approximately 100 μm. Furthermore, the tape was stacked, contact-bonded, and rolled in order to produce a plate-like compact having a thickness of 1.5 mm. Thereafter, the plate-like compact was degreased in air under such conditions that the heating temperature was 600° C., the heating time was five hours, the rate of temperature rise was 50° C. per hour, and the cooling rate was a rate of furnace cooling. Furthermore, the degreased plate-like compact was molded according to the cold isostatic press (CIP) method under a pressure of 300 MPa. Thereafter, the plate-like compact was sintered using a hot press, which applied a pressure of 35 kg/cm$^2$ (3.42 MPa) during heating, under such conditions that the firing temperature was 1130° C., the heating time was five hours, and the rate of temperature rise or drop was 200° C. per hour. Thus, a piezoelectric ceramic (crystal-oriented piezoelectric ceramic) was produced.

The relative density of the crystal-oriented ceramic produced in the present example was 95% or more. Moreover, the pseudo-cubic {100} planes were oriented in parallel to the tape surface. The average orientation degree of the pseudo-cubic {100} planes calculated according to the Lotgering's method reached 96%. Furthermore, the results of evaluation of the piezoelectric properties at the temperature of 25° C. were such that the piezoelectric $d_{31}$ constant was 96.5 pm/V, the electromechanical coupling coefficient kp was 51.9%, the mechanical quality coefficient Qm was 15.2, the relative dielectric constant $\in_{33}{}^T/\in_0$ was 1079, and the dielectric loss tan δ was 4.7%. Moreover, the first crystal phase transition temperature (Curie temperature) obtained based on the temperature characteristic of the relative dielectric constant was 279° C., and the second crystal phase transition temperature was −28° C.

Figure 10:
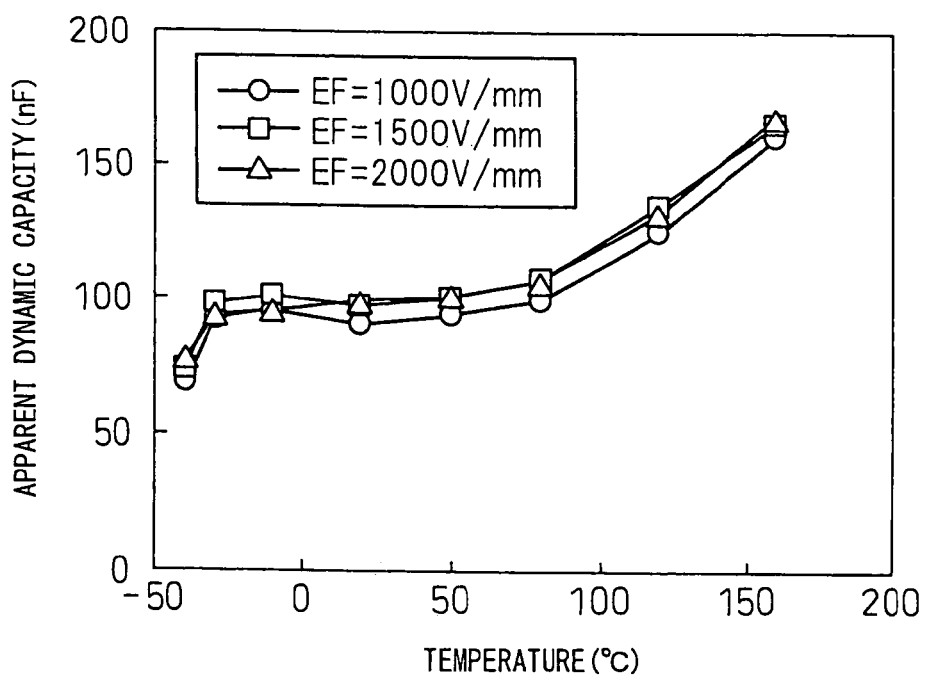
FIG. 10 is a graph showing the temperature dependency of an apparent dynamic capacity of a piezoelectric actuator in accordance with Example 4.
Figure 11:
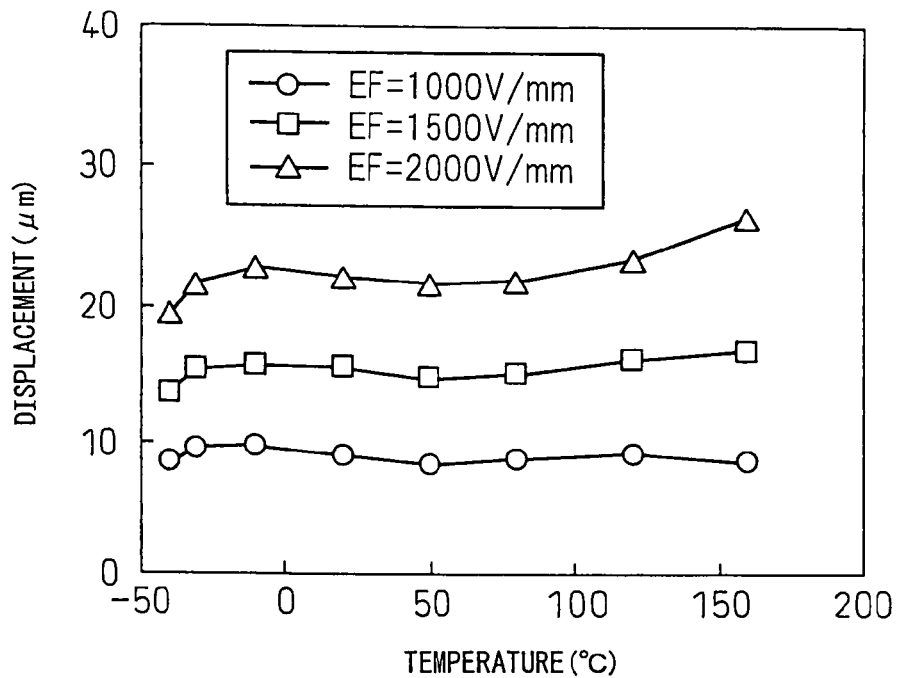
FIG. 11 is a graph showing the temperature dependency of a displacement of the piezoelectric actuator in accordance with Example 4.
Figure 12:
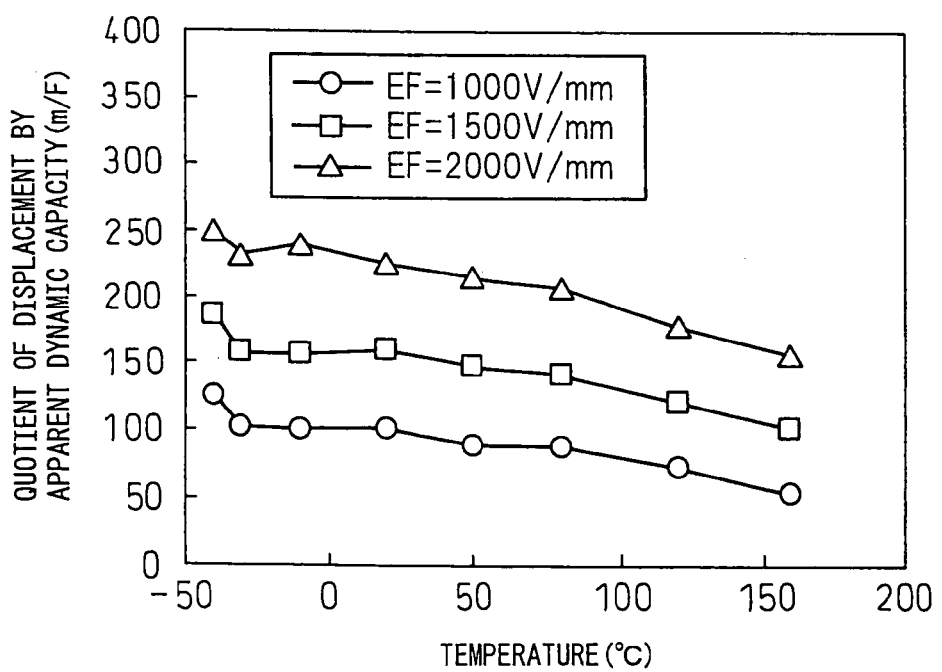
FIG. 12 is a graph showing the temperature dependency of the quotient of the displacement by the apparent dynamic capacity of the piezoelectric actuator in accordance with Example 4.

Table 4, FIG. 10, FIG. 11, FIG. 12, Table 11, Table 12, Table 13, and Table 14 present the characteristics of the piezoelectric actuator of the present example.

As seen from these tables and drawings, the minimum value of the magnitude of dynamic strain D33 and the widths of variations in the foregoing properties which are observed in the piezoelectric actuator of the present example over a temperature range from −30° C. to 80° C. are understood as summarized below.

When the amplitude in electric field strength of a driving voltage is 1000 V/mm and the temperature is 50° C., the magnitude of dynamic strain D33 marks the minimum value or is 427 pm/V.

When the amplitude in electric field strength of a driving voltage is 1000 V/mm, the variation width in a displacement marks the maximum value or is ±7.2%.

When the amplitude in electric field strength of a driving voltage is 2000 V/mm, the variation width in an apparent dynamic capacity marks the maximum value or is ±6.1%.

When the amplitude in electric field strength of a driving voltage is 1000 V/mm, the variation width in the quotient of the displacement by the apparent dynamic capacity marks the maximum value or is ±8.0%.

When the amplitude in electric field strength of a driving voltage is 1000 V/mm, the variation width in the quotient of the displacement by (the apparent dynamic capacity)$^{0.5}$ marks the maximum value or is ±6.7%.

Moreover, the minimum value of the magnitude of dynamic strain D33 and the widths of variations in the aforesaid properties which are observed over a temperature range from −30° C. to 160° C. are as summarized below.

When the amplitude in electric field strength of a driving voltage is 1000 V/mm and the temperature is 50° C., the magnitude of dynamic strain D33 marks the minimum value or is 427 pm/V.

When the amplitude in electric field strength of a driving voltage is 2000 V/mm, the variation width in a displacement marks the maximum value or is ±9.4%.

When the amplitude in electric field strength of a driving voltage is 2000 V/mm, the variation width in an apparent dynamic capacity marks the maximum value or is ±28.4%.

When the amplitude in electric field strength of a driving voltage is 1000 V/mm, the variation width in the quotient of the displacement by the apparent dynamic capacity marks the maximum value or is ±32.4%.

When the amplitude in electric field strength of a driving voltage is 1000 V/mm, the variation width in the quotient of the displacement by (the apparent dynamic capacity)$^{0.5}$ marks the maximum value or is ±19.5%.

EXAMPLE 5

In the present example, a piezoelectric ceramic (crystal-oriented piezoelectric ceramic) having a composition that specifies addition of 0.0005 mol of manganese (Mn) to 1 mole of the composition expressed as $\{Li_{0.065}(K_{0.45}Na_{0.55})_{0.935}\}\{Nb_{0.83}Ta_{0.09}Sb_{0.08}\}O_3$ and prepared in Example 3 was produced, and used to construct a piezoelectric actuator.

To begin with, a sodium carbonate (Na$_2$CO$_3$) powder, a potassium carbonate (K$_2$CO$_3$) powder, a lithium carbonate (Li$_2$CO$_3$) powder, a diniobium pentaoxide (Nb$_2$O$_5$) powder, a ditantalum pentaoxide (Ta$_2$O$_5$) powder, a diantimony pentaoxide (Sb$_2$O$_5$) powder, and a manganese dioxide (MnO$_2$) powder that have a purity of 99.99% or more were weighed according to a composition specifying subtraction of 0.05 mol of sodium niobate (NaNbO$_3$) from the composition which specifies summation of 1 mol of $\{Li_{0.065}(K_{0.43}Na_{0.57})_{0.93}\}\{Nb_{0.83}Ta_{0.09}Sb_{0.08}\}O_3$ and 0.0005 mol of Mn. Using an organic solvent as a medium, the powders were wet-blended in a zirconium (Zr) bowl for twenty hours.

Thereafter, the mixture was calcined at 750° C. for five hours. Using an organic solvent as a medium, the mixture was wet-pulverized in the Zr bowl for twenty hours. This resulted in a calcined powder whose mean diameter was approximately 0.5 µm.

The subsequent procedure was the same as the one for Example 1 except that the firing temperature for the degreased plate-like compact was set to 1105° C. Thus, a crystal-oriented ceramic having the composition that specifies the summation of 1 mol of $\{Li_{0.065}(K_{0.45}Na_{0.55})_{0.935}\}\{Nb_{0.83}Ta_{0.09}Sb_{0.08}\}O_3$ and 0.0005 mol of Mn was produced.

The produced crystal-oriented ceramic was evaluated in terms of the density of a sintered compact, an average orientation degree, and piezoelectric properties under the same conditions as those for Example 1. Moreover, a laminated actuator including forty sheets of piezoelectric ceramic was constructed according to the same procedure as that for Example 1, and the characteristics of the actuator were evaluated. Moreover, the electrostatic capacity in the actuator was evaluated under such a condition that a driving voltage should have an amplitude in electric field strength of 2 V/mm (±1 V), a sine wave, and a frequency of 1 kHz.

The relative density of the crystal-oriented ceramic produced in the present example was 95% or more. Moreover, the pseudo-cubic {100} planes were oriented in parallel with the tape surface, and the average orientation degree of the pseudo-cubic {100} planes calculated according to the Lotgering's method reached 89.6%. Furthermore, the results of evaluation of the piezoelectric properties at the temperature of 25° C. were such that the piezoelectric $d_{31}$ constant was 99.1 pm/V, the electromechanical coupling coefficient kp was 52.0%, the mechanical quality coefficient Qm was 20.3, the relative dielectric constant $\epsilon_{33}{}^T/\epsilon_0$ was 1159, and the dielectric loss tan δ was 2.7%. Consequently, the addition of Mn has proved advantageous in increasing the mechanical quality coefficient Qm and decreasing the dielectric loss tan δ.

Moreover, the first crystal phase transition temperature (Curie temperature) obtained based on the temperature characteristic of the relative dielectric constant was 263° C., and the second crystal phase transition temperature was −15° C.

Figure 13:
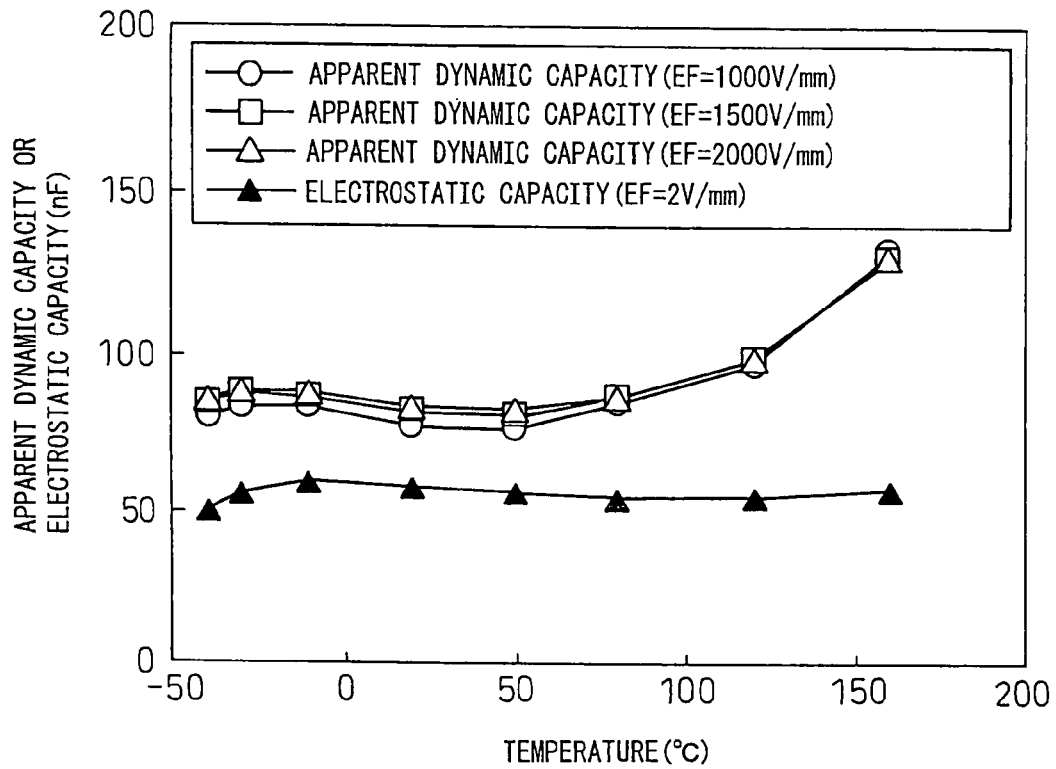
FIG. 13 is a graph showing the temperature dependencies of an apparent dynamic capacity and an electrostatic capacity of a piezoelectric actuator in accordance with Example 5.
Figure 14:
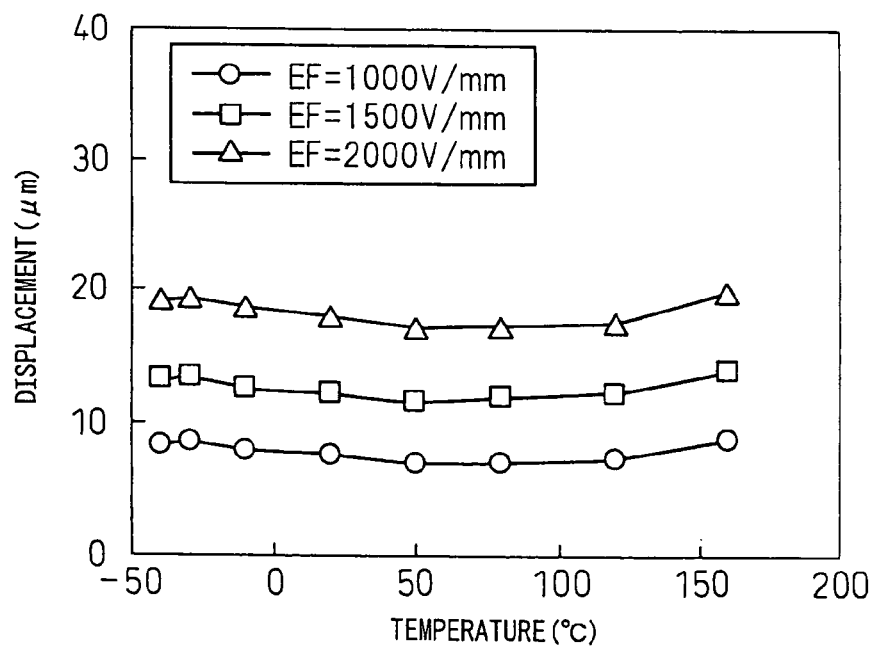
FIG. 14 is a graph showing the temperature dependency of a displacement made by the piezoelectric actuator in accordance with Example 5.
Figure 15:
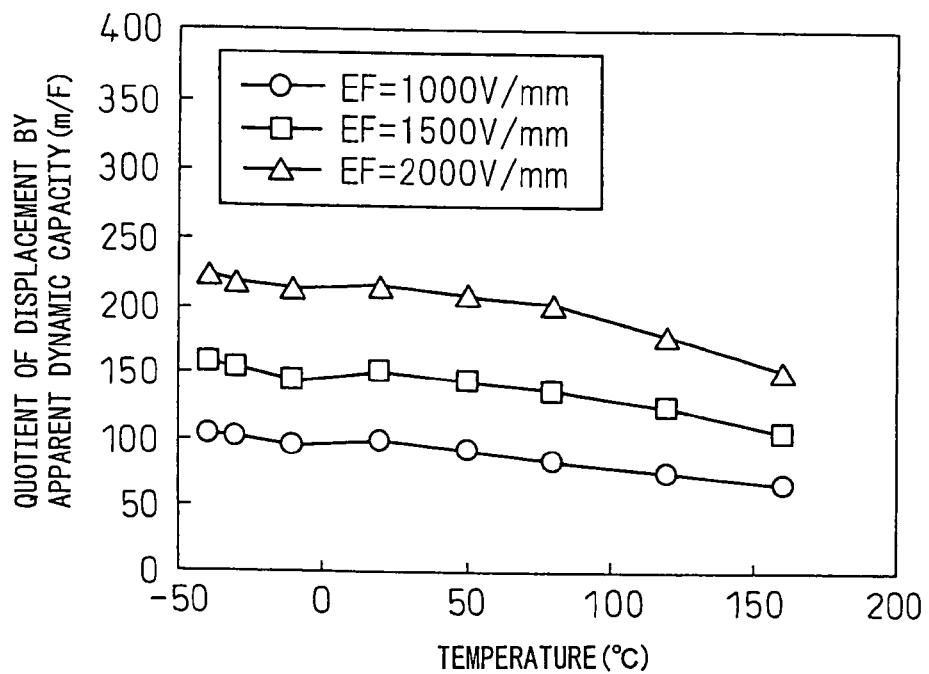
FIG. 15 is a graph showing the temperature dependency of the quotient of the displacement by the apparent dynamic capacity of the piezoelectric actuator in accordance with Example 5.

Table 5, FIG. 13, FIG. 14, FIG. 15, Table 11, Table 12, Table 13, and Table 14 present the characteristics of the piezoelectric actuator of the present example.

As seen from these tables and drawings, the minimum value of the magnitude of dynamic strain D33 and the widths of variations in the foregoing properties which are observed in the piezoelectric actuator of the present example over a temperature range from −30° C. to 80° C. are understood as summarized below.

When the amplitude in electric field strength of a driving voltage is 1000 V/mm and the temperature is 50° C. or 80° C., the magnitude of dynamic strain D33 marks the minimum value or is 355 pm/V.

When the amplitude in electric field strength of a driving voltage is 1000 V/mm, the variation width in a displacement marks the maximum value or is ±10.4%.

When the amplitude in electric field strength of a driving voltage is 1000 V/mm, the variation width in an apparent dynamic capacity marks the maximum value or is ±4.9%.

When the amplitude in electric field strength of a driving voltage is 1000 V/mm, the variation width in the quotient of the displacement by the apparent dynamic capacity marks the maximum value or is ±10.7%.

When the amplitude in electric field strength of a driving voltage is 1000 V/mm, the variation width in the quotient of the displacement by (the apparent dynamic capacity)$^{0.5}$ marks the maximum value or is ±7.2%.

Moreover, the minimum value of the magnitude of dynamic strain D33 and the widths of variations in the aforesaid properties which are observed over a temperature range from −30° C. to 160° C. are as summarized below.

When the amplitude in electric field strength of a driving voltage is 1000 V/mm and the temperature is 50° C. or 80° C., the magnitude of dynamic strain D33 marks the minimum value or is 355 pm/V.

When the amplitude in electric field strength of a driving voltage is 1000 V/mm, the variation width in a displacement marks the maximum value or is ±11.8%.

When the amplitude in electric field strength of a driving voltage is 1000 V/mm, the variation width in an apparent dynamic capacity marks the maximum value or is ±26.9%.

When the amplitude in electric field strength of a driving voltage is 1000 V/mm, the variation width in the quotient of the displacement by the apparent dynamic capacity marks the maximum value or is ±21.3%.

When the amplitude in electric field strength of a driving voltage is 1000 V/mm, the variation width in the quotient of the displacement by (the apparent dynamic capacity)$^{0.5}$ marks the maximum value or is ±12.4%.

Consequently, the addition of Mn has proved advantageous in decreasing the variation width in the apparent dynamic capacity over the temperature range from −30° C. to 160° C.

Now, the electrostatic capacity in the piezoelectric actuator of the present example will be described below.

The electrostatic capacity in the piezoelectric actuator of the present example was smaller than the apparent dynamic capacity over the temperature range from −30° C. to 160° C. Moreover, the variation width in the electrostatic capacity over the range from −30° C. to 80° C. was ±4.8% or nearly identical to the variation width in the apparent dynamic capacity observed under the electric field strength of 1000 V/mm. On the other hand, the variation width in the electrostatic capacity over the range from −30° C. to 160° C. was ±5.2% or much smaller than the variation width in the apparent dynamic capacity. The difference between the dynamic capacity and electrostatic capacity is thought to be dominated by the difference in electric field strength.

Consequently, the difference between the widths of variations is presumably attributable to the fact that: when the electric field strength is equal to or larger than 1000 V/mm, the apparent dynamic capacity increases along with an increase in a leakage current; but when the electric field strength is 2 V/mm, the electrostatic capacity does not increase because of the small leakage current.

Consequently, as far as the piezoelectric actuator of the present example is concerned, when the driving electric field strength is smaller than 1000 V/m, the variation width in the apparent dynamic capacity can be decreased over the temperature range from −30° C. to 160° C. The feasible decrease is presumable on the same level as the temperature characteristic of the electrostatic capacity.

COMPARATIVE EXAMPLE 1

The present comparative example is an example of a laminated actuator that is suitable for a laminated actuator for automotive fuel injection valves and that employs a lead zirconium titanate (PZT) material of the tetragonal system whose nature is intermediate between those of soft and hard systems (semi-hard). Herein, the soft system refers to materials whose mechanical quality coefficients Qm are equal to or smaller than 100, while the hard system refers to materials whose mechanical quality coefficients Qm are equal to or larger than 1000. The laminated actuator for fuel injection valves is used for constant voltage control, constant energy control, or constant charge control, and opens or closes a valve according to a trapezoidal-wave driving voltage so as to control a spray of fuel. The required characteristics of the actuator are such that the displacement performance is high and the temperature dependency of a displacement is small irrespective of a control method.

A lead oxide (PbO) powder, a zirconium dioxide ($ZrO_2$) powder, a titanium dioxide ($TiO_2$) powder, a strontium carbonate ($SrCO_3$) powder, a diyttrium trioxide ($Y_2O_3$) powder, a diniobium pentaoxide ($Nb_2O_5$) powder, and a dimanganese trioxide ($Mn_2O_3$) powder were weighed according to a composition of $(Pb_{0.92}Sr_{0.09})\{(Zr_{0.543}Ti_{0.457})_{0.985}(Y_{0.5}Nb_{0.5})_{0.01}Mn_{0.005}\}O_3$. Water was used as a medium to wet-blend the powders in a zirconium (Zr) bowl. Thereafter, the mixture was calcined at 790° C. for seven hours. Furthermore, an organic solvent was used as a medium to wet-pulverize the mixture in the Zr bowl. This resulted in slurry of a calcined powder whose mean diameter was approximately 0.7 µm.

After a binder (polyvinyl butyral) and a plasticizer (butyl benzyl phthalate) were added to the slurry, the slurry was blended in the Zr bowl for twenty hours.

Thereafter, a tape molding equipment was used to mold the blended slurry into a tape having a thickness of approximately 100 µm. Furthermore, the tape was stacked or thermally contact-bonded in order to produce a plate-like compact of 1.2 mm thick. The plate-like compact was degreased in air. The degreased plate-like compact was placed on a magnesium oxide (MgO) plate in an alumina sagger, and sintered in air at 1170° C. for two hours. The subsequent procedure was identical to the one for Example 1 except that a silver (Ag) paste was used as an electrode material to perform baking.

The relative density of the piezoelectric ceramic of the present comparative example was 95% or more. Moreover, the results of evaluation of the piezoelectric properties at the temperature of 25° C. were such that the piezoelectric $d_{31}$ constant was 158.0 pm/V, the electromechanical coupling coefficient kp was 60.2%, the mechanical quality coefficient Qm was 540, the relative dielectric constant $\in_{33}^t/\in_0$ was 1701, and the dielectric loss tan δ was 0.2%.

Figure 16:
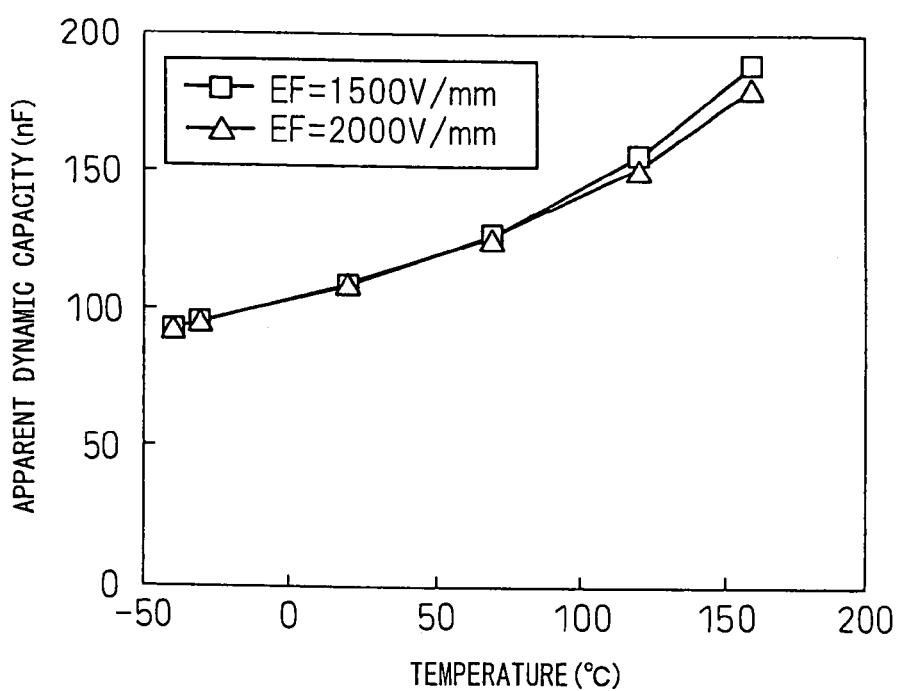
FIG. 16 is a graph showing the temperature dependency of an apparent dynamic capacity of a piezoelectric actuator in accordance with Comparative example 1.
Figure 17:
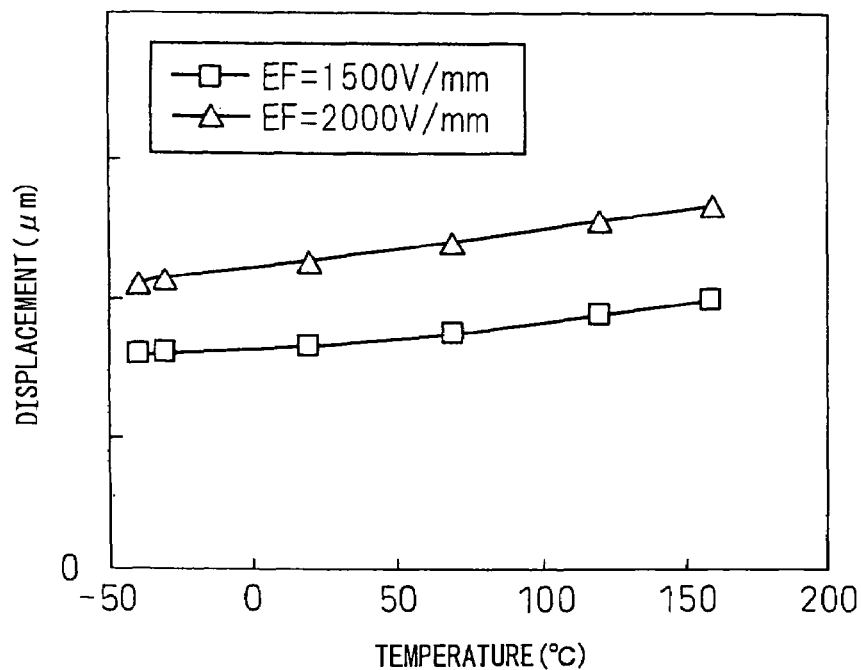
FIG. 17 is a graph showing the temperature dependency of a displacement made by the piezoelectric actuator in accordance with Comparative example 1.
Figure 18:
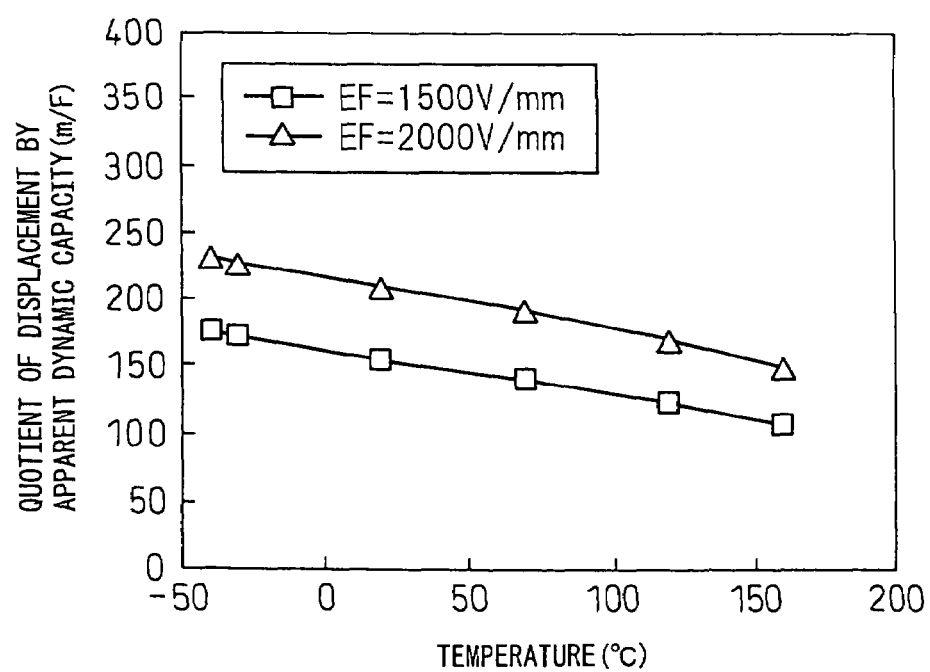
FIG. 18 is a graph showing the temperature dependency of the quotient of the displacement by the apparent dynamic capacity of the piezoelectric actuator in accordance with Comparative example 1.

Table 6, FIG. 16, FIG. 17, FIG. 18, Table 15, Table 16, Table 17, and Table 18 present the characteristics of the actuator of the present comparative example.

As seen from these tables and drawings, as for the piezoelectric actuator of the present comparative example, the minimum value of the magnitude of dynamic strain D33 and the widths of variations in the foregoing properties which are observed in the piezoelectric actuator of the present comparative example over a temperature range from –30° C. to 70° C. are as summarized below.

When the amplitude in electric field strength of a driving voltage is 2000 V/mm or 1500 V/mm and the temperature is –30° C., the magnitude of dynamic strain D33 marks the minimum value or is 553 pm/V.

When the amplitude in electric field strength of a driving voltage is 2000 V/mm, the variation width in a displacement marks the maximum value or is ±5.6%.

When the amplitude in electric field strength of a driving voltage is 1500 V/mm, the variation width in an apparent dynamic capacity marks the maximum value or is 14.5%.

When the amplitude in electric field strength of a driving voltage is 1500 V/mm, the variation width in the quotient of the displacement by the apparent dynamic capacity marks the maximum value or is ±10.5%.

Moreover, the minimum value of the magnitude of dynamic strain D33 and the widths of variations in the aforesaid properties which are observed over a temperature range from –30° C. to 160° C. are as summarized below.

When the amplitude in electric field strength of a driving voltage is 2000 V/mm or 1500 V/mm and the temperature is –30° C., the magnitude of dynamic strain D33 marks the minimum value or is 553 pm/V.

When the amplitude in electric field strength of a driving voltage is 2000 V/mm, the variation width in a displacement marks the maximum value or is ±11.1%.

When the amplitude in electric field strength of a driving voltage is 1500 V/mm, the variation width in an apparent dynamic capacity marks the maximum value or is ±33.5%.

When the amplitude in electric field strength of a driving voltage is 1500 V/mm, the variation width in the quotient of the displacement by the apparent dynamic capacity marks the maximum value or is ±23.7%.

COMPARATIVE EXAMPLE 2

Comparative example 2 is an example of a laminated actuator that is suitable for a laminated actuator for positioning which may be employed in semiconductor manufacturing equipment in which a change in ambient temperature is small, and that is made of a lead zirconium titanate (PZT) material belonging to the soft rhombohedral system. Since the laminated actuator for positioning is used in a place where a change in ambient temperature is small, it must offer high displacement performance but need not exhibit an excellent temperature characteristic.

A lead oxide (PbO) powder, a zirconium dioxide ($ZrO_2$) powder, a titanium dioxide ($TiO_2$) powder, a strontium carbonate ($SrCO_3$) powder, a diyttrium trioxide ($Y_2O_3$) powder, and a diniobium pentaoxide ($Nb_2O_5$) powder were weighed according to a composition $(Pb_{0.895}Sr_{0.115})\{(Zr_{0.57}Ti_{0.43})_{0.978}(Y_{0.5}Nb_{0.5})_{0.01}Mn_{0.012}\}O_3$. Water was used as a medium to wet-blend the powders in a zirconium (Zr) bowl for twenty hours. Thereafter, the mixture was calcined at 875° C. for five hours. Furthermore, water was used as a medium to wet-pulverize the mixture in the Zr bowl. A binder (polyvinyl alcohol) was added to the slurry so that the binder will occupy 1 weight percent of the slurry or calcined powder. Thereafter, the resultant slurry was dried using a spray drier and thus granulated.

Thereafter, dies were used to perform dry press molding. This resulted in a compact having a diameter of 15 mm and a thickness of 2 mm. Thereafter, the disk-like compact was degreased in air. Furthermore, after the degreased plate-like compact was molded according to the cold isostatic press (CIP) method under a pressure of 200 MPa, it is placed on a magnesium oxide (MgO) plate in an alumina sagger, and sintered in air at 1260° C. for two hours. The subsequent procedure was the same as the one for Comparative example 1.

The relative density of the piezoelectric ceramic of the present comparative example was 95% or more. Moreover, the results of evaluation of the piezoelectric properties at the temperature of 25° C. were such that the piezoelectric $d_{31}$ constant was 212.7 pm/V, the electromechanical coupling coefficient kp was 67.3%, the mechanical quality coefficient Qm was 47.5, the relative dielectric constant $\in_{33}^t/\in_0$ was 1943, and the dielectric loss tan δ was 2.1%.

Figure 19:
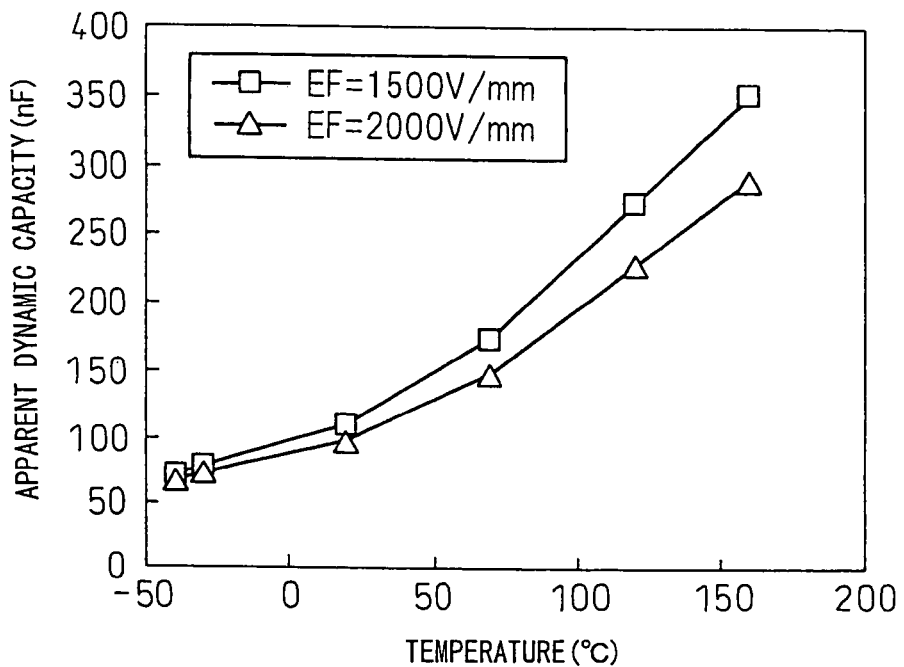
FIG. 19 is a graph showing the temperature dependency of an apparent dynamic capacity of a piezoelectric actuator in accordance with Comparative example 2.
Figure 20:
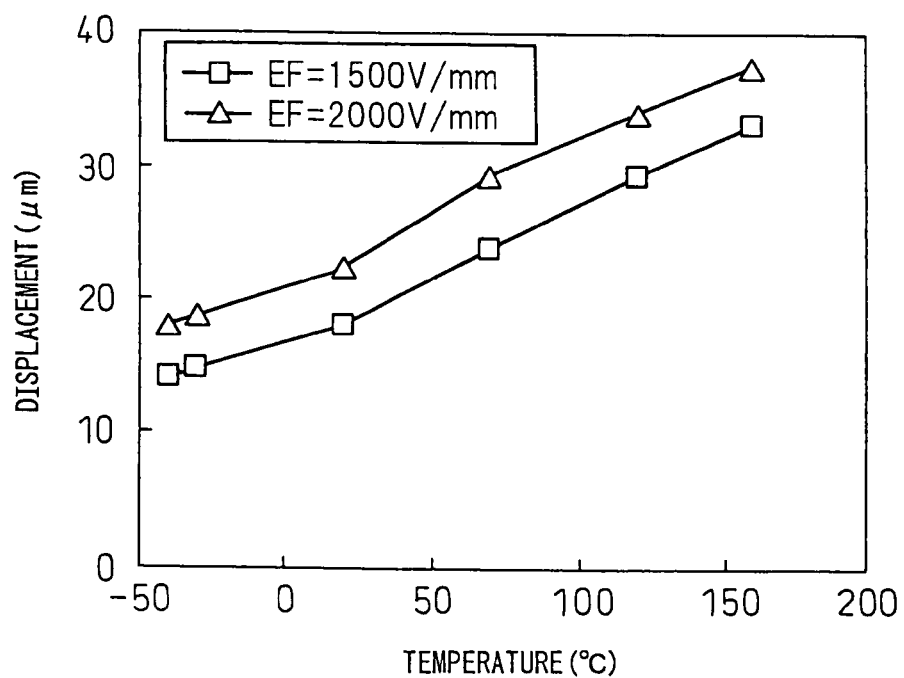
FIG. 20 is a graph showing the temperature dependency of a displacement made by the piezoelectric actuator in accordance with Comparative example 2.
Figure 21:
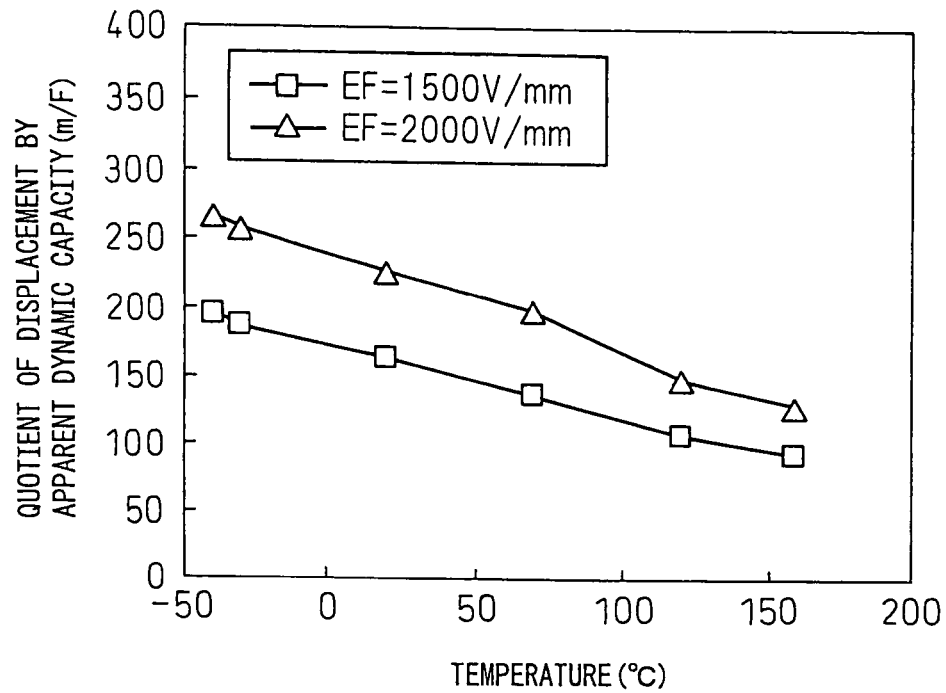
FIG. 21 is a graph showing the temperature dependency of the quotient of the displacement by the apparent dynamic capacity of the piezoelectric actuator in accordance with Comparative example 2.

Table 7, FIG. 19, FIG. 20, FIG. 21, Table 15, Table 16, Table 17, and Table 18 present the characteristics of the actuator of the present comparative example.

As seen from these tables and drawings, the minimum value of the magnitude of dynamic strain D33 and the widths of variations in the foregoing properties which are observed in the piezoelectric actuator of the present example over a temperature range from −30° C. to 70° C. are understood as summarized below.

When the amplitude in electric field strength of a driving voltage is 2000 V/mm and the temperature is −30° C., the magnitude of dynamic strain D33 marks the minimum value or is 482 pm/V.

When the amplitude in electric field strength of a driving voltage is 1500 V/mm, the variation width in a displacement marks the maximum value or is ±23.7%.

When the amplitude in electric field strength of a driving voltage is 1500 V/mm, the variation width in an apparent dynamic capacity marks the maximum value or is ±37.9%.

When the amplitude in electric field strength of a driving voltage is 1500 V/mm, the variation width in the quotient of the displacement by the apparent dynamic capacity marks the maximum value or is ±15.5%.

Moreover, the minimum value of the magnitude of dynamic strain D33 and the widths of variations in the aforesaid properties which are observed over a temperature range from −30° C. to 160° C. are as summarized below.

When the amplitude in electric field strength of a driving voltage is 2000 V/mm and the temperature is −30° C., the magnitude of dynamic strain D33 marks the minimum value or is 482 pm/V.

When the amplitude in electric field strength of a driving voltage is 1500 V/mm, the variation width in a displacement marks the maximum value or is ±38.5%.

When the amplitude in electric field strength of a driving voltage is 1500 V/mm, the variation width in an apparent dynamic capacity marks the maximum value or is ±63.5%.

When the amplitude in electric field strength of a driving voltage is 2000 V/mm or 1500 V/mm, the variation width in the quotient of the displacement by the apparent dynamic capacity marks the maximum value or is ±33.1%.

COMPARATIVE EXAMPLE 3

Comparative example 3 is an example of a laminated actuator that is suitable for an automotive knock sensor and that adopts a lead zirconium titanate (PZT) material belonging to the soft tetragonal system. The knock sensor converts knocking of an engine into a voltage by utilizing the piezoelectric effect provided by a piezoelectric ceramic, and thus senses the knocking. The knock sensor does not have a function as an actuator.

A lead oxide (PbO) powder, a zirconium dioxide ($ZrO_2$) powder, a titanium dioxide ($TiO_2$) powder, a strontium titanate ($SrTiO_3$) powder, and a diantimony trioxide ($Sb_2O_3$) powder were weighed according to a composition $(Pb_{0.95}Sr_{0.05})\{(Zr_{0.53}Ti_{0.47})_{0.978}Sb_{0.022}\}O_3$. Water was used as a medium to wet-blend the powders in a zirconium (Zr) bowl for twenty hours. Thereafter, the mixture was calcined at 825° C. for five hours. Furthermore, water was used as a medium to wet-pulverize the mixture in the Zr bowl. The subsequent procedure was identical to that for Comparative example 2 except that the sintering temperature was set to 1230° C.

The relative density of the piezoelectric ceramic of the present comparative example was 95% or more. The results of evaluation of the piezoelectric properties at the temperature of 25° C. were such that the piezoelectric $d_{31}$ constant was 203.4 pm/V, the electromechanical coupling coefficient kp was 62.0%, the mechanical quality coefficient Qm was 55.8, the relative dielectric constant $\in_{33}{}^t/\in_0$ was 2308, and the dielectric loss tan δ was 1.4%.

Figure 22:
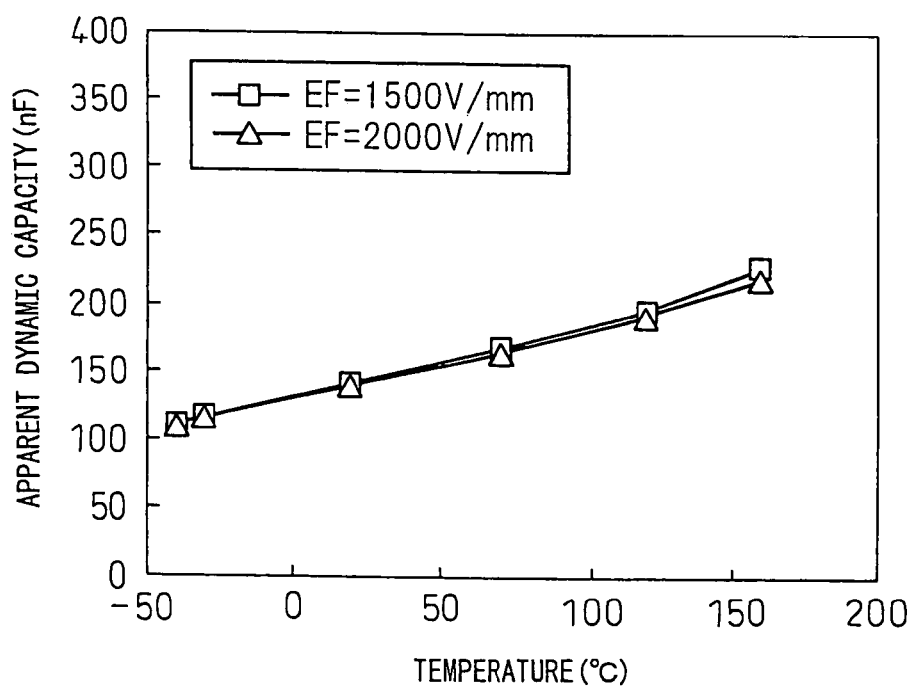
FIG. 22 is a graph showing the temperature dependency of an apparent dynamic capacity of a piezoelectric actuator in accordance with Comparative example 3.
Figure 23:
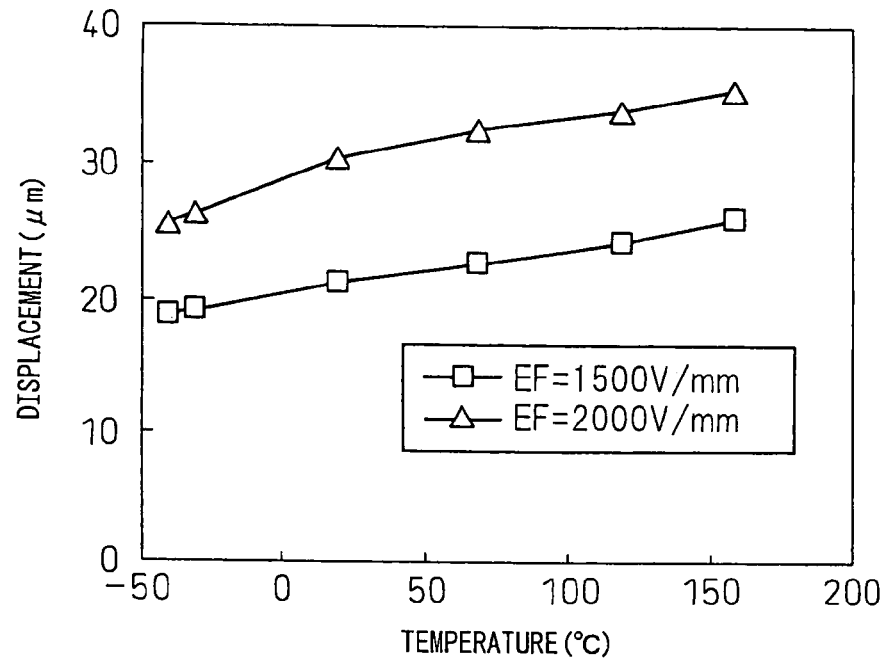
FIG. 23 is a graph showing the temperature dependency of a displacement made by the piezoelectric actuator in accordance with Comparative example 3.
Figure 24:
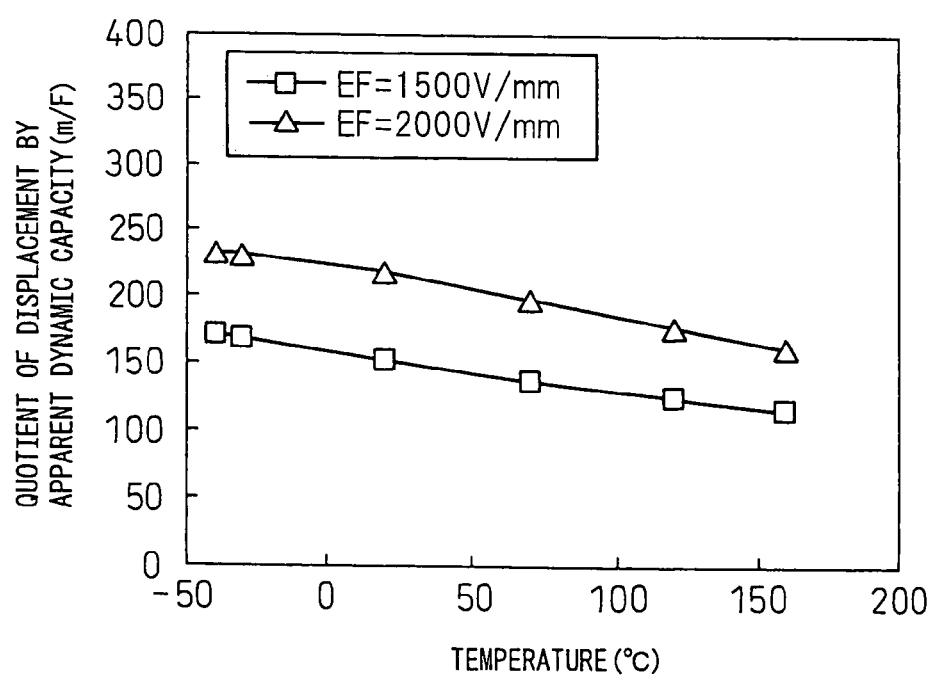
FIG. 24 is a graph showing the temperature dependency of the quotient of the displacement by the apparent dynamic capacity of the piezoelectric actuator in accordance with Comparative example 3.

Table 8, FIG. 22, FIG. 23, FIG. 24, Table 15, Table 16, Table 17, and Table 18 present the characteristics of the actuator of the present comparative example.

As seen from these tables and drawings, the minimum value of the magnitude of dynamic strain D33 and the widths of variations in the foregoing properties, which are observed in the piezoelectric actuator of the present comparative example over a temperature range from −30° C. to 70° C. are as summarized below.

When the amplitude in electric field strength of a driving voltage is 1500 V/mm and the temperature is −30° C., the magnitude of dynamic strain D33 marks the minimum value or is 663 pm/V.

When the amplitude in electric field strength of a driving voltage is 2000 V/mm, the variation width in a displacement marks the maximum value or is ±10.4%.

When the amplitude in electric field strength of a driving voltage is 1500 V/mm, the variation width in an apparent dynamic capacity marks the maximum value or is ±17.9%.

When the amplitude in electric field strength of a driving voltage is 1500 V/mm, the variation width in the quotient of the displacement by the apparent dynamic capacity marks the maximum value or is ±10.2%.

Moreover, the minimum value of the magnitude of dynamic strain D33 and the widths of variations in the aforesaid properties, which are observed over a temperature range from −30° C. to 160° C., are understood as summarized below.

When the amplitude in electric field strength of a driving voltage is 1500 V/mm and the temperature is −30° C., the magnitude of dynamic strain D33 marks the minimum value or is 663 pm/V.

When the amplitude in electric field strength of a driving voltage is 1500 V/mm, the variation width in a displacement marks the maximum value or is ±14.8%.

When the amplitude in electric field strength of a driving voltage is 1500 V/mm, the variation width in an apparent dynamic capacity marks the maximum value or is ±32.3%.

When the amplitude in electric field strength of a driving voltage is 1500 V/mm, the variation width in the quotient of the displacement by the apparent dynamic capacity marks the maximum value or is ±18.4%.

COMPARATIVE EXAMPLE 4

Comparative example 4 is an example of a laminated actuator that is suitable for a high-power ultrasonic motor that adopts a lead zirconium titanate (PZT) material belonging to the semi-hard tetragonal system. The ultrasonic motor has a piezoelectric ceramic ring, which is bonded to a stator, driven to resonate at several tens of kilohertz, and thus a rotor, which is pressure-welded to the stator, is rotated. The required characteristics of the actuator include relatively high displacement performance and the excellent temperature characteristic of a displacement.

A lead oxide (PbO) powder, a zirconium dioxide ($ZrO_2$) powder, a titanium dioxide ($TiO_2$) powder, a strontium carbonate ($SrCO_3$) powder, a diantimony trioxide ($Sb_2O_3$) powder, and a manganese carbonate ($MnCO_3$) powder were weighed according to a composition $(Pb_{0.965}Sr_{0.05})\{(Zr_{0.5}Ti_{0.5})_{0.96}Sb_{0.03}Mn_{0.01}\}O_3$. Water was used as a medium to wet-blend the powders in a zirconium (Zr) bowl. Thereafter, the mixture was calcined at 875° C. for five hours. Furthermore, water was used as a medium to wet-pulverize the mixture in the Zr bowl. The subsequent procedure was the same as the one for Comparative example 2 except that the sintering temperature was set to 1230° C.

The relative density of the piezoelectric ceramic of the present comparative example was 95% or more. The results of evaluation of the piezoelectric properties at the temperature of 25 were such that the piezoelectric $d_{31}$ constant was 136.9 pm/V, the electromechanical coupling coefficient kp was 57.9%, the mechanical quality coefficient Qm was 850, the relative dielectric constant $\in_{33}{}^t/\in_0$ was 1545, and the dielectric loss tan δ was 0.2%.

Figure 25:
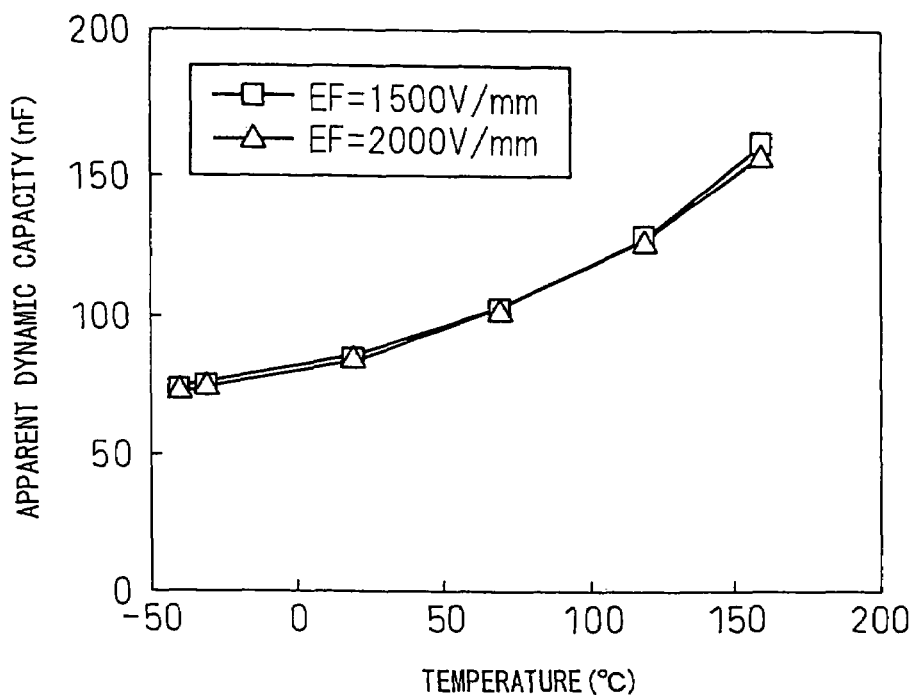
FIG. 25 is a graph showing the temperature dependency of an apparent dynamic capacity of a piezoelectric actuator in accordance with Comparative example 4.
Figure 26:
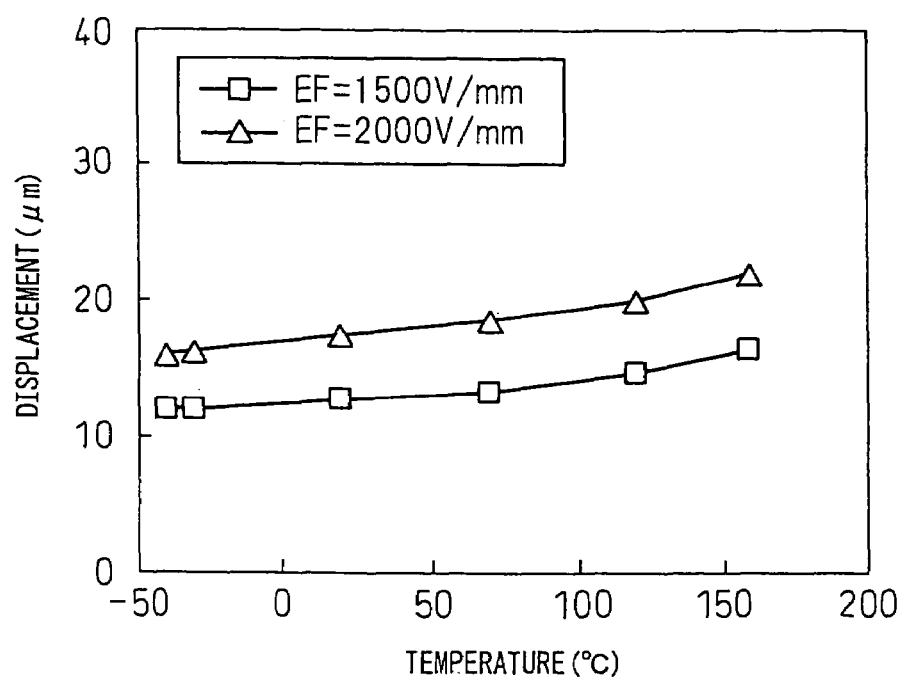
FIG. 26 is a graph showing the temperature dependency of a displacement made by the piezoelectric actuator in accordance with Comparative example 4.
Figure 27:
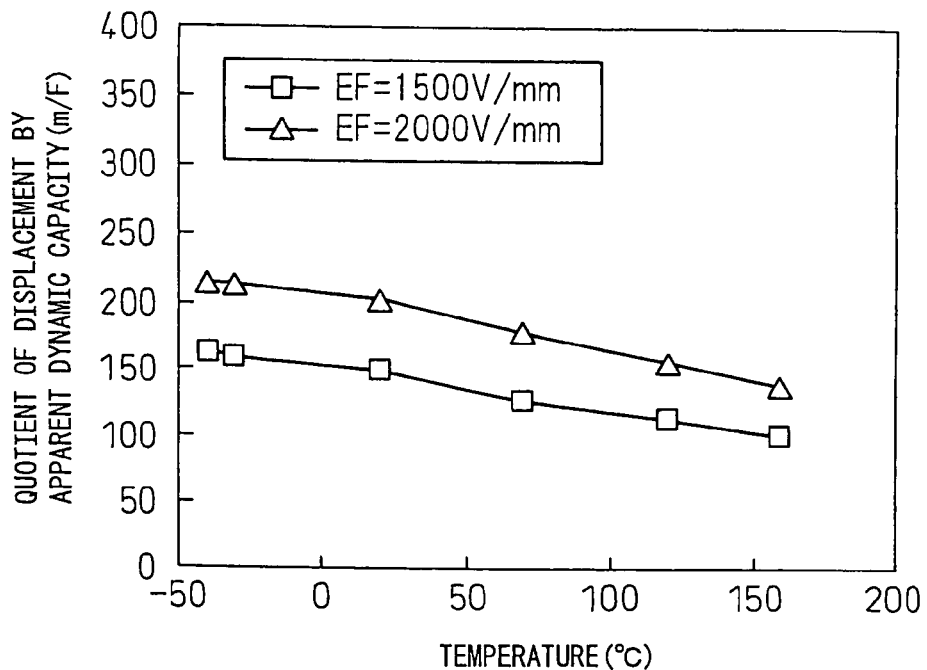
FIG. 27 is a graph showing the temperature dependency of the quotient of the displacement by the apparent dynamic capacity of the piezoelectric actuator in accordance with Comparative example 4.

Table 9, FIG. 25, FIG. 26, FIG. 27, Table 15, Table 16, Table 17, and Table 18 present the characteristics of the actuator of the present comparative example.

As seen from these tables and drawings, the minimum value of the magnitude of dynamic strain D33 and the widths of variations in the foregoing properties, which are observed in the piezoelectric actuator of the present comparative example over a temperature range from −30° C. to 70° C., are as summarized below.

When the amplitude in electric field strength of a driving voltage is 1500 V/mm and the temperature is −30° C., the magnitude of dynamic strain D33 marks the minimum value or is 409 pm/V.

When the amplitude in electric field strength of a driving voltage is 2000 V/mm, the variation width in a displacement marks the maximum value or is ±6.0%.

When the amplitude in electric field strength of a driving voltage is 1500 V/mm, the variation width in an apparent dynamic capacity marks the maximum value or is ±15.8%.

When the amplitude in electric field strength of a driving voltage is 1500 V/mm, the variation width in the quotient of the displacement by the apparent dynamic capacity marks the maximum value or is ±11.5%.

Moreover, the minimum value of the magnitude of dynamic strain D33 and the widths of variations in the aforesaid properties, which are observed over a temperature range from −30° C. to 160° C., are understood as summarized below.

When the amplitude in electric field strength of a driving voltage is 1500 V/mm and the temperature is −30° C., the magnitude of dynamic strain D33 marks the minimum value or is 409 pm/V.

When the amplitude in electric field strength of a driving voltage is 1500 V/mm, the variation width in a displacement marks the maximum value or is ±15.2%.

When the amplitude in electric field strength of a driving voltage is 1500 V/mm, the variation width in an apparent dynamic capacity marks the maximum value or is ±36.7%.

When the amplitude in electric field strength of a driving voltage is 1500 V/mm, the variation width in the quotient of the displacement by the apparent dynamic capacity marks the maximum value or is ±22.7%.

COMPARATIVE EXAMPLE 5

Comparative example 5 is a laminated actuator that is suitable for high-sensitivity angular velocity sensors and that adopts a lead zirconium titanate (PZT) material belonging to the hard tetragonal system. The angular velocity sensor has both the capability of an actuator in which a piezoelectric ceramic tuning fork is driven to resonate at several kilohertz, and the capability of a sensor that senses an angular velocity. As for the characteristics of the actuator, the temperature dependency of a displacement must be small, though the displacement performance may be low.

A lead oxide (PbO) powder, a zirconium dioxide ($ZrO_2$) powder, a titanium dioxide ($TiO_2$) powder, a zinc oxide (ZnO) powder, a manganese carbonate ($MnCO_3$) powder, and a diniobium pentaoxide ($Nb_2O_5$) powder were weighed according to a composition $Pb\{(Zr_{0.5}Ti_{0.5})_{0.98}(Zn_{0.33}Nb_{0.67})_{0.01}Mn_{0.01}\}O_3$. Water was used as a medium to wet-blend the powders in a zirconium (Zr) bowl. Thereafter, the mixture was calcined at 800° C. for five hours. Furthermore, water was used as a medium to wet-pulverize the mixture in the Zr bowl. The subsequent procedure was the same as the one for Comparative example 2 except that the sintering temperature was set to 1200° C.

The relative density of the piezoelectric ceramic of the present comparative example was 95% or more. The results of evaluation of the piezoelectric properties at the temperature of 25° C. were such that the piezoelectric $d_{31}$ constant was 103.6 pm/V, the electromechanical coupling coefficient kp was 54.1%, the mechanical quality coefficient Qm was 1230, the relative dielectric constant $\in_{33}{}^t/\in_0$ was 1061, and the dielectric loss tan δ was 0.2%.

Figure 28:
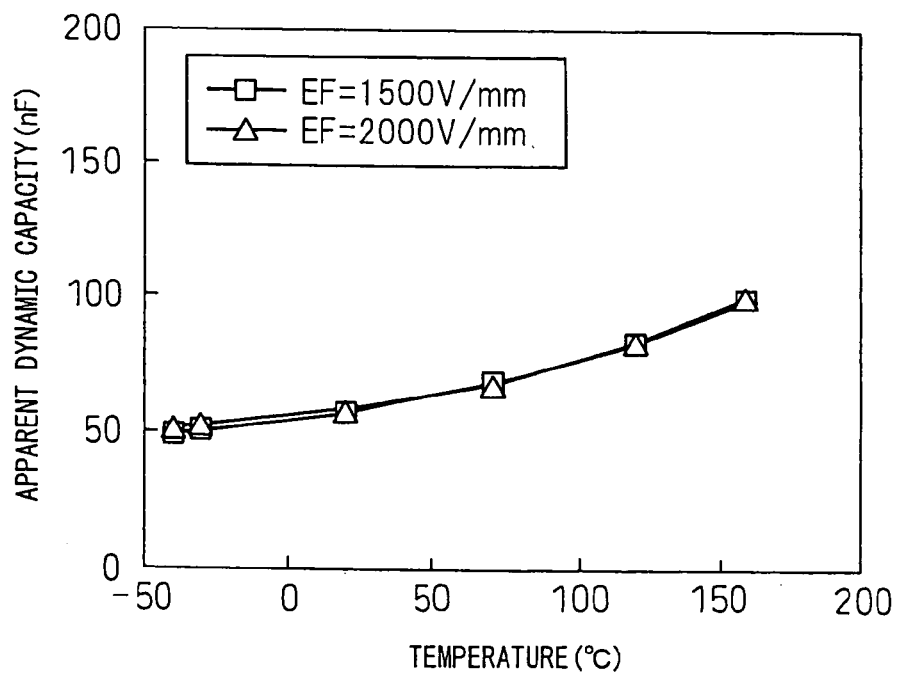
FIG. 28 is a graph showing the temperature dependency of an apparent dynamic capacity of a piezoelectric actuator in accordance with Comparative example 5.
Figure 29:
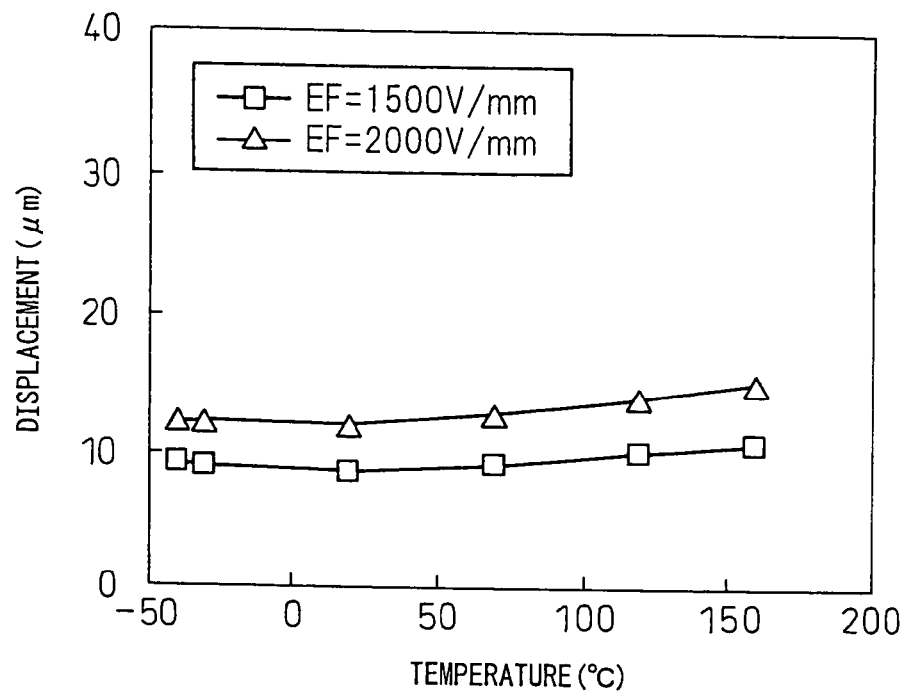
FIG. 29 is a graph showing the temperature dependency of a displacement made by the piezoelectric actuator in accordance with Comparative example 5.
Figure 30:
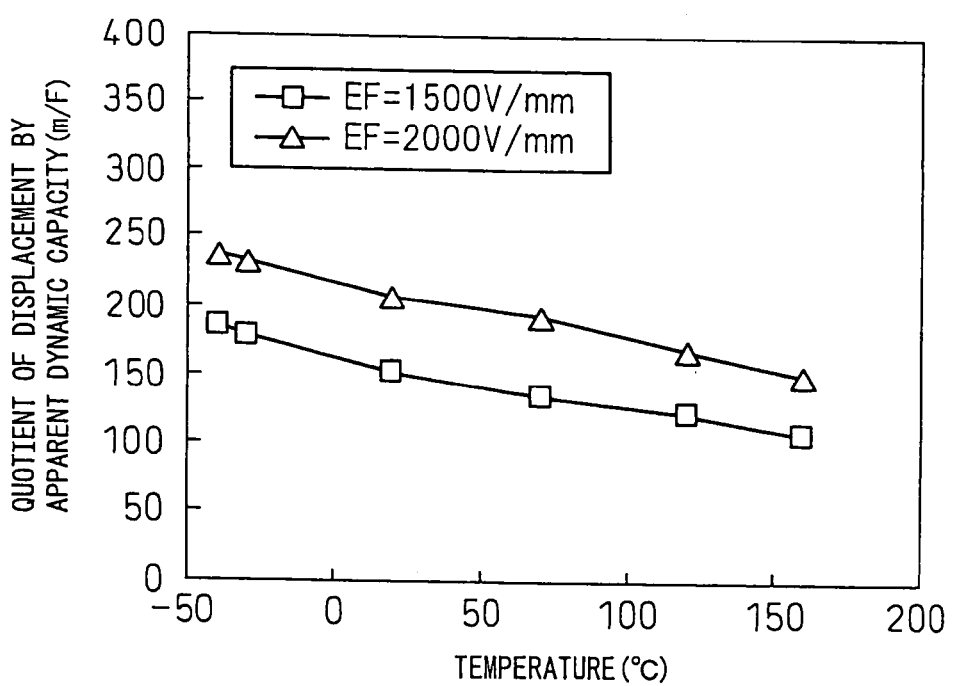
FIG. 30 is a graph showing the temperature dependency of the quotient of the displacement by the apparent dynamic capacity of the piezoelectric actuator in accordance with Comparative example 5.

Table 10, FIG. 28, FIG. 29, FIG. 30, Table 15, Table 16, Table 17, and Table 18 present the characteristics of the actuator of the present comparative example.

As seen from these tables and drawings, the minimum value of the magnitude of dynamic strain D33 observed and the widths of variations in the foregoing properties, which are observed in the piezoelectric actuator of the present comparative example over a temperature range from −30° C. to 70° C., are as summarized below.

When the amplitude in electric field strength of a driving voltage is 1500 V/mm and the temperature is 20° C., the magnitude of dynamic strain D33 marks the minimum value or is 295 pm/V. The minimum value of the magnitude of dynamic strain D33 is smaller than 303 pm/V observed in Example 1.

When the amplitude in electric field strength of a driving voltage is 2000 V/mm, the variation width in a displacement marks the maximum value or is ±3.2%.

When the amplitude in electric field strength of a driving voltage is 1500 V/mm, the variation width in an apparent dynamic capacity marks the maximum value or is ±14.3%.

When the amplitude in electric field strength of a driving voltage is 1500 V/mm, the variation width in the quotient of the displacement by the apparent dynamic capacity marks the maximum value or is ±13.9%.

Moreover, the minimum value of the magnitude of dynamic strain D33 and the widths of variations in the aforesaid properties, which are observed in the piezoelectric actuator over a temperature range from −30° C. to 160° C., are as summarized below.

When the amplitude in electric field strength of a driving voltage is 1500 V/mm and the temperature is 20° C., the magnitude of dynamic strain D33 marks the minimum value or is 295 pm/V.

When the amplitude in electric field strength of a driving voltage is 1500 V/mm, the variation width in a displacement marks the maximum value or is ±11.1%.

When the amplitude in electric field strength of a driving voltage is 1500 V/mm, the variation width in an apparent dynamic capacity marks the maximum value or is ±32.4%.

When the amplitude in electric field strength of a driving voltage is 1500 V/mm, the variation width in the quotient of the displacement by the apparent dynamic capacity marks the maximum value or is ±24.5%.

EXAMPLE 6

Separating a Leakage Current from a Capacity

In the present example, the piezoelectric ceramics (single sheets) produced in Example 1, Example 4, and Comparative example 1 were evaluated in terms of the temperature characteristic of a dynamic capacity in order to discuss whether an increase in an apparent dynamic capacity at 80° C. or more which was observed in Examples 1 to 5 was attributable to an increase in a leakage current as it was in Example 5.

Herein, assuming that a high voltage having an amplitude in electric field strength of 2000 V/mm (0 to 970 V) is applied in the form of a triangular wave having a frequency of 1 Hz for the purpose of driving, a magnitude of polarization is detected from a hysteresis loop representing the relationship between the magnitude of polarization and voltage. An amount of charge injected during driving under a large electric field is calculated as a dynamic capacity according to the following equation A9:

$$\text{Dynamic capacity } C=Q/V \tag{A9}$$

wherein V denotes an applied voltage (=970 V) and Q denotes a maximum amount of charge [C].

When a voltage was repeatedly applied to the single sheets produced in Examples 1 and 4 over a temperature domain of 80° C. and higher temperatures, a phenomenon of a zero drift occurred relative to a magnitude of polarization due to a leakage current. For evaluation of a hysteresis loop, a voltage-versus-magnitude of polarization characteristic observed by applying a voltage repeatedly ten times was corrected so that when the voltage is zero, the magnitude of polarization would be zero. Moreover, a model having a linear resistor connected in parallel with the single sheet was used to plot a hysteresis loop with the leakage current nullified. A dynamic capacity calculated using the hysteresis loop is, unlike an apparent dynamic capacity, calculated by dividing an amount of electric charge, which includes charges stemming from a dielectric component, a polarization-inversion component, and a polarization-rotation component respectively other than the leakage current, by the applied voltage. The hysteresis loop was plotted repeatedly ten times, and a mean of maximum amounts of charge was adopted as a magnitude of polarization.

On the other hand, even when a voltage was repeatedly applied to the single sheet produced in Comparative example 1, a phenomenon of a zero drift did not occur relative to a magnitude of polarization. For evaluation of a hysteresis loop, a mean of maximum amounts of charge observed by applying the voltage repeatedly ten times in the same manner as that for the single sheets of Examples 1 and 4 was adopted as a magnitude of polarization.

Figure 31:
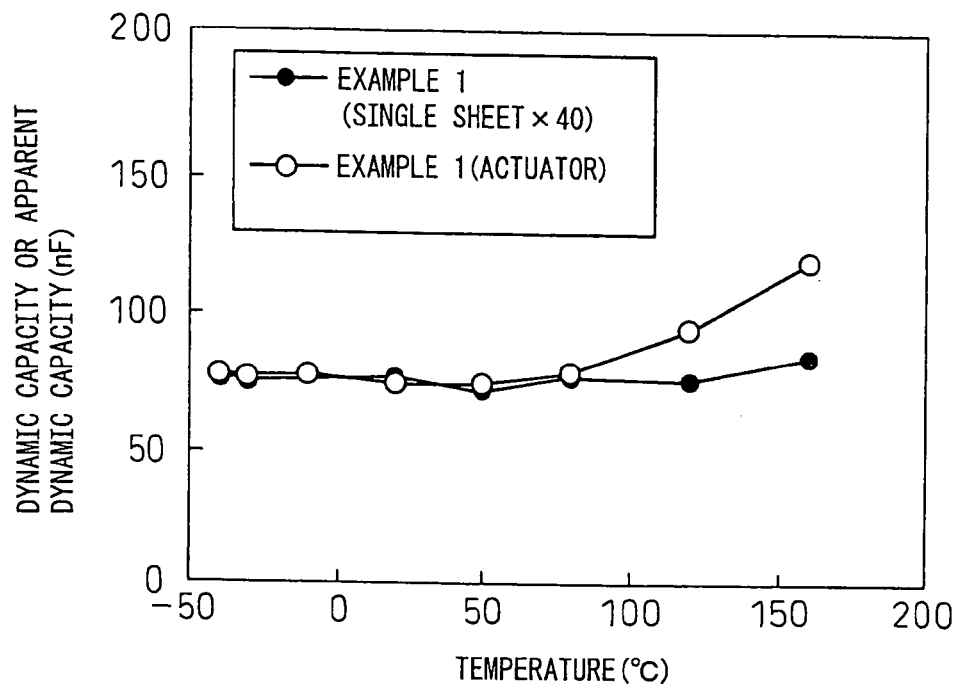
FIG. 31 is a graph showing the temperature dependencies of an apparent dynamic capacity and a dynamic capacity of the piezoelectric actuator (Example 1) which are attained according to Example 6.
Figure 32:
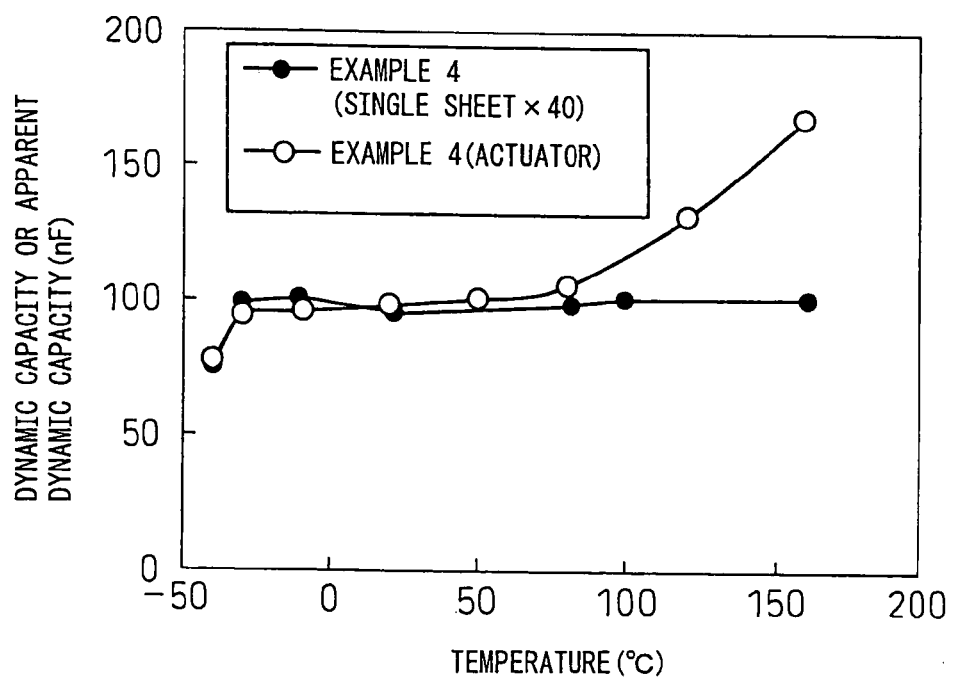
FIG. 32 is a graph showing the temperature dependencies of an apparent dynamic capacity and a dynamic capacity of the piezoelectric actuator (Example 4) which are attained according to Example 6.
Figure 33:
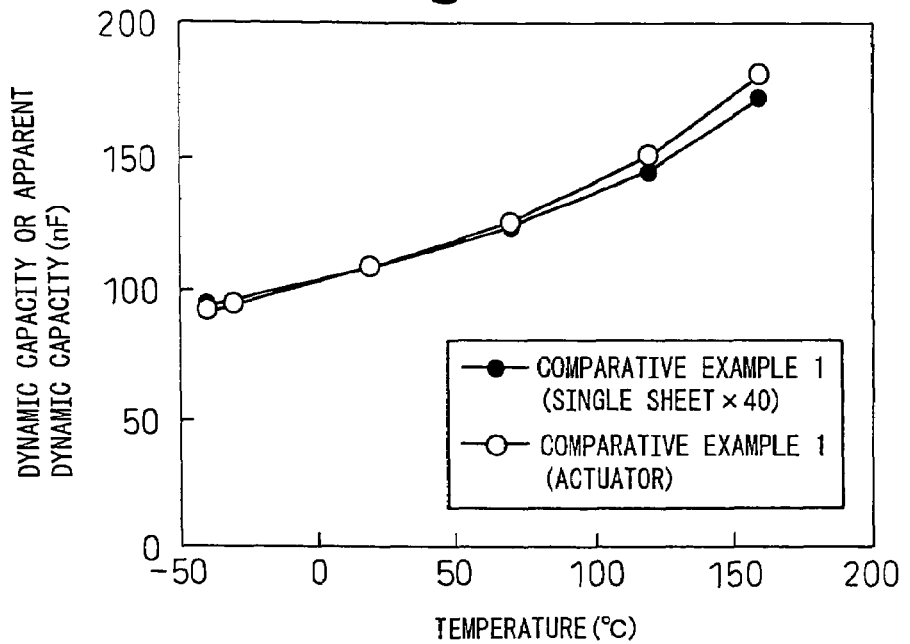
FIG. 33 is a graph showing the temperature dependencies of an apparent dynamic capacity and a dynamic capacity of the piezoelectric actuator (Comparative example 1) which are evaluated according to Example 6.

FIG. 31, FIG. 32, and FIG. 33 present the results of comparison of the product of the dynamic capacity of the single sheet, which is calculated as mentioned above, by 40, which is the number of sheets of piezoelectric ceramic included in the actuator, with the apparent dynamic capacities of the actuators produced in Example 1, Example 4, and Comparative example 1 respectively.

As seen from FIG. 31, FIG. 32, and FIG. 33, the apparent dynamic capacity of the actuator of Comparative example 1 is nearly consistent with the product of the dynamic capacity of the single sheet by 40. However, the apparent dynamic capacity of the actuator of Example 1 or 4 is largely inconsistent with the product of the dynamic capacity of the single sheet by 40. The apparent dynamic capacity of the actuator increases over a high temperature domain of 80° C. and higher temperatures. However, the product of the dynamic capacity of the single sheet by 40 remains nearly constant. As for the variation width in the product of the dynamic capacity of the single sheet by 40 over a temperature range from −30° C. to 160° C., the variation width observed in Example 1 is ±7.6%, while the variation width observed in Example 4 is ±2.2%.

Consequently, as far as piezoelectric actuator in accordance with the present invention is concerned, once a leakage current occurring at 80° C. or higher temperatures is reduced or a leakage current occurring at 80° C. or lower temperatures is increased, even when the piezoelectric actuator is driven under the high driving electric field strength of 2000 V/mm, the variation width in the apparent dynamic capacity can be decreased over a wide temperature range from −30° C. to 160° C. The feasible decrease is thought to be on a level with the temperature characteristic of the dynamic capacity of a single sheet.

EXAMPLE 7

Restricting the Lower Limit of a Magnitude of Dynamic Strain

As described in relation to Example 5, when the driving electric field strength is smaller than 1000 V/mm, the variation width in an apparent dynamic capacity gets smaller over a wide temperature range from −30° C. to 160° C. When the driving electric field strength is decreased, the magnitude of dynamic strain gets smaller. In the present example, the magnitude of dynamic strain to be attained with the decreased driving electric field strength for the actuator in accordance with the present invention is obtained.

Figure 34:
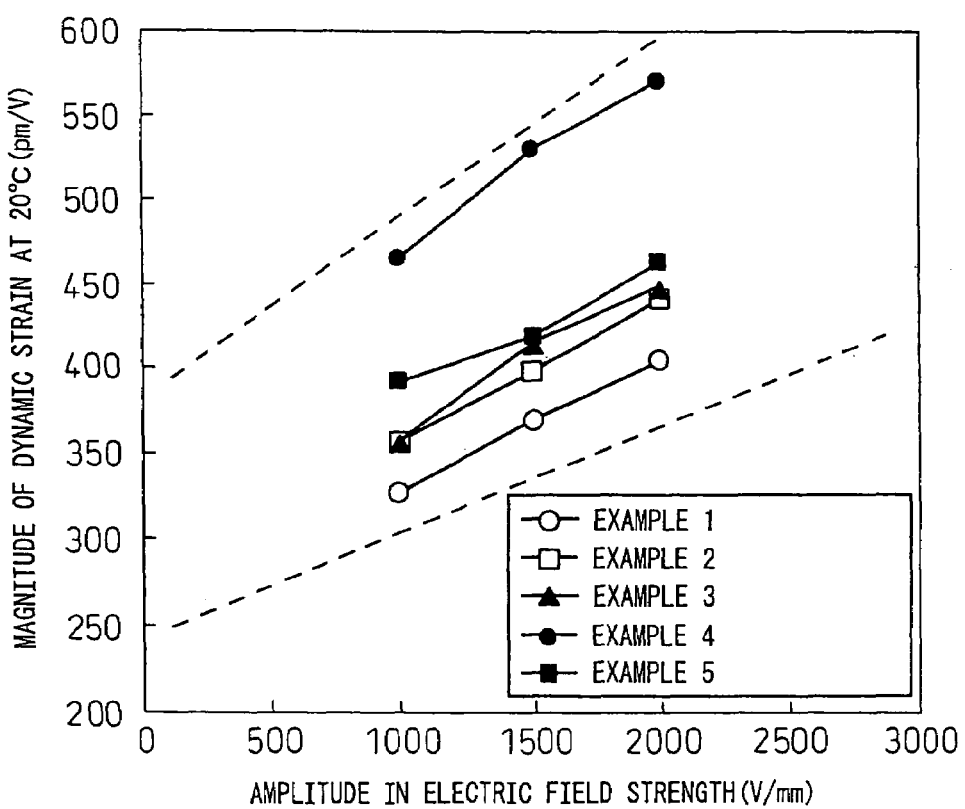
FIG. 34 is a graph showing the relationships between the amplitudes in electric field strength and a magnitude of dynamic strain observed at the temperature of 20° C., of the piezoelectric actuators obtained in Examples 1 to 5, which are established according to Example 7.

FIG. 34 presents the relationships of the driving electric field strengths, which are used for the actuators produced in Examples 1 to 5 respectively, to the magnitude of dynamic strain observed at 20° C. Under 100 V/mm that is the lower limit of the driving electric field strength required for the actuator, the magnitude of dynamic strain is 250 pm/V or more.

EXAMPLE 8

Restricting the Temperature Characteristic of the Magnitude of Dynamic Strain Under Low Electric Field Strength In the present example, the variation width in a displacement to be attained with a small magnitude of dynamic strain under the driving electric field strength lower than 1000 V/mm is obtained.

For this purpose, a voltage to be applied to a piezoelectric actuator should be lowered in order to perform measurement. When the electric field strength falls below 500 V/mm, a piezoelectric actuator produced in the present example makes a small displacement. This brings about a possibility that the precision in measurement may be degraded. In addition, it is hard to evaluate the temperature characteristic.

When the piezoelectric lateral strain constant $d_{31}$ of a single sheet is measured, although the absolute value of a displacement is hard to estimate, the temperature characteristic of the displacement can be estimated. Therefore, in the present example, the piezoelectric lateral strain constant $d_{31}$ of a single sheet was measured according to a resonance/anti-resonance method.

Figure 35:
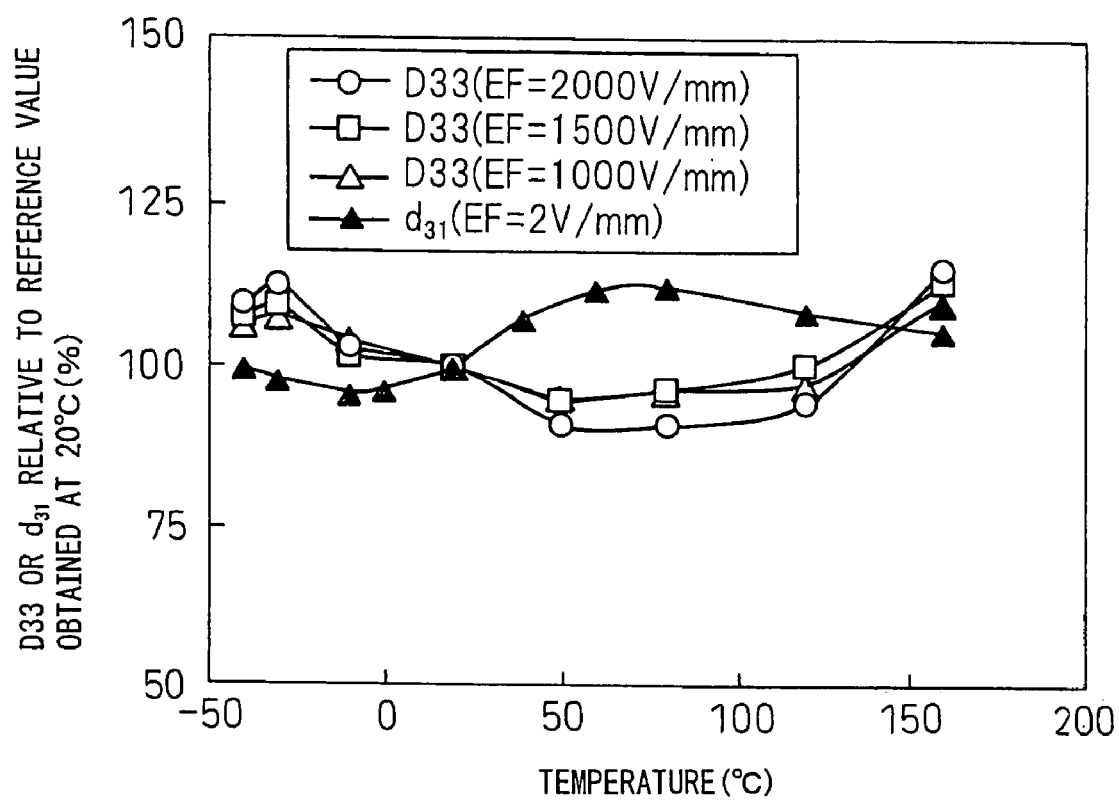
FIG. 35 is a graph showing the measured value of the temperature characteristic of a value $d_{31}$ exhibited by a single sheet produced according to Example 5, and the magnitudes of dynamic strains observed under the driving electric field strengths ranging from 1000 V/mm to 2000 V/mm according to the fifth embodiment, wherein the measured value and the magnitudes of dynamic strains are standardized with the values obtained at 20° C. and compared according to Example 8.

FIG. 35 shows the measured value of the temperature characteristic of the piezoelectric $d_{31}$ constant of the single sheet produced in Example 5, and the magnitudes of dynamic strains obtained in Example 5 under the driving electric field strengths ranging from 1000 V/mm to 2000 V/mm, which are standardized using the values obtained at 20° C., in comparison with one another. In Example 5, the variation width in the piezoelectric $d_{31}$ constant of the single sheet over a temperature range from −30° C. to 80° C. is ±7.8%. The variation width in the piezoelectric $d_{31}$ constant of the single sheet over a temperature range from −30° C. to 160° C. is ±7.8%. The values are close to or smaller than the widths of variations in the magnitudes of dynamic strains obtained under the driving electric field strengths ranging from 1000 V/mm to 2000 V/mm.

Consequently, as far as the actuator in accordance with the present invention is concerned, even when the driving electric field strength is decreased to be lower than 1000 V/mm, the variation width in a displacement can be decreased over a wide temperature range from −30° C. to 160° C.

TABLE 1

EXAMPLE 1

| Driving electric field strength: EF | Temperature [° C.] | Apparent dynamic capacity [nF] | Displacement [µm] | Quotient of displacement by apparent dynamic capacity [m/F] | Quotient of displacement by (apparent dynamic capacity)$^{0.5}$ [m/√F] | Magnitude of dynamic strain [pm/V] |
|---|---|---|---|---|---|---|
| EF = 2000 V/mm | 160 | 118.9 | 17.18 | 144.6 | 0.0498 | 443 |
| | 120 | 93.8 | 15.17 | 161.7 | 0.0495 | 391 |
| | 80 | 78.2 | 14.72 | 188.1 | 0.0526 | 379 |
| | 50 | 74.0 | 14.94 | 202.0 | 0.0549 | 385 |
| | 20 | 74.6 | 15.67 | 210.0 | 0.0574 | 404 |
| | −10 | 76.5 | 15.22 | 199.0 | 0.0550 | 392 |
| | −30 | 77.9 | 15.00 | 192.5 | 0.0537 | 387 |
| | −40 | 78.1 | 14.44 | 184.9 | 0.0517 | 372 |
| EF = 1500 V/mm | 160 | 119.9 | 11.36 | 94.8 | 0.0328 | 390 |
| | 120 | 92.7 | 10.35 | 111.7 | 0.0340 | 356 |
| | 80 | 76.4 | 9.96 | 130.5 | 0.0361 | 342 |
| | 50 | 72.2 | 10.19 | 141.2 | 0.0379 | 350 |
| | 20 | 71.7 | 10.75 | 149.8 | 0.0401 | 369 |
| | −10 | 74.1 | 10.41 | 140.6 | 0.0383 | 358 |
| | −30 | 75.7 | 10.02 | 132.3 | 0.0364 | 344 |
| | −40 | 75.7 | 9.40 | 124.2 | 0.0342 | 323 |
| EF = 1000 V/mm | 160 | 120.9 | 6.44 | 53.2 | 0.0185 | 332 |
| | 120 | 88.8 | 6.16 | 69.3 | 0.0207 | 317 |
| | 80 | 71.2 | 6.04 | 85.0 | 0.0227 | 312 |
| | 50 | 66.7 | 6.16 | 92.2 | 0.0238 | 317 |
| | 20 | 67.1 | 6.32 | 94.3 | 0.0244 | 326 |
| | −10 | 69.6 | 6.16 | 88.5 | 0.0233 | 317 |
| | −30 | 70.8 | 5.88 | 83.0 | 0.0221 | 303 |
| | −40 | 70.8 | 5.43 | 76.6 | 0.0204 | 280 |

TABLE 2

EXAMPLE 2

| Driving electric field strength: EF | Temperature [° C.] | Apparent dynamic capacity [nF] | Displacement [µm] | Quotient of displacement by apparent dynamic capacity [m/F] | Quotient of displacement by (apparent dynamic capacity)$^{0.5}$ [m/√F] | Magnitude of dynamic strain [pm/V] |
|---|---|---|---|---|---|---|
| EF = 2000 V/mm | 160 | 160.4 | 21.98 | 137.1 | 0.0549 | 566 |
| | 120 | 119.0 | 18.48 | 155.4 | 0.0536 | 476 |
| | 80 | 95.7 | 17.38 | 181.6 | 0.0562 | 448 |
| | 50 | 87.9 | 16.64 | 189.3 | 0.0561 | 429 |
| | 20 | 85.3 | 17.10 | 200.4 | 0.0585 | 441 |
| | −10 | 85.3 | 17.29 | 202.6 | 0.0592 | 446 |
| | −30 | 85.3 | 17.93 | 210.1 | 0.0614 | 462 |
| | −40 | 85.3 | 17.66 | 206.9 | 0.0604 | 455 |
| EF = 1500 V/mm | 160 | 158.1 | 14.53 | 91.9 | 0.0365 | 499 |
| | 120 | 113.4 | 12.60 | 111.1 | 0.0374 | 433 |
| | 80 | 92.8 | 11.68 | 125.9 | 0.0383 | 401 |
| | 50 | 82.5 | 11.31 | 137.1 | 0.0394 | 388 |
| | 20 | 82.5 | 11.59 | 140.5 | 0.0403 | 398 |
| | −10 | 82.5 | 12.14 | 147.2 | 0.0423 | 417 |
| | −30 | 85.9 | 12.14 | 141.3 | 0.0414 | 417 |
| | −40 | 85.9 | 12.14 | 141.3 | 0.0414 | 417 |

TABLE 2-continued

EXAMPLE 2

| Driving electric field strength: EF | Temperature [° C.] | Apparent dynamic capacity [nF] | Displacement [μm] | Quotient of displacement by apparent dynamic capacity [m/F] | Quotient of displacement by (apparent dynamic capacity)$^{0.5}$ [m/$\sqrt{F}$] | Magnitude of dynamic strain [pm/V] |
|---|---|---|---|---|---|---|
| EF = 1000 V/mm | 160 | 144.8 | 8.18 | 56.5 | 0.0215 | 422 |
|  | 120 | 98.3 | 7.36 | 74.9 | 0.0235 | 379 |
|  | 80 | 87.9 | 7.36 | 83.7 | 0.0248 | 379 |
|  | 50 | 82.8 | 7.08 | 85.6 | 0.0246 | 365 |
|  | 20 | 77.6 | 6.90 | 88.9 | 0.0248 | 355 |
|  | −10 | 82.8 | 7.45 | 90.0 | 0.0259 | 384 |
|  | −30 | 82.8 | 8.09 | 97.8 | 0.0281 | 417 |
|  | −40 | 82.8 | 8.00 | 96.7 | 0.0278 | 412 |

TABLE 3

EXAMPLE 3

| Driving electric field strength: EF | Temperature [° C.] | Apparent dynamic capacity [nF] | Displacement [μm] | Quotient of displacement by apparent dynamic capacity [m/F] | Quotient of displacement by (apparent dynamic capacity)$^{0.5}$ [m/$\sqrt{F}$] | Magnitude of dynamic strain [pm/V] |
|---|---|---|---|---|---|---|
| EF = 2000 V/mm | 160 | 138.7 | 20.15 | 145.3 | 0.0541 | 519 |
|  | 120 | 106.4 | 17.23 | 161.9 | 0.0528 | 444 |
|  | 80 | 81.6 | 16.44 | 201.4 | 0.0575 | 424 |
|  | 50 | 80.8 | 16.49 | 204.1 | 0.0580 | 425 |
|  | 20 | 80.2 | 17.38 | 216.7 | 0.0614 | 448 |
|  | −10 | 82.2 | 17.92 | 218.1 | 0.0625 | 462 |
|  | −30 | 82.4 | 17.92 | 217.4 | 0.0624 | 462 |
|  | −40 | 80.2 | 17.48 | 217.9 | 0.0617 | 450 |
| EF = 1500 V/mm | 160 | 147.5 | 14.11 | 95.7 | 0.0367 | 485 |
|  | 120 | 107.5 | 12.08 | 112.4 | 0.0368 | 415 |
|  | 80 | 86.8 | 11.19 | 128.9 | 0.0380 | 384 |
|  | 50 | 79.9 | 11.44 | 143.1 | 0.0405 | 393 |
|  | 20 | 78.8 | 12.08 | 153.3 | 0.0430 | 415 |
|  | −10 | 81.2 | 12.38 | 152.4 | 0.0434 | 425 |
|  | −30 | 82.3 | 12.53 | 152.1 | 0.0437 | 430 |
|  | −40 | 80.9 | 11.98 | 148.2 | 0.0421 | 411 |
| EF = 1000 V/mm | 160 | 152.4 | 8.42 | 55.2 | 0.0216 | 434 |
|  | 120 | 105.3 | 7.28 | 69.1 | 0.0224 | 375 |
|  | 80 | 82.2 | 6.73 | 82.0 | 0.0235 | 347 |
|  | 50 | 74.4 | 6.78 | 91.2 | 0.0249 | 350 |
|  | 20 | 74.1 | 6.93 | 93.6 | 0.0255 | 357 |
|  | −10 | 76.6 | 7.38 | 96.3 | 0.0267 | 380 |
|  | −30 | 77.7 | 7.48 | 96.2 | 0.0268 | 385 |
|  | −40 | 75.8 | 7.18 | 94.8 | 0.0261 | 370 |

TABLE 4

EXAMPLE 4

| Driving electric field strength: EF | Temperature [° C.] | Apparent dynamic capacity [nF] | Displacement [μm] | Quotient of displacement by apparent dynamic capacity [m/F] | Quotient of displacement by (apparent dynamic capacity)$^{0.5}$ [m/$\sqrt{F}$] | Magnitude of dynamic strain [pm/V] |
|---|---|---|---|---|---|---|
| EF = 2000 V/mm | 160 | 168.1 | 26.21 | 155.9 | 0.0639 | 675 |
|  | 120 | 131.9 | 23.26 | 176.4 | 0.0641 | 600 |
|  | 80 | 106.0 | 21.89 | 206.4 | 0.0672 | 564 |
|  | 50 | 100.9 | 21.70 | 215.2 | 0.0683 | 559 |
|  | 20 | 98.3 | 22.16 | 225.5 | 0.0707 | 571 |
|  | −10 | 95.4 | 22.80 | 239.0 | 0.0738 | 588 |
|  | −30 | 93.8 | 21.70 | 231.2 | 0.0708 | 559 |
|  | −40 | 77.7 | 19.40 | 249.8 | 0.0696 | 500 |

TABLE 4-continued

EXAMPLE 4

| Driving electric field strength: EF | Temperature [° C.] | Apparent dynamic capacity [nF] | Displacement [μm] | Quotient of displacement by apparent dynamic capacity [m/F] | Quotient of displacement by (apparent dynamic capacity)$^{0.5}$ [m/√F] | Magnitude of dynamic strain [pm/V] |
|---|---|---|---|---|---|---|
| EF = 1500 V/mm | 160 | 165.0 | 16.64 | 100.9 | 0.0410 | 572 |
| | 120 | 134.0 | 15.91 | 118.7 | 0.0435 | 546 |
| | 80 | 106.5 | 14.90 | 139.8 | 0.0456 | 512 |
| | 50 | 99.7 | 14.62 | 146.7 | 0.0463 | 502 |
| | 20 | 97.3 | 15.45 | 158.8 | 0.0495 | 531 |
| | −10 | 100.3 | 15.63 | 155.8 | 0.0493 | 537 |
| | −30 | 97.7 | 15.36 | 157.2 | 0.0491 | 527 |
| | −40 | 73.5 | 13.61 | 185.1 | 0.0502 | 467 |
| EF = 1000 V/mm | 160 | 160.4 | 8.37 | 52.2 | 0.0209 | 431 |
| | 120 | 124.1 | 8.92 | 71.8 | 0.0253 | 460 |
| | 80 | 98.3 | 8.55 | 87.0 | 0.0273 | 441 |
| | 50 | 93.1 | 8.28 | 88.9 | 0.0271 | 427 |
| | 20 | 90.0 | 9.01 | 100.1 | 0.0300 | 465 |
| | −10 | 95.2 | 9.56 | 100.5 | 0.0310 | 493 |
| | −30 | 91.8 | 9.38 | 102.2 | 0.0310 | 483 |
| | −40 | 68.3 | 8.46 | 123.9 | 0.0324 | 436 |

TABLE 5

EXAMPLE 5

| Driving electric field strength: EF | Temperature [° C.] | Apparent dynamic capacity [nF] | Displacement [μm] | Quotient of displacement by apparent dynamic capacity [m/F] | Quotient of displacement by (apparent dynamic capacity)$^{0.5}$ [m/√F] | Magnitude of dynamic strain [pm/V] |
|---|---|---|---|---|---|---|
| EF = 2000 V/mm | 160 | 129.8 | 19.77 | 152.3 | 0.0549 | 510 |
| | 120 | 97.7 | 17.47 | 178.9 | 0.0559 | 450 |
| | 80 | 85.6 | 17.24 | 201.3 | 0.0589 | 444 |
| | 50 | 81.9 | 17.01 | 207.8 | 0.0594 | 438 |
| | 20 | 83.2 | 17.93 | 215.5 | 0.0622 | 462 |
| | −10 | 87.6 | 18.62 | 212.5 | 0.0629 | 480 |
| | −30 | 88.6 | 19.31 | 218.1 | 0.0649 | 498 |
| | −40 | 85.3 | 19.08 | 223.8 | 0.0653 | 492 |
| EF = 1500 V/mm | 160 | 129.6 | 13.79 | 106.5 | 0.0383 | 474 |
| | 120 | 98.1 | 12.18 | 124.2 | 0.0389 | 418 |
| | 80 | 85.4 | 11.72 | 137.3 | 0.0401 | 403 |
| | 50 | 80.0 | 11.49 | 143.7 | 0.0406 | 395 |
| | 20 | 81.1 | 12.18 | 150.2 | 0.0428 | 418 |
| | −10 | 85.9 | 12.41 | 144.5 | 0.0423 | 426 |
| | −30 | 87.0 | 13.33 | 153.3 | 0.0452 | 458 |
| | −40 | 83.6 | 13.10 | 156.8 | 0.0453 | 450 |
| EF = 1000 V/mm | 160 | 131.6 | 8.74 | 66.4 | 0.0241 | 450 |
| | 120 | 96.2 | 7.13 | 74.1 | 0.0230 | 367 |
| | 80 | 83.5 | 6.90 | 82.6 | 0.0239 | 355 |
| | 50 | 75.8 | 6.90 | 91.0 | 0.0251 | 355 |
| | 20 | 76.9 | 7.59 | 98.6 | 0.0274 | 391 |
| | −10 | 82.6 | 7.82 | 94.6 | 0.0272 | 403 |
| | −30 | 83.2 | 8.51 | 102.3 | 0.0295 | 438 |
| | −40 | 79.4 | 8.28 | 104.2 | 0.0294 | 427 |
| EF = 2 V/mm (Electrostatic capacity) | 160 | 56.8 | | | | |
| | 120 | 53.8 | | | | |
| | 80 | 54.2 | | | | |
| | 50 | 56.0 | | | | |
| | 20 | 57.8 | | | | |
| | −10 | 59.6 | | | | |
| | −30 | 56.3 | | | | |
| | −40 | 50.4 | | | | |

TABLE 6

COMPARATIVE EXAMPLE 1

| Driving electric field strength: EF | Temperature [° C.] | Apparent dynamic capacity [nF] | Displacement [μm] | Quotient of displacement by apparent dynamic capacity [m/F] | Quotient of displacement by (apparent dynamic capacity)$^{0.5}$ [m/$\sqrt{F}$] | Magnitude of dynamic strain [pm/V] |
|---|---|---|---|---|---|---|
| EF = 2000 V/mm | 160 | 180.8 | 26.80 | 148.2 | 0.0630 | 691 |
| | 120 | 150.9 | 25.60 | 169.6 | 0.0659 | 660 |
| | 70 | 125.7 | 24.00 | 190.9 | 0.0677 | 619 |
| | 20 | 108.9 | 22.70 | 208.4 | 0.0688 | 585 |
| | −30 | 94.8 | 21.45 | 226.3 | 0.0697 | 553 |
| | −40 | 92.0 | 21.20 | 230.5 | 0.0699 | 546 |
| EF = 1500 V/mm | 160 | 189.5 | 20.00 | 105.6 | 0.0459 | 687 |
| | 120 | 154.9 | 18.80 | 121.3 | 0.0478 | 646 |
| | 70 | 126.3 | 17.50 | 138.6 | 0.0492 | 601 |
| | 20 | 108.1 | 16.60 | 153.5 | 0.0505 | 570 |
| | −30 | 94.4 | 16.10 | 170.5 | 0.0524 | 553 |
| | −40 | 91.7 | 16.00 | 174.6 | 0.0528 | 549 |

TABLE 7

COMPARATIVE EXAMPLE 2

| Driving electric field strength: EF | Temperature [° C.] | Apparent dynamic capacity [nF] | Displacement [μm] | Quotient of displacement by apparent dynamic capacity [m/F] | Quotient of displacement by (apparent dynamic capacity)$^{0.5}$ [m/$\sqrt{F}$] | Magnitude of dynamic strain [pm/V] |
|---|---|---|---|---|---|---|
| EF = 2000 V/mm | 160 | 290.0 | 37.50 | 129.3 | 0.0696 | 966 |
| | 120 | 228.1 | 34.00 | 149.1 | 0.0712 | 876 |
| | 70 | 148.4 | 29.30 | 197.5 | 0.0761 | 755 |
| | 20 | 97.7 | 22.30 | 228.3 | 0.0714 | 575 |
| | −30 | 72.8 | 18.72 | 257.2 | 0.0694 | 482 |
| | −40 | 67.8 | 18.00 | 265.5 | 0.0691 | 464 |
| EF = 1500 V/mm | 160 | 351.3 | 33.00 | 93.9 | 0.0557 | 1133 |
| | 120 | 273.3 | 29.20 | 106.8 | 0.0559 | 1003 |
| | 70 | 174.0 | 23.80 | 136.8 | 0.0571 | 817 |
| | 20 | 109.7 | 18.00 | 164.1 | 0.0543 | 618 |
| | −30 | 78.4 | 14.67 | 187.0 | 0.0524 | 504 |
| | −40 | 72.2 | 14.00 | 194.0 | 0.0521 | 481 |

TABLE 8

COMPARATIVE EXAMPLE 3

| Driving electric field strength: EF | Temperature [° C.] | Apparent dynamic capacity [nF] | Displacement [μm] | Quotient of displacement by apparent dynamic capacity [m/F] | Quotient of displacement by (apparent dynamic capacity)$^{0.5}$ [m/$\sqrt{F}$] | Magnitude of dynamic strain [pm/V] |
|---|---|---|---|---|---|---|
| EF = 2000 V/mm | 160 | 218.4 | 35.50 | 162.6 | 0.0760 | 915 |
| | 120 | 191.3 | 34.00 | 177.7 | 0.0777 | 876 |
| | 70 | 163.4 | 32.50 | 198.9 | 0.0804 | 838 |
| | 20 | 139.2 | 30.40 | 218.3 | 0.0815 | 784 |
| | −30 | 114.6 | 26.40 | 230.4 | 0.0780 | 680 |
| | −40 | 109.6 | 25.60 | 233.5 | 0.0773 | 660 |
| EF = 1500 V/mm | 160 | 225.8 | 26.00 | 115.1 | 0.0547 | 893 |
| | 120 | 194.5 | 24.20 | 124.4 | 0.0549 | 831 |
| | 70 | 165.9 | 22.60 | 136.2 | 0.0555 | 776 |
| | 20 | 140.1 | 21.30 | 152.0 | 0.0569 | 731 |
| | −30 | 115.5 | 19.30 | 167.1 | 0.0568 | 663 |
| | −40 | 110.5 | 18.90 | 171.0 | 0.0568 | 649 |

TABLE 9

COMPARATIVE EXAMPLE 4

| Driving electric field strength: EF | Temperature [° C.] | Apparent dynamic capacity [nF] | Displacement [μm] | Quotient of displacement by apparent dynamic capacity [m/F] | Quotient of displacement by (apparent dynamic capacity)$^{0.5}$ [m/$\sqrt{F}$] | Magnitude of dynamic strain [pm/V] |
|---|---|---|---|---|---|---|
| EF = 2000 V/mm | 160 | 157.4 | 21.80 | 138.5 | 0.0549 | 562 |
|  | 120 | 127.5 | 19.80 | 155.3 | 0.0555 | 510 |
|  | 70 | 102.7 | 18.30 | 178.3 | 0.0571 | 472 |
|  | 20 | 85.7 | 17.30 | 201.8 | 0.0591 | 446 |
|  | −30 | 76.1 | 16.22 | 213.0 | 0.0588 | 418 |
|  | −40 | 74.2 | 16.00 | 215.5 | 0.0587 | 412 |
| EF = 1500 V/mm | 160 | 161.2 | 16.20 | 100.5 | 0.0403 | 556 |
|  | 120 | 128.0 | 14.40 | 112.5 | 0.0403 | 495 |
|  | 70 | 102.6 | 13.00 | 126.7 | 0.0406 | 446 |
|  | 20 | 84.1 | 12.50 | 148.7 | 0.0431 | 429 |
|  | −30 | 74.7 | 11.92 | 159.6 | 0.0436 | 409 |
|  | −40 | 72.8 | 11.80 | 162.2 | 0.0437 | 405 |

TABLE 10

COMPARATIVE EXAMPLE 5

| Driving electric field strength: EF | Temperature [° C.] | Apparent dynamic capacity [nF] | Displacement [μm] | Quotient of displacement by apparent dynamic capacity [m/F] | Quotient of displacement by (apparent dynamic capacity)$^{0.5}$ [m/$\sqrt{F}$] | Magnitude of dynamic strain [pm/V] |
|---|---|---|---|---|---|---|
| EF = 2000 V/mm | 160 | 99.6 | 15.00 | 150.6 | 0.0475 | 387 |
|  | 120 | 83.0 | 13.90 | 167.4 | 0.0482 | 358 |
|  | 70 | 66.4 | 12.80 | 192.9 | 0.0497 | 330 |
|  | 20 | 58.4 | 12.00 | 205.5 | 0.0497 | 309 |
|  | −30 | 52.5 | 12.17 | 231.7 | 0.0531 | 314 |
|  | −40 | 51.3 | 12.20 | 237.7 | 0.0539 | 314 |
| EF = 1500 V/mm | 160 | 98.6 | 10.60 | 107.5 | 0.0338 | 364 |
|  | 120 | 81.7 | 10.00 | 122.4 | 0.0350 | 343 |
|  | 70 | 67.1 | 9.00 | 134.1 | 0.0347 | 309 |
|  | 20 | 56.8 | 8.60 | 151.5 | 0.0361 | 295 |
|  | −30 | 50.4 | 8.93 | 177.4 | 0.0398 | 307 |
|  | −40 | 49.1 | 9.00 | 183.4 | 0.0406 | 309 |

TABLE 11

|  | Driving electric field strength (V/mm) | Temperature range (° C.) | Apparent dynamic capacity | | | |
|---|---|---|---|---|---|---|
|  |  |  | Maximum value (nF) | Minimum value (nF) | Mean value (nF) | Variation width (%) |
| Example 1 | 2000 | −30 to 80 | 78.2 | 74.0 | 76.1 | 2.8 |
|  |  | −30 to 160 | 118.9 | 74.0 | 96.4 | 23.3 |
|  | 1500 | −30 to 80 | 76.4 | 71.7 | 74.1 | 3.1 |
|  |  | −30 to 160 | 119.9 | 71.7 | 95.8 | 25.1 |
|  | 1000 | −30 to 80 | 71.2 | 66.7 | 69.0 | 3.2 |
|  |  | −30 to 160 | 120.9 | 66.7 | 93.8 | 28.9 |
| Example 2 | 2000 | −30 to 80 | 95.7 | 85.3 | 90.5 | 5.7 |
|  |  | −30 to 160 | 160.4 | 85.3 | 122.8 | 30.5 |
|  | 1500 | −30 to 80 | 92.8 | 82.5 | 87.6 | 5.9 |
|  |  | −30 to 160 | 158.1 | 82.5 | 120.3 | 31.4 |
|  | 1000 | −30 to 80 | 87.9 | 77.6 | 82.8 | 6.3 |
|  |  | −30 to 160 | 144.8 | 77.6 | 111.2 | 30.2 |
| Example 3 | 2000 | −30 to 80 | 82.4 | 80.2 | 81.3 | 1.4 |
|  |  | −30 to 160 | 138.7 | 80.2 | 109.5 | 26.7 |
|  + 1500 | −30 to 80 | 86.8 | 78.8 | 82.8 | 4.8 |
|  |  | −30 to 160 | 147.5 | 78.8 | 113.2 | 30.3 |
|  | 1000 | −30 to 80 | 82.2 | 74.1 | 78.1 | 5.2 |
|  |  | −30 to 160 | 152.4 | 74.1 | 113.2 | 34.6 |
| Example 4 | 2000 | −30 to 80 | 106.0 | 93.8 | 99.9 | 6.1 |
|  |  | −30 to 160 | 168.1 | 93.8 | 131.0 | 28.4 |
|  | 1500 | −30 to 80 | 106.5 | 97.3 | 101.9 | 4.6 |
|  |  | −30 to 160 | 165.0 | 97.3 | 131.1 | 25.8 |
|  | 1000 | −30 to 80 | 98.3 | 90.0 | 94.1 | 4.4 |
|  |  | −30 to 160 | 160.4 | 90.0 | 125.2 | 28.1 |
| Example 5 | 2000 | −30 to 80 | 88.6 | 81.9 | 85.2 | 3.9 |
|  |  | −30 to 160 | 129.8 | 81.9 | 105.8 | 22.6 |
|  | 1500 | −30 to 80 | 87.0 | 80.0 | 83.5 | 4.2 |
|  |  | −30 to 160 | 129.6 | 80.0 | 104.8 | 23.7 |
|  | 1000 | −30 to 80 | 83.5 | 75.8 | 79.7 | 4.9 |
|  |  | −30 to 160 | 131.6 | 75.8 | 103.7 | 26.9 |
|  | 2 | −30 to 80 | 59.6 | 54.2 | 56.9 | 4.8 |
|  |  | −30 to 160 | 59.6 | 53.8 | 56.7 | 5.2 |

TABLE 12

| | Driving electric field strength (V/mm) | Temperature range (° C.) | Displacement Maximum value (μm) | Displacement Minimum value (μm) | Displacement Mean value (μm) | Variation width (%) |
|---|---|---|---|---|---|---|
| Example 1 | 2000 | −30 to 80 | 15.67 | 14.72 | 15.20 | 3.1 |
| | | −30 to 160 | 17.18 | 14.72 | 15.95 | 7.7 |
| | 1500 | −30 to 80 | 10.75 | 9.96 | 10.35 | 3.8 |
| | | −30 to 160 | 11.36 | 9.96 | 10.66 | 6.6 |
| | 1000 | −30 to 80 | 6.32 | 5.88 | 6.10 | 3.7 |
| | | −30 to 160 | 6.44 | 5.88 | 6.16 | 4.5 |
| Example 2 | 2000 | −30 to 80 | 17.93 | 16.64 | 17.29 | 3.7 |
| | | −30 to 160 | 21.98 | 16.64 | 19.31 | 13.8 |
| | 1500 | −30 to 80 | 12.14 | 11.31 | 11.72 | 3.5 |
| | | −30 to 160 | 14.53 | 11.31 | 12.92 | 12.5 |
| | 1000 | −30 to 80 | 8.09 | 6.90 | 7.49 | 8.0 |
| | | −30 to 160 | 8.18 | 6.90 | 7.54 | 8.5 |
| Example 3 | 2000 | −30 to 80 | 17.92 | 16.44 | 17.18 | 4.3 |
| | | −30 to 160 | 20.15 | 16.44 | 18.30 | 10.1 |
| | 1500 | −30 to 80 | 12.53 | 11.19 | 11.86 | 5.6 |
| | | −30 to 160 | 14.11 | 11.19 | 12.65 | 11.5 |
| | 1000 | −30 to 80 | 7.48 | 6.73 | 7.11 | 5.2 |
| | | −30 to 160 | 8.42 | 6.73 | 7.58 | 11.1 |
| Example 4 | 2000 | −30 to 80 | 22.80 | 21.70 | 22.25 | 2.5 |
| | | −30 to 160 | 26.21 | 21.70 | 23.95 | 9.4 |
| | 1500 | −30 to 80 | 15.63 | 14.62 | 15.13 | 3.3 |
| | | −30 to 160 | 16.64 | 14.62 | 15.63 | 6.5 |
| | 1000 | −30 to 80 | 9.56 | 8.28 | 8.92 | 7.2 |
| | | −30 to 160 | 9.56 | 8.28 | 8.92 | 7.2 |
| Example 5 | 2000 | −30 to 80 | 19.31 | 17.01 | 18.16 | 6.3 |
| | | −30 to 160 | 19.77 | 17.01 | 18.39 | 7.5 |
| | 1500 | −30 to 80 | 13.33 | 11.49 | 12.41 | 7.4 |
| | | −30 to 160 | 13.79 | 11.49 | 12.64 | 9.1 |
| | 1000 | −30 to 80 | 8.51 | 6.90 | 7.70 | 10.4 |
| | | −30 to 160 | 8.74 | 6.90 | 7.82 | 11.8 |

TABLE 13

| | Driving electric field strength (V/mm) | Temperature range (° C.) | Quotient of displacement by apparent dynamic capacity Maximum value (m/F) | Minimum value (m/F) | Mean value (m/F) | Variation width (%) |
|---|---|---|---|---|---|---|
| Example 1 | 2000 | −30 to 80 | 210.0 | 188.1 | 199.1 | 5.5 |
| | | −30 to 160 | 210.0 | 144.6 | 177.3 | 18.5 |
| | 1500 | −30 to 80 | 149.8 | 130.5 | 140.1 | 6.9 |
| | | −30 to 160 | 149.8 | 94.8 | 122.3 | 22.5 |
| | 1000 | −30 to 80 | 94.3 | 83.0 | 88.6 | 6.4 |
| | | −30 to 160 | 94.3 | 53.2 | 73.8 | 27.8 |
| Example 2 | 2000 | −30 to 80 | 210.1 | 181.6 | 195.9 | 7.3 |
| | | −30 to 160 | 210.1 | 137.1 | 173.6 | 21.0 |
| | 1500 | −30 to 80 | 147.2 | 125.9 | 136.5 | 7.8 |
| | | −30 to 160 | 147.2 | 91.9 | 119.5 | 23.1 |
| | 1000 | −30 to 80 | 97.8 | 83.7 | 90.7 | 7.8 |
| | | −30 to 160 | 97.8 | 56.5 | 77.1 | 26.8 |
| Example 3 | 2000 | −30 to 80 | 218.1 | 201.4 | 209.8 | 4.0 |
| | | −30 to 160 | 218.1 | 145.3 | 181.7 | 20.0 |
| | 1500 | −30 to 80 | 153.3 | 128.9 | 141.1 | 8.6 |
| | | −30 to 160 | 153.3 | 95.7 | 124.5 | 23.1 |
| | 1000 | −30 to 80 | 96.3 | 82.0 | 89.1 | 8.1 |
| | | −30 to 160 | 96.3 | 55.2 | 75.8 | 27.1 |
| Example 4 | 2000 | −30 to 80 | 239.0 | 206.4 | 222.7 | 7.3 |
| | | −30 to 160 | 239.0 | 155.9 | 197.4 | 21.0 |
| | 1500 | −30 to 80 | 158.8 | 139.8 | 149.3 | 6.4 |
| | | −30 to 160 | 158.8 | 100.9 | 129.9 | 22.3 |
| | 1000 | −30 to 80 | 102.2 | 87.0 | 94.6 | 8.0 |
| | | −30 to 160 | 102.2 | 52.2 | 77.2 | 32.4 |
| Example 5 | 2000 | −30 to 80 | 218.1 | 201.3 | 209.7 | 4.0 |
| | | −30 to 160 | 218.1 | 152.3 | 185.2 | 17.7 |

TABLE 13-continued

| | Driving electric field strength (V/mm) | Temperature range (° C.) | Quotient of displacement by apparent dynamic capacity Maximum value (m/F) | Minimum value (m/F) | Mean value (m/F) | Variation width (%) |
|---|---|---|---|---|---|---|
| | 1500 | −30 to 80 | 153.3 | 137.3 | 145.3 | 5.5 |
| | | −30 to 160 | 153.3 | 106.5 | 129.9 | 18.0 |
| | 1000 | −30 to 80 | 102.3 | 82.6 | 92.4 | 10.7 |
| | | −30 to 160 | 102.3 | 66.4 | 84.3 | 21.3 |

TABLE 14

| | Driving electric field strength (V/mm) | Temperature range (° C.) | Quotient of displacement by (apparent dynamic capacity)$^{0.5}$ Maximum value (m/√F) | Minimum value (m/√F) | Mean value (m/√F) | Variation width (%) |
|---|---|---|---|---|---|---|
| Example 1 | 2000 | −30 to 80 | 0.0574 | 0.0526 | 0.0550 | 4.3 |
| | | −30 to 160 | 0.0574 | 0.0495 | 0.0534 | 7.3 |
| | 1500 | −30 to 80 | 0.0401 | 0.0361 | 0.0381 | 5.3 |
| | | −30 to 160 | 0.0401 | 0.0328 | 0.0365 | 10.0 |
| | 1000 | −30 to 80 | 0.0244 | 0.0221 | 0.0233 | 5.0 |
| | | −30 to 160 | 0.0244 | 0.0185 | 0.0215 | 13.8 |
| Example 2 | 2000 | −30 to 80 | 0.0614 | 0.0561 | 0.0588 | 4.5 |
| | | −30 to 160 | 0.0614 | 0.0536 | 0.0575 | 6.8 |
| | 1500 | −30 to 80 | 0.0423 | 0.0383 | 0.0403 | 4.9 |
| | | −30 to 160 | 0.0423 | 0.0365 | 0.0394 | 7.3 |
| | 1000 | −30 to 80 | 0.0281 | 0.0246 | 0.0264 | 6.7 |
| | | −30 to 160 | 0.0281 | 0.0215 | 0.0248 | 13.3 |
| Example 3 | 2000 | −30 to 80 | 0.0625 | 0.0575 | 0.0600 | 4.2 |
| | | −30 to 160 | 0.0625 | 0.0528 | 0.0577 | 8.4 |
| | 1500 | −30 to 80 | 0.0437 | 0.0380 | 0.0408 | 6.9 |
| | | −30 to 160 | 0.0437 | 0.0367 | 0.0402 | 8.6 |
| | 1000 | −30 to 80 | 0.0268 | 0.0235 | 0.0252 | 6.6 |
| | | −30 to 160 | 0.0268 | 0.0216 | 0.0242 | 10.9 |
| Example 4 | 2000 | −30 to 80 | 0.0738 | 0.0672 | 0.0705 | 4.7 |
| | | −30 to 160 | 0.0738 | 0.0639 | 0.0689 | 7.2 |
| | 1500 | −30 to 80 | 0.0495 | 0.0456 | 0.0476 | 4.1 |
| | | −30 to 160 | 0.0495 | 0.0410 | 0.0453 | 9.5 |
| | 1000 | −30 to 80 | 0.0310 | 0.0271 | 0.0291 | 6.7 |
| | | −30 to 160 | 0.0310 | 0.0209 | 0.0259 | 19.5 |
| Example 5 | 2000 | −30 to 80 | 0.0649 | 0.0589 | 0.0619 | 4.8 |
| | | −30 to 160 | 0.0649 | 0.0549 | 0.0599 | 8.4 |
| | 1500 | −30 to 80 | 0.0452 | 0.0401 | 0.0427 | 6.0 |
| | | −30 to 160 | 0.0452 | 0.0383 | 0.0418 | 8.3 |
| | 1000 | −30 to 80 | 0.0295 | 0.0239 | 0.0267 | 10.6 |
| | | −30 to 160 | 0.0295 | 0.0230 | 0.0262 | 12.4 |

TABLE 15

| | Driving electric field strength (V/mm) | Temperature range (° C.) | Apparent dynamic capacity Maximum value (nF) | Minimum value (nF) | Mean value (nF) | Variation width (%) |
|---|---|---|---|---|---|---|
| Comparative Example 1 | 2000 | −30 to 70 | 125.7 | 94.8 | 110.3 | 14.0 |
| | | −30 to 160 | 180.8 | 94.8 | 137.8 | 31.2 |
| | 1500 | −30 to 70 | 126.7 | 94.4 | 110.4 | 14.5 |
| | | −30 to 160 | 189.5 | 94.4 | 141.9 | 33.5 |
| Comparative Example 2 | 2000 | −30 to 70 | 148.4 | 72.8 | 110.6 | 34.2 |
| | | −30 to 160 | 290.0 | 72.8 | 181.4 | 59.9 |
| | 1500 | −30 to 70 | 174.0 | 78.4 | 126.2 | 37.9 |
| | | −30 to 160 | 351.3 | 78.4 | 214.9 | 63.5 |

TABLE 15-continued

| | Driving electric field strength (V/mm) | Temperature range (° C.) | Apparent dynamic capacity | | | |
|---|---|---|---|---|---|---|
| | | | Maximum value (nF) | Minimum value (nF) | Mean value (nF) | Variation width (%) |
| Comparative Example 3 | 2000 | −30 to 70 | 163.4 | 114.6 | 139.0 | 17.6 |
| | | −30 to 160 | 218.4 | 114.6 | 166.5 | 31.2 |
| | 1500 | −30 to 70 | 165.9 | 115.5 | 140.7 | 17.9 |
| | | −30 to 160 | 225.8 | 115.5 | 170.6 | 32.3 |
| Comparative Example 4 | 2000 | −30 to 70 | 102.7 | 76.1 | 89.4 | 14.8 |
| | | −30 to 160 | 157.4 | 76.1 | 116.8 | 34.8 |
| | 1500 | −30 to 70 | 102.6 | 74.7 | 88.6 | 15.8 |
| | | −30 to 160 | 161.2 | 74.7 | 117.9 | 36.7 |
| Comparative Example 5 | 2000 | −30 to 70 | 66.4 | 52.5 | 59.4 | 11.7 |
| | | −30 to 160 | 99.6 | 52.5 | 76.0 | 31.0 |
| | 1500 | −30 to 70 | 67.1 | 50.4 | 58.7 | 14.3 |
| | | −30 to 160 | 98.6 | 50.4 | 74.5 | 32.4 |

TABLE 16

| | Driving electric field strength (V/mm) | Temperature range (° C.) | Displacement | | | |
|---|---|---|---|---|---|---|
| | | | Maximum value (μm) | Minimum value (μm) | Mean value (μm) | Variation width (%) |
| Comparative Example 1 | 2000 | −30 to 70 | 24.00 | 21.45 | 22.73 | 5.6 |
| | | −30 to 160 | 26.80 | 21.45 | 24.13 | 11.1 |
| | 1500 | −30 to 70 | 17.50 | 16.10 | 16.80 | 4.2 |
| | | −30 to 160 | 20.00 | 16.10 | 18.05 | 10.8 |
| Comparative Example 2 | 2000 | −30 to 70 | 29.30 | 18.72 | 24.01 | 22.0 |
| | | −30 to 160 | 37.50 | 18.72 | 28.11 | 33.4 |
| | 1500 | −30 to 70 | 23.80 | 14.67 | 19.23 | 23.7 |
| | | −30 to 160 | 33.00 | 14.67 | 23.83 | 38.5 |
| Comparative Example 3 | 2000 | −30 to 70 | 32.50 | 26.40 | 29.45 | 10.4 |
| | | −30 to 160 | 35.50 | 26.40 | 30.95 | 14.7 |
| | 1500 | −30 to 70 | 22.60 | 19.30 | 20.95 | 7.9 |
| | | −30 to 160 | 26.00 | 19.30 | 22.65 | 14.8 |
| Comparative Example 4 | 2000 | −30 to 70 | 18.30 | 16.22 | 17.26 | 6.0 |
| | | −30 to 160 | 21.80 | 16.22 | 19.01 | 14.7 |
| | 1500 | −30 to 70 | 13.00 | 11.92 | 12.46 | 4.3 |
| | | −30 to 160 | 16.20 | 11.92 | 14.06 | 15.2 |
| Comparative Example 5 | 2000 | −30 to 70 | 12.80 | 12.00 | 12.40 | 3.2 |
| | | −30 to 160 | 15.00 | 12.00 | 13.50 | 11.1 |
| | 1500 | −30 to 70 | 9.00 | 8.60 | 8.80 | 2.3 |
| | | −30 to 160 | 10.60 | 8.60 | 9.60 | 10.4 |

TABLE 17

| | Driving electric field strength (V/mm) | Temperature range (° C.) | Quotient of displacement by apparent dynamic capacity | | | |
|---|---|---|---|---|---|---|
| | | | Maximum value (m/F) | Minimum value (m/F) | Mean value (m/F) | Variation width (%) |
| Comparative Example 1 | 2000 | −30 to 70 | 226.3 | 190.9 | 208.6 | 8.5 |
| | | −30 to 160 | 226.3 | 148.2 | 187.3 | 20.8 |
| | 1500 | −30 to 70 | 117.1 | 138.6 | 154.8 | 10.5 |
| | | −30 to 160 | 117.1 | 105.5 | 138.3 | 23.7 |
| Comparative Example 2 | 2000 | −30 to 70 | 257.2 | 197.5 | 227.3 | 13.1 |
| | | −30 to 160 | 257.2 | 129.3 | 193.2 | 33.1 |
| | 1500 | −30 to 70 | 187.0 | 136.8 | 161.9 | 15.5 |
| | | −30 to 160 | 187.0 | 93.9 | 140.5 | 33.1 |
| Comparative Example 3 | 2000 | −30 to 70 | 230.4 | 198.9 | 214.7 | 7.4 |
| | | −30 to 160 | 230.4 | 162.6 | 196.5 | 17.3 |
| | 1500 | −30 to 70 | 167.1 | 136.2 | 151.7 | 10.2 |
| | | −30 to 160 | 167.1 | 115.1 | 141.1 | 18.4 |
| Comparative Example 4 | 2000 | −30 to 70 | 213.0 | 178.3 | 195.6 | 8.9 |
| | | −30 to 160 | 213.0 | 138.5 | 175.7 | 21.2 |
| | 1500 | −30 to 70 | 159.6 | 126.7 | 143.2 | 11.5 |
| | | −30 to 160 | 159.6 | 100.5 | 130.1 | 22.7 |
| Comparative Example 5 | 2000 | −30 to 70 | 231.7 | 192.9 | 212.3 | 9.1 |
| | | −30 to 160 | 231.7 | 150.6 | 191.2 | 21.2 |
| | 1500 | −30 to 70 | 177.4 | 134.1 | 155.7 | 13.9 |
| | | −30 to 160 | 177.4 | 107.5 | 142.4 | 24.5 |

TABLE 18

| | Driving electric field strength (V/mm) | Temperature range (° C.) | Quotient of displacement by (apparent dynamic capacity)$^{0.5}$ | | | |
|---|---|---|---|---|---|---|
| | | | Maximum value (m/√F) | Minimum value (m/√F) | Mean value (m/√F) | Variation width (%) |
| Comparative Example 1 | 2000 | −30 to 70 | 0.0697 | 0.0677 | 0.0687 | 1.4 |
| | | −30 to 160 | 0.0697 | 0.0630 | 0.0663 | 5.0 |
| | 1500 | −30 to 70 | 0.0524 | 0.0492 | 0.0508 | 3.1 |
| | | −30 to 160 | 0.0524 | 0.0459 | 0.0492 | 6.6 |
| Comparative Example 2 | 2000 | −30 to 70 | 0.0761 | 0.0694 | 0.0727 | 4.6 |
| | | −30 to 160 | 0.0761 | 0.0694 | 0.0727 | 4.6 |
| | 1500 | −30 to 70 | 0.0571 | 0.0524 | 0.0547 | 4.3 |
| | | −30 to 160 | 0.0571 | 0.0524 | 0.0547 | 4.3 |
| Comparative Example 3 | 2000 | −30 to 70 | 0.0815 | 0.0780 | 0.0797 | 2.2 |
| | | −30 to 160 | 0.0815 | 0.0760 | 0.0787 | 3.5 |
| | 1500 | −30 to 70 | 0.0569 | 0.0555 | 0.0562 | 1.3 |
| | | −30 to 160 | 0.0569 | 0.0547 | 0.0558 | 2.0 |
| Comparative Example 4 | 2000 | −30 to 70 | 0.0591 | 0.0571 | 0.0581 | 1.7 |
| | | −30 to 160 | 0.0591 | 0.0549 | 0.0570 | 3.6 |
| | 1500 | −30 to 70 | 0.0436 | 0.0406 | 0.0421 | 3.6 |
| | | −30 to 160 | 0.0436 | 0.0403 | 0.0419 | 4.0 |
| Comparative Example 5 | 2000 | −30 to 70 | 0.0531 | 0.0497 | 0.0514 | 3.3 |
| | | −30 to 160 | 0.0531 | 0.0475 | 0.0503 | 5.5 |
| | 1500 | −30 to 70 | 0.0398 | 0.0347 | 0.0373 | 6.8 |
| | | −30 to 160 | 0.0398 | 0.0338 | 0.0368 | 8.2 |

The invention claimed is:

1. A piezoelectric actuator which comprises as a drive source a piezoelectric element in which a pair of electrodes have been formed on a surface of a piezoelectric ceramic member wherein when a voltage is applied to the piezoelectric actuator to drive the piezoelectric actuator under such a condition that the driving voltage have a constant amplitude at an electric field strength of 100 V/mm or more, the piezoelectric actuator satisfies at least one of the following requirements (a) to (c):

(a) the variation width $W_c$ [%] in an apparent dynamic capacity C [F] due to a change in temperature, which is represented by the following equation (1), should fall within ±11% over a specific temperature range from −30° C. to 80° C. (wherein C [F] denotes the apparent dynamic capacity of the piezoelectric actuator which is calculated by dividing an amount of charge Q [C], which is accumulated in a capacitor, by the voltage V [V] applied to the piezoelectric actuator, when the piezoelectric actuator and the capacitor are connected in series with each other and a voltage is applied to each of the piezoelectric actuator and the capacitor):

$$W_c(\%) = [\{2 \times C_{max}/(C_{max}+C_{min})\} - 1] \times 100 \quad (1)$$

wherein $C_{max}$ denotes the maximum value of the apparent dynamic capacity observed at the temperatures ranging from −30° C. to 80° C., and $C_{min}$ denotes the minimum value of the apparent dynamic capacity observed at the temperatures ranging from −30° C. to 80° C.;

(b) the variation width $W_L$ [%] in a displacement L [μm] due to a change in temperature, which is represented by the following equation (2), should fall within ±14% over the specific temperature range from −30° C. to 80° C. (wherein L[μm] denotes the displacement of the piezoelectric actuator):

$$W_L(\%)=[\{2\times L_{max}/(L_{max}+L_{min})\}-1]\times 100 \quad (2)$$

wherein $L_{max}$ denotes the maximum value of the displacement observed at the temperatures ranging from −30° C. to 80° C., and $L_{min}$ denotes the minimum value of the displacement observed at the temperatures ranging from −30° C. to 80° C.; and (c) the variation width $W_{L/C}$[%] in a quotient L/C due to a change in temperature, which is represented by the following equation (3), should fall within ±12% over the specific temperature range from −30° C. to 80° C. (wherein C [F] denotes the apparent dynamic capacity of the piezoelectric actuator, L [μm] denotes the displacement of the piezoelectric actuator, and C [F] is calculated by dividing an amount of charge Q [C], which is accumulated in a capacitor, by the voltage V [V] applied to the piezoelectric actuator, when the piezoelectric actuator and the capacitor are connected in series with each other and a voltage is applied to each of the piezoelectric actuator and the capacitor):

$$W_{L/C}(\%)=[\{2\times (L/C)_{max}/((L/C)_{max}+(L/C)_{min})\}-1]\times 100 \quad (3)$$

wherein $(L/C)_{max}$ denotes the maximum value of the quotient L/C observed at the temperatures ranging from −30° C. to 80° C., and $(L/C)_{min}$ denotes the minimum value of the quotient L/C observed at the temperatures ranging from −30° C. to 80° C.; and wherein the piezoelectric ceramic member is formed with a polycrystalline body whose main phase is an isotropic perovskite compound represented by a general formula $\{Li_2(K_{1-y}Na_y)_{1-x}\}\{Nb_{1-z-w}Ta_zSb_w\}O_3$ (wherein 0≦x≦0.2, 0≦y≦1, 0≦z≦0.4, 0≦w≦0.2 and x+z+w>0 are established), and is a crystal-oriented piezoelectric ceramic wherein specific crystal faces of each crystal grain constituting the polycrystalline body are oriented.

2. The piezoelectric actuator according to claim 1, wherein both the requirements (a) and (b) are satisfied.

3. The piezoelectric actuator according to claim 1 wherein all of the requirements (a) to (c) are satisfied.

4. The piezoelectric actuator according to claim 1 wherein the following requirement (d) is further satisfied:

(d) the variation width $W_{L/C}{}^{0.5}$ in a quotient $L/C^{0.5}$ due to a change in temperature, which is represented by the following equation (4), should fall within ±12% over the specific temperature range from −30° C. to 80° C. (wherein $L/C^{0.5}$ denotes the ratio of the displacement L[μm] of the piezoelectric actuator to the square root of the apparent dynamic capacity C [F]):

$$W_{L/C}{}^{0.5}(\%)=[\{2\times (L/C^{0.5})_{max}/((L/C^{0.5})_{max}+(L/C^{0.5})_{min})\}-1]\times 100 \quad (4)$$

wherein $(L/C^{0.5})_{max}$ denotes the maximum value of the quotient $L/C^{0.5}$ observed at the temperatures ranging from −30° C. to 80° C., and $(L/C^{0.5})_{min}$ denotes the minimum value of the quotient $L/C^{0.5}$ observed at the temperatures ranging from −30° C. to 80° C.

5. The piezoelectric actuator according to claim 1 wherein the following requirement (e) is further satisfied:

(e) the magnitude of dynamic strain calculated by dividing a strain in an electric-field applied direction of the piezoelectric actuator by the electric field strength should be equal to or larger than 250 pm/V over the specific temperature range from −30° C. to 80° C.

6. The piezoelectric actuator according to claim 1 wherein the following requirement (f) is further satisfied:

(f) the variation width $W_c$ [%] should fall within ±35% over a specific temperature range from −30° C. to 160° C.

7. The piezoelectric actuator according to claim 1 wherein the following requirement (g) is further satisfied:

(g) the variation width $W_L$ [%] should fall within ±14% over the specific temperature range from −30° C. to 160° C.

8. The piezoelectric actuator according to claim 1 wherein the following requirement (h) is further satisfied:

(h) the variation width $W_{L/C}$ [%] should fall within ±35% over the specific temperature range from −30° C. to 160° C.

9. The piezoelectric actuator according to claim 1 wherein the following requirement (i) is further satisfied:

(i) the variation width $W_{L/C}{}^{0.5}$ [%] should fall within ±20% over the specific temperature range from −30° C. to 160° C.

10. A piezoelectric actuator which comprises as a drive source a piezoelectric element in which a pair of electrodes have been formed on a surface of a piezoelectric ceramic member wherein when a voltage is applied to the piezoelectric actuator to drive the piezoelectric actuator under such a condition that the driving voltage have a constant amplitude at an electric field strength of 100 V/mm or more, the piezoelectric actuator satisfies at least one of the following requirements (j) to (l):

(j) the variation width $W_c$ [%] in an apparent dynamic capacity C [F] due to a change in temperature, which is represented by the following equation (5), should fall within ±30% over a specific temperature range from −30° C. to 160° C. (wherein C [F] denotes the apparent dynamic capacity of the piezoelectric actuator, and is calculated by dividing an amount of charge Q [C], which is accumulated in a capacitor, by the voltage V [V] applied to the piezoelectric actuator, when the piezoelectric actuator and the capacitor are connected in series with each other and a voltage is applied to each of the piezoelectric actuator and the capacitor):

$$W_c(\%)=[\{2\times C_{max}/(C_{max}+C_{min})\}-1]\times 100 \quad (5)$$

wherein $C_{max}$ denotes the maximum value of the apparent dynamic capacity observed at the temperatures ranging from −30° C. to 160° C., and $C_{min}$ denotes the minimum value of the apparent dynamic capacity observed at the temperatures ranging from −30° C. to 160° C.

(k) the variation width $W_L$ [%] in a displacement L [μm] due to a change in temperature, which is represented by the following equation (6), should fall within ±14% over the specific temperature range from −30° C. to 160° C. (wherein L [μm] the displacement of the piezoelectric actuator):

$$W_L(\%)=[\{2\times L_{max}/(L_{max}+L_{min})\}-1]\times 100 \quad (6)$$

wherein $L_{max}$ denotes the maximum value of the displacement observed at the temperatures ranging from −30° C. to 160° C., and $L_{min}$ denotes the minimum value of the displacement observed at the temperatures ranging from −30° C. to 160° C.; and (l) the variation width $W_{L/C}$ [%] in a quotient L/C due to a change in temperature, which is represented by the following equation (7), should fall within ±35% over the specific temperature range from −30° C. to 160° C. (wherein C [F] denotes the apparent dynamic capacity of the piezoelectric actuator, L [μm] denotes the displacement of the piezoelectric actuator, and C [F] is calculated by dividing an amount of charge Q [C], which is accumulated in a capacitor, by the voltage V [V] applied to the piezoelectric actuator, when the piezoelectric actuator and the capacitor are connected in series with each other and a voltage is applied to each of the piezoelectric actuator and the capacitor):

$$W_{L/C}(\%)=[\{2\times(L/C)_{max}/((L/C)_{max}+(L/C)_{min})\}-1]\times 100 \quad (7)$$

wherein $L/C_{max}$ denotes the maximum value of the quotient L/C observed at the temperatures ranging from −30° C. to 160° C., and $L/C_{min}$ denotes the minimum value of the quotient L/C observed at the temperatures ranging from −30° C. to 160° C.; and wherein the piezoelectric ceramic member is formed with a polycrystalline body whose main phase is an isotropic perovskite compound represented by a general formula $\{Li_x(K_{1-y}Na_y)_{1-x}\}\{Nb_{1-z-w}Ta_zSb_w\}O_3$ (wherein $0\leq x\leq 0.2, 0\leq y\leq 1, 0\leq z\leq 0.4, 0\leq w\leq 0.2$ and $x+z+w>0$ are established), and is a crystal-oriented piezoelectric ceramic wherein specific crystal faces of each crystal grain constituting the polycrystalline body are oriented.

11. The piezoelectric actuator according to claim 10, wherein both the requirements (j) and (k) are satisfied.

12. The piezoelectric actuator according to claim 10, wherein all of the requirements (j) to (l) are satisfied.

13. The piezoelectric actuator according to claim 10, wherein the following requirement (m) is further satisfied:

(m) the variation width $W_{L/C}{}^{0.5}$ [%] in a quotient $L/C^{0.5}$ due to a change in temperature, which is represented by the following equation (8), should fall within ±20% over the specific temperature range from −30° C. to 160° C. (wherein $L/C^{0.5}$ denotes the ratio of the displacement L [μm] of the piezoelectric actuator to the square root of the apparent dynamic capacity C [F]):

$$W_{L/C}{}^{0.5}(\%)=[\{2\times(L/C^{0.5})_{max}/((L/C^{0.5})_{max}+(L/C^{0.5})_{min})\}-1]\times 100 \quad (8)$$

wherein $(L/C^{0.5})_{max}$ denotes the maximum value of the quotient $L/C^{0.5}$ observed at the temperatures ranging from −30° C. to 160° C., and $(L/C^{0.5})_{min}$ denotes the minimum value of the quotient $L/C^{0.5}$ observed at temperatures ranging from −30° C. to 160° C.

14. The piezoelectric actuator according to claim 10, wherein the following requirement (n) is further satisfied:

(n) the magnitude of dynamic strain calculated by dividing a strain in an electric-field applied direction of the piezoelectric actuator by the electric field strength should be equal to or larger than 250 pm/V over the specific temperature range from −30° C. to 160° C.

15. The piezoelectric actuator according to claim 10, wherein by comprising a positive temperature coefficient (PTC) resistor that exhibits a positive resistance temperature coefficient, wherein the PTC resistor and the piezoelectric ceramic member exhibiting a negative resistance temperature coefficient are electrically connected in parallel with each other, and are disposed to have a positional relationship making the temperatures of the PTC resistor and the piezoelectric ceramic member substantially equal to each other.

16. The piezoelectric actuator according to claim 15, wherein the PTC resistor is a barium titanate-system semiconductor, and exhibits a positive resistance temperature coefficient over a temperature domain of 80° C. and higher temperatures.

17. The piezoelectric actuator according to claim 1 wherein the piezoelectric actuator comprises as the piezoelectric element a laminated piezoelectric element having a plurality of piezoelectric ceramic members stacked, and is adapted to a fuel injection valve.

18. The piezoelectric actuator according to claim 1 wherein the piezoelectric ceramic member is formed with an alkali metal-containing piezoelectric ceramic that contains at least one of lithium (Li), potassium (K), and sodium (Na).

19. The piezoelectric actuator according to claim 1 wherein the piezoelectric ceramic member does not contain lead.

20. The piezoelectric actuator according to claim 1, wherein in the crystal-oriented piezoelectric ceramic, x, y, and z included in the general formula $\{Li_x(K_{1-y}Na_y)_{1-x}\}\{Nb_{1-z-w}Ta_zSb_w\}O_3$ satisfy the relationships represented by the following equations (9) and (10):

$$9x-5z-17w\geq -318 \quad (9)$$

$$-18.9x-3.9z-5.8w\geq -130 \quad (10)$$

21. The piezoelectric actuator according to claim 20 wherein the orientation degree of the pseudo-cubic {100} planes of the crystal-oriented piezoelectric ceramic calculated according to the Lotgering's method is 30% or more, and the crystal system is the tetragonal system over a temperature range from 10° C. to 160° C.

22. The piezoelectric actuator according to claim 1 wherein the orientation degree of the pseudo-cubic {100} planes of the crystal-oriented piezoelectric ceramic calculated according to the Lotgering's method is 30% or more, and the crystal system is the tetragonal system over a temperature range from 10° C. to 160° C.

* * * * *